United States Patent
Schulze

(10) Patent No.: US 6,671,570 B2
(45) Date of Patent: Dec. 30, 2003

(54) SYSTEM AND METHOD FOR AUTOMATED MONITORING AND ASSESSMENT OF FABRICATION FACILITY

(75) Inventor: Bradley D. Schulze, Phoenix, AZ (US)

(73) Assignee: Brooks Automation, Inc., Chelmsford, MA (US)

(*) Notice: Subject to any disclaimer, the term of this patent is extended or adjusted under 35 U.S.C. 154(b) by 32 days.

(21) Appl. No.: 09/978,500

(22) Filed: Oct. 16, 2001

(65) Prior Publication Data

US 2002/0116083 A1 Aug. 22, 2002

Related U.S. Application Data

(60) Provisional application No. 60/241,343, filed on Oct. 17, 2000.

(51) Int. Cl.[7] .............................................. G06F 19/100
(52) U.S. Cl. ........................ 700/121; 700/99; 700/123
(58) Field of Search ................................. 700/108, 117, 700/121, 96; 702/188

(56) References Cited

U.S. PATENT DOCUMENTS

| | | | | |
|---|---|---|---|---|
| 4,736,304 A | * | 4/1988 | Doehler | ...................... 700/123 |
| 5,014,208 A | * | 5/1991 | Wolfson | ...................... 700/99 |
| 5,591,299 A | * | 1/1997 | Seaton et al. | ............... 700/121 |

* cited by examiner

Primary Examiner—Leo Picard
Assistant Examiner—W. Russell Swindell
(74) Attorney, Agent, or Firm—Perman & Green, LLP; Richard Pickreign

(57) ABSTRACT

A method for monitoring and assessing operation of a semiconductor fabrication facility comprises the steps of connecting a monitoring and assessment system to a system bus which is connected directly or indirectly to a manufacturing execution system and a plurality of semiconductor fabrication tools. Through a user interface, the state models can be configured for the semiconductor fabrication tools where each state model is based upon a set of defined triggers for each tool. During monitoring various messages are transmitted on the system bus between the semiconductor fabrication tools and the manufacturing execution system and the monitoring and assessment system, and appropriate triggers are generated based upon the messages where the triggers are selected from a set of defined triggers. During operation, the state models are updated for each tool affected by one of the triggers and transitions within the state models are recorded in a tracking database.

34 Claims, 49 Drawing Sheets

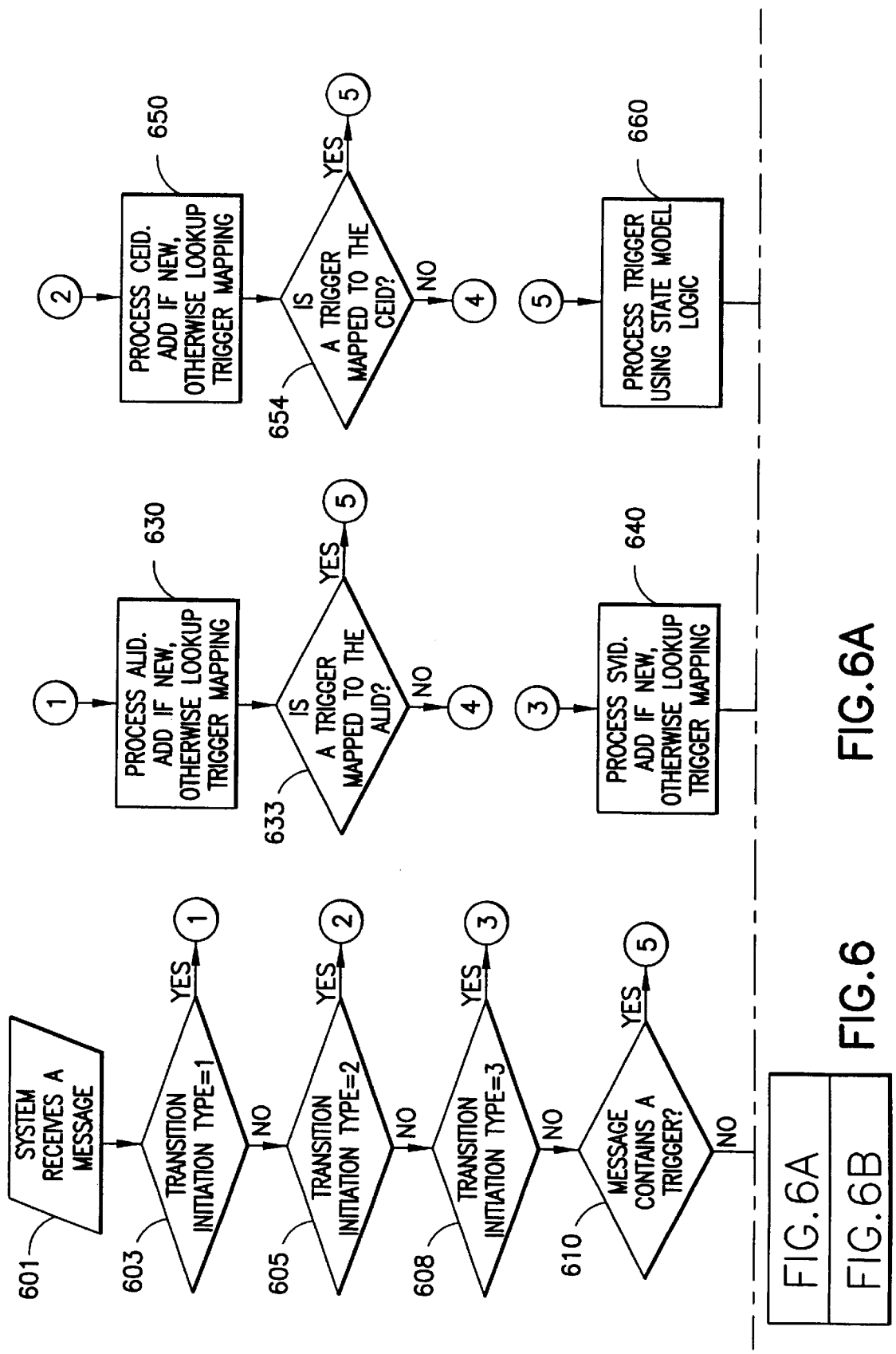

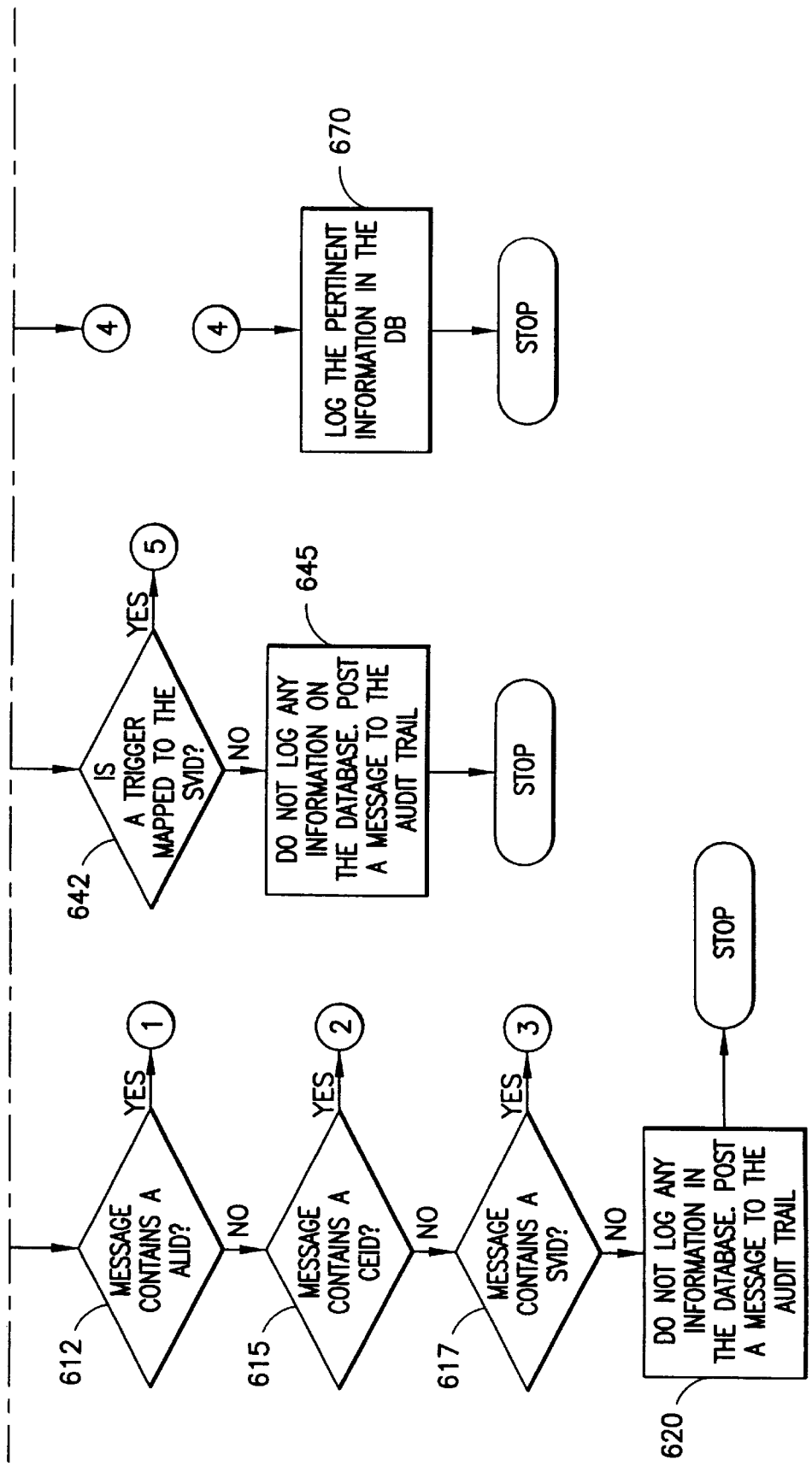

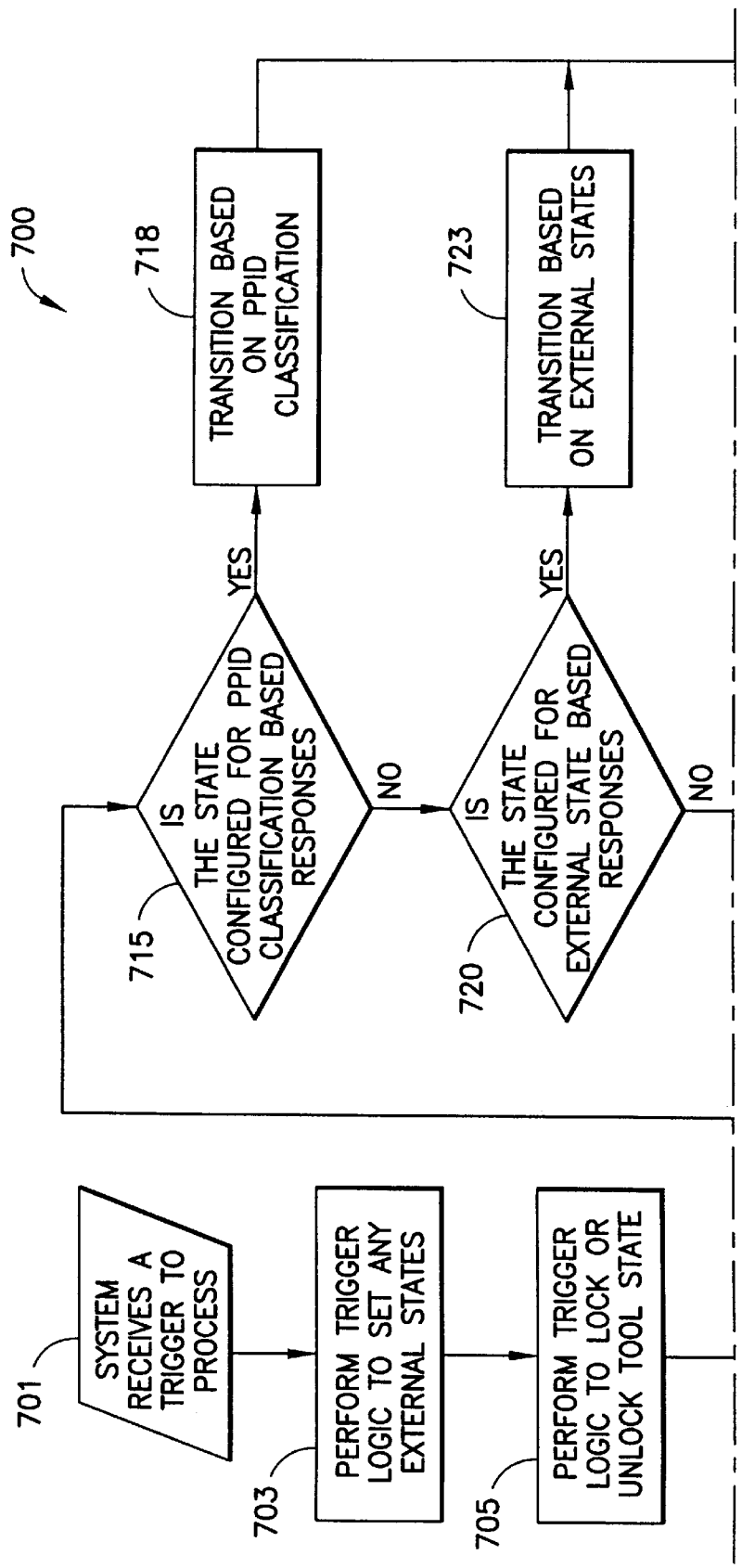

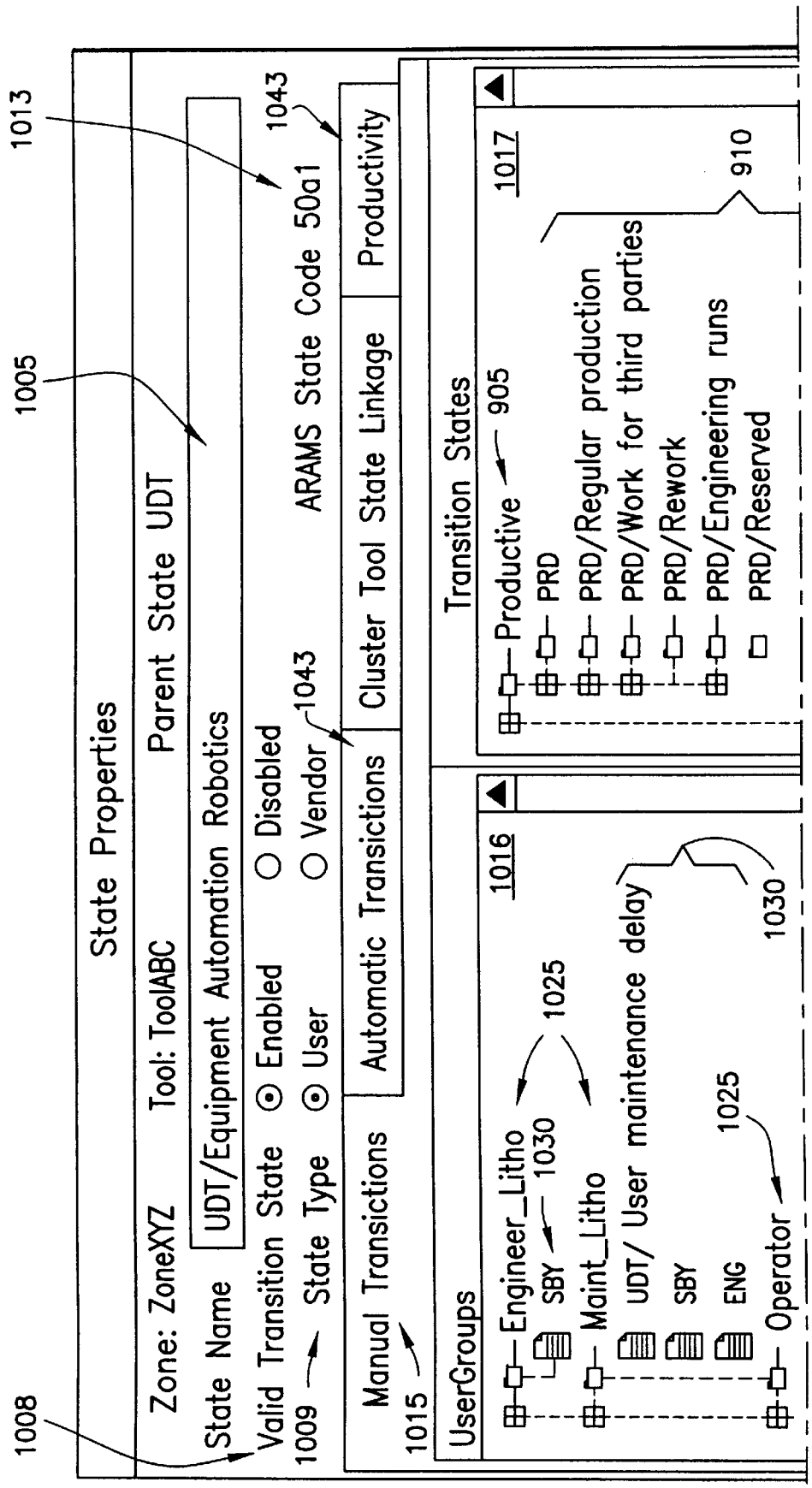

| FIG.10C-1 |
| FIG.10C-2 |

FIG.10D

State Properties

Zone: ZoneXYZ    Tool  ToolABCMain    Parent State  Unscheduled Down

State Name [PRD/Regular Production]

Valid Transition State  ⊙ Enabled   ○ Disabled

State Type  ⊙ User  ○ Vendor     ARAMS State Code 1200

| Manual Transactions | Automatic Transactions | Cluster Tool State Linkage | Productivity |

☒ Enable Productivity Metrics for this state

Theoretical Production Time per Unit [THT]:  [0.183]  — 1081
Engineering Theoretical Production Time per Unit [ETHT]:  [0.15]  — 1082
Value Added In-Process Production Time per Unit [VHT]:  [0.05]  — 1083
Reference Theoretical Production Time per Unit [RTHT]:  [0.183]  — 1084

Values are in [Hours] per unit
                1087      1086
                    [Hours]
                    [Minutes]
                    [Seconds]

[OK]    [Cancel]

☐ Copy Through sub-states

SECS to Symptom/Trigger Mapping

File | Option | Help

Zone: ZoneABC —1503    Tool ToolXYZ —1504

| | SECS Alarm Mapping —1507  1508 | SECS EVENT Mapping | SVID Mapping —1509 |

| ALID | Alarm Text | Sympton Mapping |
|---|---|---|
| 1 | Aligner Failed | ToolSSS, Trigger 8: Robotics Problem |
| 2 | Left Loadlock Turbo Pump Failed | None |
| 3 | Right Loadlock Turbo Pump Failed | None |
| 4 | Left Loadlock Failed | None |
| 5 | Right Loadlock Failed | None |
| 6 | PMA Turbo Pump Failed | ToolABC, Trigger7: Loadlock Pressure Problem |
| 7 | PMB Turbo Pump Failed | ToolXYZ, Trigger7: Loadlock Pressure Problem |
| 8 | PMC Turbo Pump Failed | ToolXYZ, Trigger7: Loadlock Pressure Problem |
| 9 | PMD Turbo Pump Failed | ToolXYZ, Trigger7: Loadlock Pressure Problem |
| 10 | Robot Failed | ToolXYZ, Trigger8: Robotics Problem |
| 11 | Transport Module | ToolXYZ, Trigger7: Loadlock Pressure Problem |
| 13 | ESTOP Activated | ToolXYZ, Trigger9: User Abort |
| 22 | Manual Abort Pre | ToolXYZ, Trigger9: User Abort |
| 42 | Manual Halt Initia | None |
| 51 | Leak Check Failed | ToolXYZ, Trigger4: Chamber Pressure Problem |
| 62 | Gas Channel01: F | ToolXYZ, Trigger5: Gas Problem |
| 63 | Gas Channel02: F | ToolXYZ, Trigger5: Gas Problem |
| 64 | Gas Channel03: F | ToolPDQ, Trigger5: Gas Problem |
| 65 | Gas Channel04: F | ToolXYZ, Trigger5: Gas Problem |

1510

1512 — popup menu:
- Unmap ALID
- Map To Symptom
- Auto Map ALID
- Data Mapping
- New ALID
- Edit ALID
- Delete ALID

1501

Trigger Data Mapping Utility

Zone: ZoneABC  Tool: ToolXYZ  Trigger: Process Start

| Trigger Field Name | Override Data Source |
|---|---|
| Lot id 17 | |
| Lot id 18 | |
| Lot id 18 | |
| Lot id 19 | |
| Lot id 20 | |
| Lot id 21 | |
| Lot id 22 | |
| Lot id 23 | |
| Lot id 24 | |
| Lot id 25 | |
| Wafer id | |
| Batch ID | |
| Actual Units | |
| PPID | |
| PPID Classification | 1 |

FIG. 16a

| FIG. 16a |
|---|
| FIG. 16b |

FIG. 16

| FIG.17a | FIG.17b | FIG.17c |

FIG.18

| FIG.18a | FIG.18b |
|---------|---------|

FIG.18a

Change States Based on External Conditions

| | Default Transaction S... | Default Priority |
|---|---|---|
| | PRD/Regular Production | 1 |
| PPID Class: Production | PRD/Regular Production | 2 |
| PPID Class: Engineering | ENG/Engineering Tests | 3 |
| PPID Class: Supplier Maint. | UDT/Equipment Problem | 4 |
| PPID Class: Factory Maint. | SDT/Equipment Qual | 5 |
| Step Change | None | 6 |
| Process End | SBY | 7 |
| Clean1_Unavailable Clean2_Unavailable Clean3_Unavailable Clean4_Unavailable | SBY/No Support Tool-Wet Bench | |
| No Operator | SBY/No Operator | |
| No Product | SBY/No Product | |
| SMC Fail | UDT/SMC Issue | |
| Gas Pressure Abort | UDT/Out of Spec Gas | |
| Abort Recovery | None | |
| Mechanical Abort | UDT/Robotics Issue | |
| Powerfail | UDT/Powerfail | |

Symptom Properties

Symptom #1 | SMC Fault

| Default State Selection | Miscellaneous | External State Control |

Priority External State | Action

| 1 No Product | None |
| 2 No Operator | None |
| 3 No Support Tool | None |
| 4 SMC Fail (APC/FDC) | Activate State |
| 5 SPC Fail | None |
| 6 Out of Consumables | None |
| 7 Process Model Failure | None |

Activate State
Deactivate State
No Action

Delete State
New External State

Move Up in Priority
Move Down in Priority

None
None
None
None
None
None
Fail/Chargeable
None
Fail/Chargeable
Fail/Non-Charge

File  Edit  Options

Tool/Chamber Specific Constants

Zone: Zone1        Tool: Toolxyz

Tool Setup | Custom Fields | Parameter Lists | PPID Classification | Productivity | Transitions Cycle Count Label   [ Wafers ]   (Wafers, Batches, Lots etc)

Batch Label         [ Lots ]     (Wafers, Batches, Lots etc)

Unit Label          [ Wafers ]   (Wafers, Batches, Lots etc)

Default State       [ 1000 SBY ▶ ]

Tool/Chamber Specific Constants

File  Edit  Options

Zone: Zone1        Tool: Toolxyz

| Tool Setup | Custom Fields | Parameter Lists | PPID Classification | Productivity | Transitions |

Custom Text Field Names

- Text Field 01: Device Id
- Text Field 02: Layer
- Text Field 03:
- Text Field 04:
- Text Field 05:
- Text Field 06:
- Text Field 07:
- Text Field 08:
- Text Field 09:
- Text Field 10:

Custom Numeric Field Names

- Numeric Field 01: Wafer Slot Id
- Numeric Field 02:
- Numeric Field 03:
- Numeric Field 04:
- Numeric Field 05:
- Numeric Field 06:
- Numeric Field 07:
- Numeric Field 08:
- Numeric Field 09:
- Numeric Field 10:

FIG. 19B

Tool/Chamber Specific Constants

File  Edit  Options

Zone: Zone1                Tool: Toolxyz

| Tool Setup | Custom Fields | Parameter Lists | Productivity | PPID Classification | Transitions |

Default Productivity Constants   THT [0.20]  ETHT [0.18]  VTHT [0.07]  RTHT [0.19]

| PPID ▶ |  | Wafer ID ▶ | None ▶ | None ▶ | Hours ▶ |

| # | PPID | Wafer ID | | THT | ETHT | VTHT | RTHT |
|---|---|---|---|---|---|---|---|
| 1 | Process ABC | Default | | 0.18 | 0.15 | 0.05 | 0.17 |
| 2 | Process ABC | 1 | | 0.24 | 0.21 | 0.11 | 0.23 |
| 3 | Process XYZ | Default | | 0.25 | 0.2 | 0.08 | 0.23 |
| 4 | Process 123 | Default | | 0.45 | 0.40 | 0.12 | 0.38 |
| 5 | PPID ▶ | | | | | | |
| 6 | Default | | | | | | |
| 7 | Process ABC | | | | | | |
| 8 | Process XYZ | | | | | | |
| 9 | Process ZZZ | | | | | | |
| 10 | Process 123 | | | | | | |
| 11 | Process PDQ | | | | | | |
| 12 | Process ??? | | | | | | |
| 13 | Process * | | | | | | |
| 14 | | | | | | | |

Tool/Chamber Specific Constants

File   Edit   Options

Zone: Zone1   Tool: Toolxyz

| Tool Setup | Custom Fields | Parameter Lists | PPID Classification | Productivity | Transitions |

Transition Type Classification

| ID | Transition Name | Previous State | New State | Symptom Source |
|----|-----------------|----------------|-----------|----------------|
| 0  | Default Transition | **** | **** | Don't Care |
| 1  | | | | |
| 2  | | | | |
| 3  | To Productive | !1*** | 1*** | Don't Care |
| 4  | To Standby | !2*** | 2*** | Don't Care |
| 5  | Fault in Productive | 1*** | 5*** | Don't Care |
| 6  | Productive Fault Cleared | 5*** | 1*** | Tool |
| 7  | Fault in Standby | 2*** | 5*** | Don't Care |
| 8  | Standby Fault Cleared | 5*** | 2*** | Tool |
| 9  | To Scheduled Downtime | !4*** | 4*** | Don't Care |
| 10 | User Initialed Transition | **** | **** | User |
| 11 | | | | |
| 12 | Standby to Standby | 2*** | 2*** | Don't Care |
| 13 | Productive to Productive | 1*** | 1*** | Don't Care |
| 14 | Fault in Engineering | 3*** | 5*** | Don't Care |
| 15 | Engineering Fault Cleared | 5*** | 3*** | Tool |

Symptom Source dropdown:
- Don't Care
- User
- Tool
- Host or Tool
- User or Tool
- User or Host

Manual Transition Data Input

Transition request from: UDT/Broken Wafer
To SBY

Interrupt Classification [None ▶]  [Non-chargeable ▶]  ☐ Lock new tool state

Batch id

Lot ids

Wafer ids

| Device ID | | | | | Wafer Slot id | | | | |
|---|---|---|---|---|---|---|---|---|---|
| Layer | | | | | | | | | |
| N/A | N/A | N/A | N/A | | N/A | N/A | N/A | N/A | |
| N/A | N/A | N/A | N/A | | N/A | N/A | N/A | N/A | |
| N/A | N/A | N/A | N/A | | N/A | N/A | N/A | N/A | |
| N/A | N/A | N/A | N/A | | N/A | N/A | N/A | N/A | |

Comment

[OK]   [Cancel]

FIG. 20

Manual Entry

File  Zone/Tool  Help
Zone: ZoneXYZ  Current State: UDT/Broken Wafer  Tool: ToolABC ☐ Lock Current Tool State

| Input Rework/Scrap Data | Manual Transitions | External State Control |

Lot Retrieval Options

Input Lot id [LotXYZ]

[Retrieve Process Runs]

⦿ Search Last [30] [Days ▶]  [Start]

○ Set Specific Dates  [End]

Search for lot id data base between 03/15/2000 10:02:45 and 04/14/2000 10:02:45

Scrap and Rework Entry

| Time Stamp | Process Name (PPID) | Actual Units | Scrap Units | Rework Units |
|---|---|---|---|---|
| 04/03/2000 13:24:52 | Recipe A | 1 | 0 | 0 |
| 04/03/2000 13:26:15 | Recipe A | 1 | 0 | 0 |
| 04/03/2000 13:29:01 | Recipe A | 1 | 0 | 0 |
| 04/03/2000 13:31:53 | Recipe A | 1 | 0 | 0 |
| 04/03/2000 13:34:07 | Recipe A | 1 | 0 | 0 |
| 04/03/2000 13:36:27 | Recipe A |  | 0 | 0 |
| 04/03/2000 13:44:21 | Recipe A |  |  |  |

[Save Data]

SEARAMS Report Properties

| Tool List | Report Partition | Report Metric | Properties |

Report Date Range:

— Fixed Date Range
⊙ Select Report Date Range
Start Time Stamp    End Time Stamp    Now February ▶  2000              February ▶  2000

S  M  T  W  T  F  S            S  M  T  W  T  F  S
         1  2  3  4  5                  1  2  3  4  5
6  7  8  9 [10] 11 12          6  7  8  9 [10] 11 12
13 14 15 16 17 18 19          13 14 15 16 17 18 19
20 21 22 23 24 25 26          20 21 22 23 24 25 26
27 28 29                       27 28 29

9:15:19 AM                     9:15:19 AM

Variable Date Range
Report Duration

[ 30 ] Days ▶

Report Interval
☒ Calculation int.
Number of Interval
⊙ [ 10 ]  Interval
Interval Duration
[ 2 ] Days ▶

Plot         Cancel         Apply

Report Properties

| Report Time | Tool Selection | Report Metrics | Properties |

Pareto Properties

Plot Parameter
- ◉ Frequency
- ○ Time

State
Symptom/Triger
ALID
Alarm Text
CEID
Event Text
PPID

Frequency Property
☐ Transition Based

Time Property
☐ Average Time
Scale [Days]
  Days
  Months
  Hours
  Minutes

Sort by
[State Name]

Then by
[Tool Name]
  (none)
  State Name
  Tool Name
  State Number
  Data Magnitude ◉ Ascending
○ Descending Color Preferences
Background
Axis/Gridlines
All Bars/Labels No Plot
Black
White
Red
Blue
Green
Pink
Maroon
Grey ☐ E10 Colors Resolution: [Substate Level4]

[Plot] [Cancel] [Apply]

SYSTEM AND METHOD FOR AUTOMATED MONITORING AND ASSESSMENT OF FABRICATION FACILITY

CROSS-REFERENCE TO RELATED APPLICATION(S)

This application claims the benefit of U.S. Provisional Patent Application No. 60/241,343, filed Oct. 17, 2000, which is incorporated by reference herein in its entirety.

BACKGROUND OF THE INVENTION

1. Field of the Invention

The field of the present invention relates to systems and methods for monitoring and assessing the performance and operation of fabrication facilities, such as semiconductor fabrication facilities.

2. Brief Description of Related Developments

The manufacture of microelectronic circuits and/or components on semiconductor wafers can be a complex and involved process, requiring numerous tools and machines operating in a production sequence according to a specified set of instructions (e.g., a "recipe"). Examples of fabrication processes typically performed in the manufacture of a semiconductor wafer include etching, deposition, diffusion, and cleaning.

Large semiconductor fabrication facilities can have dozens or even hundreds of tools, each of which is called upon periodically to perform part of a process as dictated by the selected recipe(s). Some fabrication tools are used for processing semiconductor wafers, while others, known as metrology tools, are generally used for measuring the output of a processing tool. Fabrication tools are often employed in an assembly-line fashion, with each applicable tool having a role in the step-by-step fabrication of a semiconductor wafer. However, due to the nature of the step-by-step manufacturing processes, at least some tools will be idle at any given time, waiting for the output of an upstream tool. Fabrication tools can also be idle for other reasons, such as when needing maintenance, repair or re-programming, or re-configuration with respect to other tools in the plant. The amount of time fabrication tools are idle bears a correlation, directly or indirectly, to the overall efficiency of a semiconductor fabrication facility, and hence a correlation to the profitability of the facility. A challenge for each fabrication facility is thus to reduce idle time of fabrication tools to the maximum extent possible, therefore maximizing production time, yield and profitability.

Moreover, many processing tools and metrology tools are quite expensive, and the collective array of tools brought together at a semiconductor fabrication facility represent a substantial investment. To the extent tools are idle, the investment in these tools is wasted. The floor space at semiconductor fabrication facilities is also enormously expensive, due to extreme requirements of cleanliness, among other reasons, and so even inexpensive tools which are idle can be costly in terms of wasted floor space that is being underutilized. Furthermore, large semiconductor fabrication facilities often will have many duplicate tools for performing processes in parallel. If facility engineers can determine that certain duplicate tools are idle for long periods, then some of the duplicate tools can potentially be eliminated, saving both the cost of the tools and the floor space that they take up. Alternatively, if all of a certain type of tool is operating at maximum efficiency yet still are the cause of a bottleneck in the manufacturing process, production engineers may determine that more tools need to be purchased. Therefore, a tremendous need exists to identify which fabrication tools are active and which idle, and for what reasons. For example, if a fabrication tool was idle for a long period because the upstream process step takes a long time, a production engineer may come to a different conclusion about how to adjust facility resources than if the idle period was due to the fact that the upstream fabrication tool was broken and needed to be repaired. Thus, the reason for tool idleness can be important information for engineers controlling semiconductor manufacturing processes.

To assist production engineers in assessing semiconductor manufacturing efficiency, a variety of informational reporting standards have been promulgated. One of the earliest such standards is known as the E10-0699 Standard for Definition and Measurement of Equipment Reliability, Availability and Maintainability (RAM) (hereinafter the "E10 Standard"), hereby incorporated by reference as if set forth fully herein. This standard, originally put forward around 1986 by Semiconductor Equipment and Materials International (SEMI), defines six basic equipment states into which all equipment conditions and periods of time (either productive or idle time) must fall. Total time for each tool is divided into Operations Time and Non-Scheduled Time. Operations Time is divided into five different categories (Unscheduled Downtime, Scheduled Downtime, Engineering Time, Standby Time, and Productive Time) which, together with Non-Scheduled Time, comprise the six basic equipment states. Equipment Downtime for a given tool is divided into Unscheduled Downtime and Schedule Downtime. Likewise, Equipment Uptime for a given tool is divided into Engineering Time, Standby Time and Productive Time. Of these three Equipment Uptime states, Productive Time and Standby Time collectively represent the Manufacturing Time for a given tool.

The E10 Standard also defines a number of reliability, availability and maintainability measurements relating to equipment performance. Such measurements include, for example, mean (productive) time between interrupts (MTBI), mean (productive) time between failures (MTBF), mean (productive) time between assists (MTBA), mean cycles between interrupts (MCBI), mean cycles between failures (MCBF), and mean cycles between assists (MCBA). Mean (productive) time between interrupts (MTBI) indicates the average time that the tool or equipment performed its intended function between interrupts, and is calculated as the productive time divided by the number of interrupts during that time. Mean (productive) time between failures (MTBF) indicates the average time the tool or equipment performed its intended function between failures, and is calculated as the productive time divided by the number of failures during that time. Mean (productive) time between assists (MTBA) indicates the average time the tool or equipment performed its intended function between assists, and is calculated as the productive time divided by the number of assists during that time. Mean cycles between interrupts (MCBI), mean cycles between failures (MCBF), and mean cycles between assists (MCBA) are similar, but relate the number of tool or equipment cycles to the number of interrupts, failures and assists, rather than the productive time. The E10 Standard also provides guidelines for calculating equipment dependent uptime, supplier dependent uptime, operational uptime, mean time to repair (average time to correct a failure or an interrupt), mean time off-line (average time to maintain the tool or equipment or return it to a condition in which it can perform its intended function), equipment dependent scheduled downtime, supplier dependent scheduled downtime, operational utilization, and total utilization. The E10 Standard provides for calculation of two important metrics in particular: Overall Equipment Effectiveness (OEE), and Overall Fabrication Effectiveness (OFE). Traditionally, most of the information used to calculate the metrics in the E10 Standard has been gathered manually—a slow, tedious process prone to potential errors.

Since its inception, the E10 Standard has been refined and improved upon. In recent years, at least two new standards have been proposed or adopted by SEMI, the same entity that originally proposed the E10 Standard. The first of these new standards is known as the E58-0697 Automated Reliability, Availability and Maintainability Standard (ARAMS) (hereinafter the "E58 Standard"), and the second is known as the E79 Standard for Definition and Measurement of Equipment Productivity (hereinafter the "E79 Standard"). The E58 Standard was proposed around 1997 in an attempt to integrate automated machine processes into the E10 Standard. Accordingly, the E58 Standard specifies triggers for state transitions described in the E10 Standard, with the intent of encouraging tool or equipment manufacturers to store and make available trigger information at each tool. As the E58 Standard was apparently envisioned, tool and equipment manufacturers would include special software with their tools and equipment, allowing controllers or monitoring equipment to read information about trigger events that could be gathered and used in the calculations of tool availability, reliability and maintainability. However, very few tool and equipment manufacturers have actually written such special software for their tools and equipment. One possible reason for the reluctance to include such software is that, if productivity information were available to their customers, tool and equipment manufacturers might be required to extend warranty periods for their tools and equipment for periods of time in which the equipment was not up and running. Therefore, tool and equipment manufacturers have an incentive not to provide software that meets the guidelines of the E58 Standard.

More recently, the E79 standard has been proposed. The E79 Standard builds upon the E10 and E58 Standards, and specifies, among other things, a set of metrics for calculating certain reporting items. Two such metrics are referred to as the Overall Equipment Efficiency (OEE) metric and Overall Fabrication Efficiency (OFE) metric. The E79 Standard also specifies metrics for determining, for example, Availability Efficiency, Performance Efficiency, Operational Efficiency, Rate Efficiency, Theoretical Production Time, and Quality Efficiency, among others.

While the E10, E58 and E79 Standards all provide guidelines for assessing equipment availability, reliability and maintainability, they do not describe how to gather and process the necessary information. These tasks can be quite challenging. For example, different platforms are used in different semiconductor fabrication facilities for communicating between supervisory equipment and various processing and measurement tools. Therefore, a single information gathering technique might not be possible for all fabrication facilities. Furthermore, despite the existence of the E58 Standard, few tools actually store the trigger and event information that facilitates the calculation of various performance and efficiency metrics covered by the standards. Thus, obtaining the necessary data can be difficult. In addition, multi-chamber tools (also known as cluster tools) pose a problem, because they involve equipment with multiple subsidiary tools treated as a single unit. The standards indicate a preference that information concerning the individual subsidiary tools be available, as opposed to merely information about the cluster tool as a whole.

While having an automated way of gathering and processing information useful for monitoring and assessing tool and equipment performance according to the various available standards would be highly beneficial, actual implementations of systems for performing these activities may be undesirable if they require modifications to existing control systems which are deployed in semiconductor fabrication facilities. Owners of such facilities may be very reluctant to make changes that would impact their existing control systems, because of the potential for introducing "bugs" or errors into the system, or causing other unforeseen consequences. Moreover, actual implementations of systems for monitoring or assessing tool and equipment performance according to the various standards may also be undesirable if they require modifications to the existing processing or metrology tools. Tool manufacturers may be quite reluctant to make changes that might impact the performance of their tools, such as changing the message driver of the tools, or that might lead to incompatibilities with existing versions of tools, interface equipment, or control systems. Moreover, tool manufacturers may simply want to avoid the expense of re-designing their tools to provide the functionality that may be required for monitoring or assessing tool and equipment performance.

It would therefore be advantageous to provide a non-intrusive, reliable and comprehensive system or method for monitoring, assessing and reporting the operation and performance of semiconductor or other types of fabrication facilities. It would further be advantageous to provide such a system or method that requires a minimum of modifications to existing control systems, tools or equipment.

SUMMARY OF THE INVENTION

In accordance with a first embodiment of the invention, a method for monitoring and assessing operation of a semiconductor fabrication facility comprises the steps of connecting a monitoring and assessment system to a system bus which is connected directly or indirectly to a manufacturing execution system and a plurality of semiconductor fabrication tools. Through a user interface, the state models for each fabrication tool can be configured where each state model is based upon a set of defined triggers for each tool. During monitoring various messages are transmitted on the system bus between the semiconductor fabrication tools and the manufacturing execution system and the monitoring and assessment system, and appropriate triggers are generated based upon the messages where the triggers are selected from a set of defined triggers. During operation, the state models are updated for each tool affected by one of the triggers and transitions within the state models are recorded in a tracking database.

In another embodiment of the invention, a system for monitoring and assessing operation of a semiconductor fabrication facility for assessing overall equipment effectiveness and overall fabrication effectiveness comprises a monitoring and assessment system for receiving messages having equipment information therein for tracking operation states of a plurality of semiconductor fabrication tools. A manufacturing execution system for controlling the manufacture of semiconductor wafers or other products according to a programmed recipe sends commands to the semiconductor fabrication tools, monitors their activity and sends messages to the monitoring and assessment system. These messages are transmitted over a system bus that is connected directly or indirectly to the manufacturing execution system and the monitoring and assessment system. A user interface can monitor the messages transmitted on the system bus between the semiconductor fabrication tools and the manufacturing execution system and the monitoring and assessment system. A user may configure state models for the semiconductor fabrication tools in which the state models are based upon a set of defined triggers for each tool. Base on the trigger information and other events, the state transitions are maintained in a tracking database for recording state transitions within the state models.

As a further embodiment of the present invention, a monitoring and assessment system for monitoring and assessing operation of a semiconductor fabrication facility assesses overall equipment and overall fabrication effectiveness. The monitoring and assessment system comprises a trigger/event interface for receiving messages having fabrication tool information therein for tracking operation states of a plurality of semiconductor fabrication tools. A state model logic receives the tracking operation information for each fabrication tool having defined states and a state transition logic defining triggering events and the state transitions related to the triggering event. If the fabrication tool has a state change, a state change transition logger inputs this information into a tracking database for recording transition information. A report generator with metric calculation logic therein may generate performance metrics for the fabrication tools which is used for assessing overall equipment effectiveness and overall fabrication effectiveness of the fabrication tools. A user interface may monitor and configure state models for the semiconductor fabrication tools in the state model logic, may configure trigger/event information in the trigger/event interface, may monitor state transitions in the tracking database, and may monitor equipment effectiveness and overall fabrication effectiveness of the fabrication tools.

BRIEF DESCRIPTION OF THE DRAWINGS

FIGS. 6A and 6B are diagrams illustrating one embodiment of a system logic flow for processing messages at an automated monitoring and assessment system based upon a transition initiation type.

FIGS. 7A and 7B are diagrams illustrating one embodiment of a system logic flow for receiving and filtering trigger messages at an automated monitoring and assessment system.

FIGS. 10A-1, 10A-2, 10B-1, 10B-2, 10C-2 and 10D are examples of one embodiment of a state properties screen display, with different sub-screen tabs selected, as may be presented to a user who has selected a particular state to view its properties.

FIGS. 15A–15F and 16a and 16b collectively illustrate several embodiments of screen displays that may be presented to the user in order to perform mappings between alarm events, collection events, variables and triggers.

FIGS. 18a and 18b illustrate a relationship between data appearing on a trigger configuration screen (e.g., FIG. 12) and data appearing on an external state control sub-screen.

FIGS. 19A–19F are examples of one embodiment of screen displays as may be presented to a user in order to define tool or chamber specific constants.

FIGS. 20 and 21 are examples of one embodiment of screen displays as may be presented to a user in order to force a manual transition or to modify data in the tracking database, respectively.

FIG. 22 is an example of one embodiment of a screen display as may be presented to a user during live monitoring of tools in the semiconductor fabrication system.

FIG. 23 is an example of a screen display of a report properties dialog window in one embodiment of the present invention.

FIG. 24 is an example of one embodiment of a pareto properties dialog window.

DETAILED DESCRIPTION OF THE PREFERRED EMBODIMENT(S)

Figure 1:
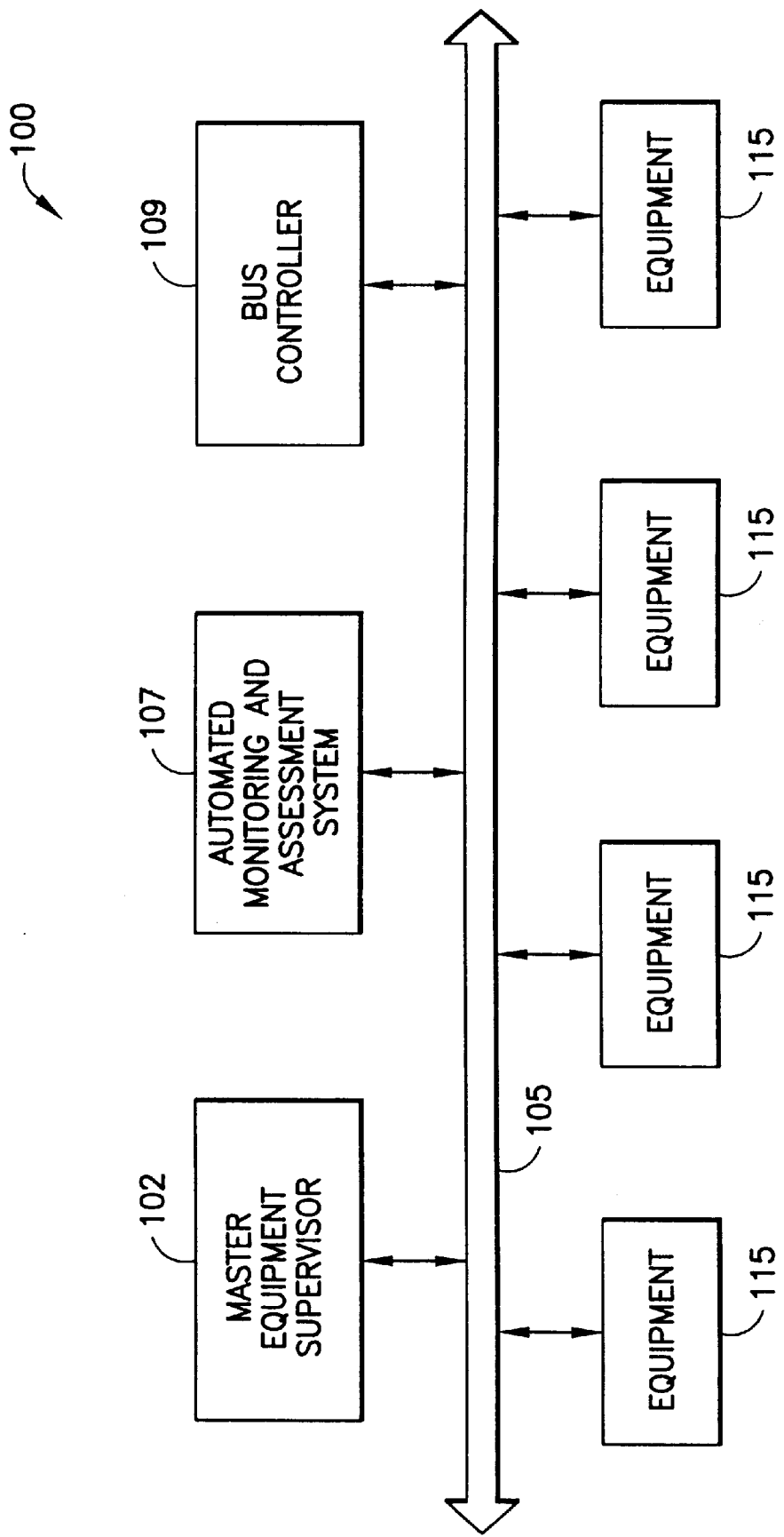
FIGS. 1 through 3 are top-level diagrams illustrating examples of semiconductor fabrication systems in which an automated monitoring and assessment system incorporates features of the present invention.

Referring to FIG. 1, there is shown a semiconductor fabrication system 100 incorporating features of the present invention. Although the present invention will be described with reference to the embodiment shown in the drawings, it should be understood that the present invention can be embodied in many alternate forms of embodiments. In addition, any suitable size, shape or type of elements or materials could be used.

FIG. 1 is a top-level diagram illustrating an example of a semiconductor fabrication system 100 in which an automated monitoring and assessment system incorporating features of the present invention. As illustrated in FIG. 1, a manufacturing execution system 102 is connected to a system bus 105, along with a plurality of semiconductor fabrication tools 115 (simply labeled "equipment" in FIG. 1), which may include processing tools and/or metrology tools. The manufacturing execution system 102 controls the manufacture of semiconductor wafers or other products according to a programmed recipe, by sending commands to the various semiconductor fabrication tools 115 and monitoring their activity. Also connected to the system bus 105 is an automated monitoring and assessment system 107, which may comprise one or more computers, servers and databases, as further described herein. A bus controller 109 is also connected to the system bus 105, for controlling communication thereover.

Preferably, the system bus 105 comprises a standard communication bus, such as, for example, a Common Object Request Broker Architecture (CORBA) bus, in which case messages sent over it are packaged as CORBA objects. Messages are preferably transmitted over the system bus 105 according to a common standard, such as the Semiconductor Equipment Communication Standard (SECS), which is very well known in the semiconductor industry. The bus controller 109 controls the routing of information over the system bus 105, and the automated monitoring and assessment system 107 preferably "subscribes" to the information needed for performing the monitoring and assessment functions as described later herein. The bus controller 109 may route some, but not all, of the information in each message to the automated monitoring and assessment system 107, by excluding any non-pertinent information. When the automated monitoring and assessment system 107 incorporating features of the present invention first becomes actively connected to the system bus 105, it indicates to the bus controller 109 what type of information it is interested in, according to well-known techniques associated with the CORBA standard.

Messages (e.g., SECS messages) transmitted or published over the system bus 105 from the various semiconductor fabrication tools 115 to the manufacturing execution system 102 may include, for example, various alarm messages, event messages, parameter updates (e.g., SVID messages), symptom (or trigger) messages, and the like. The automated monitoring and assessment system 107 receives information from the transmitted or published messages, and uses that information to track the operation states of the various semi-conductor fabrication tools 115, according to techniques described in more detail herein.

Figure 2:
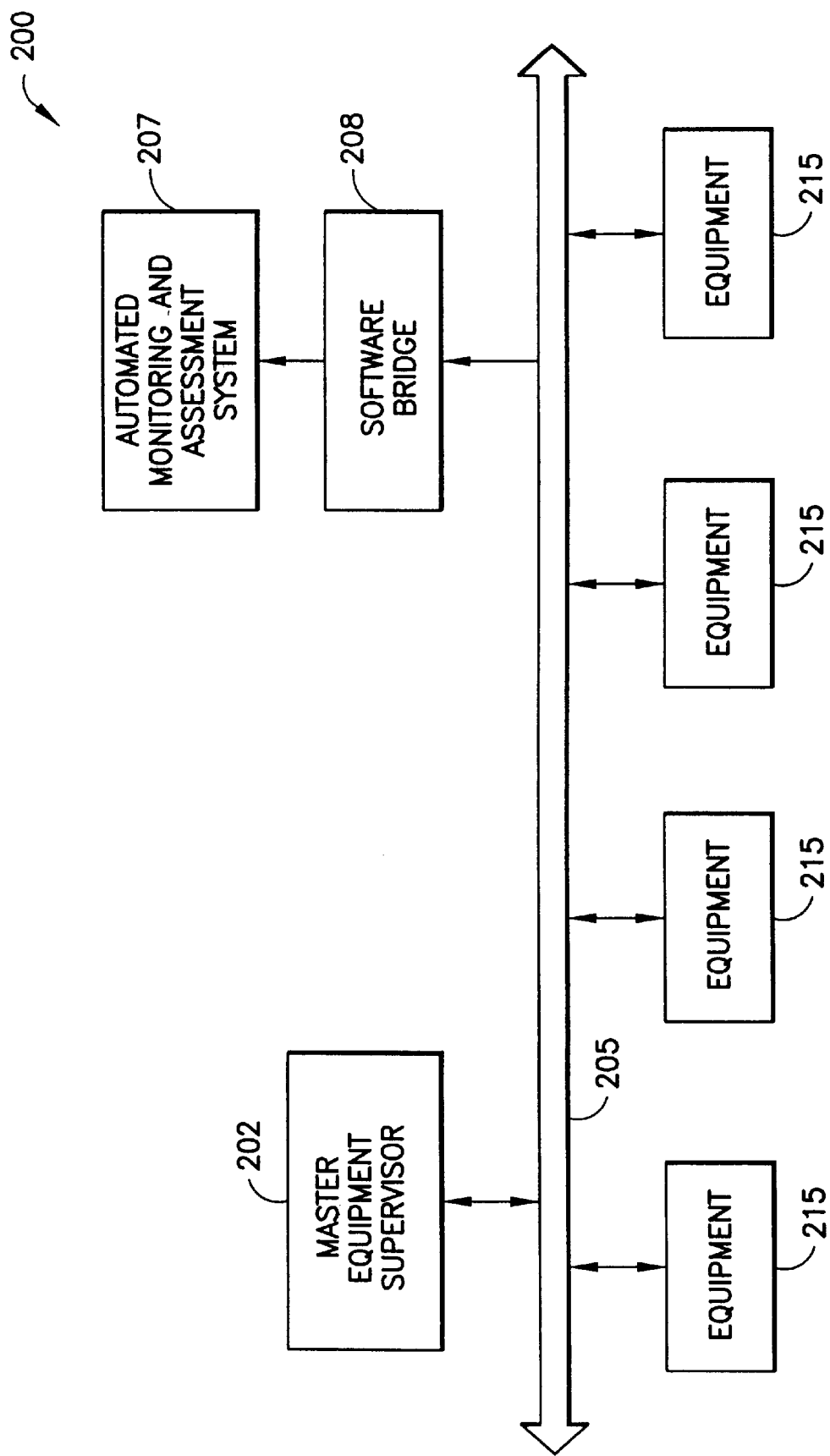

FIG. 2 is a top-level diagram illustrating another example of a semiconductor fabrication system 200 in which an automated monitoring and assessment system incorporating features of the present invention. In FIG. 2, similar to FIG. 1, a manufacturing execution system 202 connects to a system bus 205, along with a plurality of semiconductor fabrication tools 215 (labeled "equipment" in FIG. 2), which may include processing tools and/or metrology tools. Preferably, the system bus 205 comprises a standard communication bus, such as a Distributed Common Object Module (DCOM) bus, but it may also comprise a non-standard or proprietary communication bus. The DCOM bus is commonly used in connection with the Windows NT® operating system. As further shown in FIG. 2, also connected to the system bus 205, via a software bridge 208, is one embodiment of an automated monitoring and assessment system 207 incorporating features of the present invention, which may comprise one or more computers, servers and databases, as further described herein.

Referring to FIG. 2 in a preferred embodiment, the automated monitoring and assessment system 207 comprises a CORBA interface by which messages packaged as CORBA objects are received from the software bridge 208. The software bridge 208 preferably translates messages transmitted or published over the system bus 205 (e.g., DCOM messages) into a CORBA format, so that the automated monitoring and assessment system 207 can receive them. Thus, in one aspect, the automated monitoring and assessment system 207 in FIG. 2 can be configured identically to the automated monitoring and assessment system 107 shown in FIG. 1, since the automated monitoring and assessment system either (as in FIG. 1) receives messages from a system bus 105 in the monitoring and assessment system's native configuration, or else (as in FIG. 2) receives messages through a software bridge 208 from a system bus 205 which is not otherwise compatible with the monitoring and assessment system's native configuration.

As with the embodiment shown in FIG. 1, messages transmitted or published over the system bus 205 from the various semiconductor fabrication tools 215 to the manufacturing execution system 202 may be sent as SECS messages, and may include, for example, various alarm messages, event messages, parameter updates (e.g., SVID messages), symptom (or trigger) messages, and the like. The automated monitoring and assessment system 207 receives information from the transmitted or published messages, and uses that information to track the operation states of the various semi-conductor fabrication tools 215, according to techniques described in more detail herein.

Figure 3:
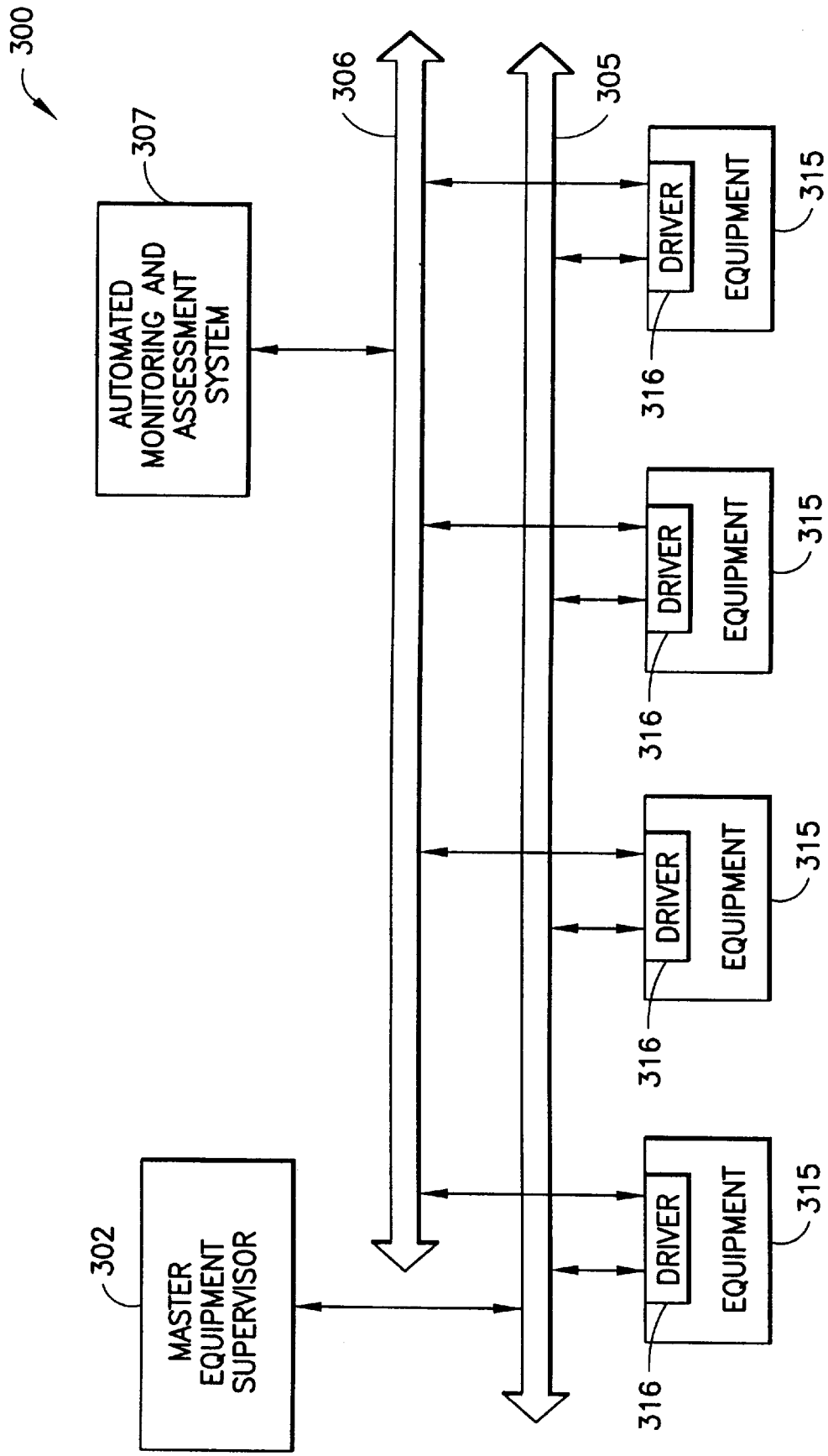

FIG. 3 is a top-level diagram illustrating yet another example of a semiconductor fabrication system 300 in which an automated monitoring and assessment system may be incorporated. In FIG. 3, similar to FIG. 2, a manufacturing execution system 302 connects to a first system bus 305, along with a plurality of semiconductor fabrication tools 315 (labeled "equipment" in FIG. 3), which may include processing tools and/or metrology tools. The first system bus 305 preferably comprises a standard or non-standard communication bus of a first type, such as a DCOM bus. Unlike the system 200 shown in FIG. 2, the system 300 shown in FIG. 3 includes a second system bus 306, which preferably comprises a standard communication bus of a second type, such as a CORBA bus. An automated monitoring and assessment system 307, which may comprise one or more computers, servers and databases, as further described herein, is connected to the second system bus 306. The various semiconductor fabrication tools 315 are connected to the second system bus 306 as well as to the first system bus 305. Preferably, the semiconductor fabrication tools 315 include low-level drivers 316 which transmit or publish information on the second system bus 306 at essentially the same time the information is transmitted or published on the first system bus 305.

In a preferred embodiment, the automated monitoring and assessment system 307 comprises a CORBA interface by which messages packaged as CORBA objects are received via the second system bus 306. A bus controller (not shown in FIG. 3) may also be connected to the second system bus 306, to manage communications thereon. In one aspect, the automated monitoring and assessment system 307 in FIG. 3 can be configured identically to the automated monitoring and assessment systems 107 and 207 shown in FIGS. 1 and 2, respectively, since the automated monitoring and assessment system either (as in FIGS. 1 or 3) receives messages from a system bus 105 or 306 in the monitoring and assessment system's native configuration, or else (as in FIG. 2) receives messages through a software bridge 208 from a system bus 205 which is not otherwise compatible with the monitoring and assessment system's native configuration.

Messages transmitted or published over the system buses 305 or 306 from the various semiconductor fabrication tools 315 to the manufacturing execution system 302 or automated monitoring and assessment system 307 may be sent as SECS messages, and may include, for example, various alarm messages, event messages, parameter updates (e.g., SVID messages), symptom (or trigger) messages, and the like. The automated monitoring and assessment system 307 receives information from the transmitted or published messages, and uses that, information to track the operation states of the various semi-conductor fabrication tools 315, according to techniques described in more detail herein.

Figure 4:
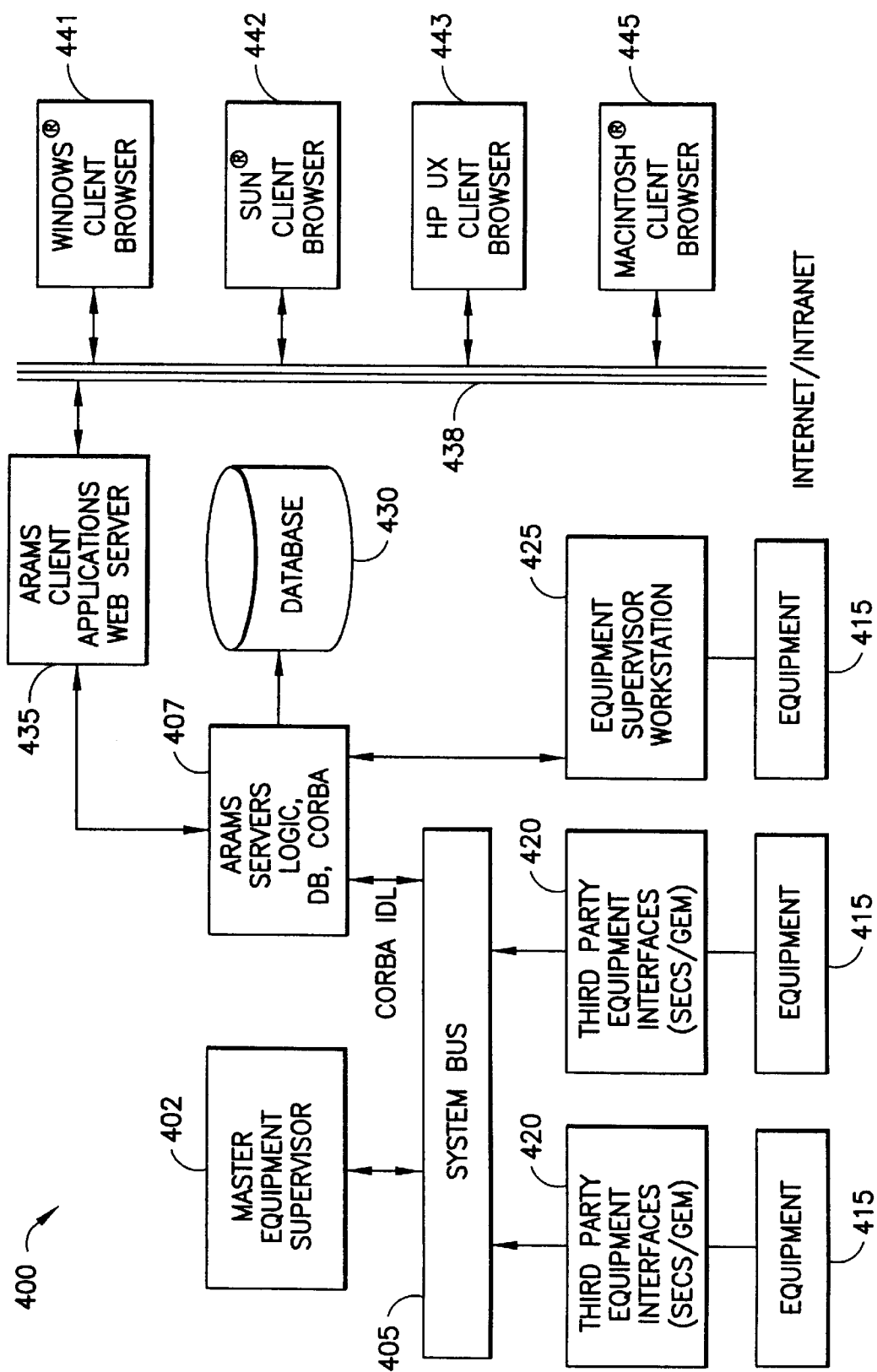
FIG. 4 is a top-level diagram illustrating further details of a semiconductor fabrication system in which an automated monitoring and assessment system incorporates features of the present invention.

FIG. 4 is a top-level diagram illustrating further details of a semiconductor fabrication system 400 in which an automated monitoring and assessment system may be employed. As shown in FIG. 4, a manufacturing execution system 402 is connected to a system bus 405. An automated monitoring and assessment system 407 may connect to the system bus 405 also, through a software bridge or other type of interface if necessary. A variety of semiconductor fabrication tools 415 (labeled "equipment" in FIG. 4) may be connected to the system bus 405 through equipment interfaces 420 (which may be supervisory stations), which format and transmit messages over the system bus 405 according to a protocol compatible with the system bus 405, and likewise interpret messages received over the system bus 405 according to the protocol. For example, the equipment interfaces 420 may each comprise a SECS or GEM interface. Semiconductor fabrication tools 415 may also be connected to an equipment supervisor workstation 425, which may generate information in a standard compatible with the automated monitoring and assessment system 407.

The automated monitoring and assessment system 407 preferably is configured to receive messages according to the CORBA protocol. A database 430 for storing, among other things, information gathered by monitoring the various semiconductor fabrication tools 415 is connected to or incorporated in the automated monitoring and assessment system 407. Also, a web server 435 configured with a variety of application programs may be connected to or incorporated in the automated monitoring and assessment system 407. The web server 435 may be connected to a distributed electronic network 438—for example, a global electronic network such as the Internet, or a proprietary intranet. Users, preferably connected through any of a variety of web browsers 441, 442, 443 or 445, may receive information from the automated monitoring and assessment system 407 via the web server 435 and the associated application programs. The automated monitoring and assessment system 407 preferably comprises one or more computers which are programmed to perform the functions specified herein. The computer programs run on the automated monitoring and assessment system 407 are preferably written in a platform-independent language such as JAVA®, which may make it convenient to support remote users connected via web browsers 441, 442, 443 or 445, but may be written in any suitable programming language.

Messages (e.g., SECS messages) transmitted or published over the system bus 405 or through the equipment supervisor workstation 425 from the various semiconductor fabrication tools 415 may include, for example, various alarm messages, event messages, parameter updates (e.g., SVID messages), symptom (or trigger) messages, and the like, which may be used in connection with the automated monitoring and assessment system 407 as hereinafter described.

Figure 8:
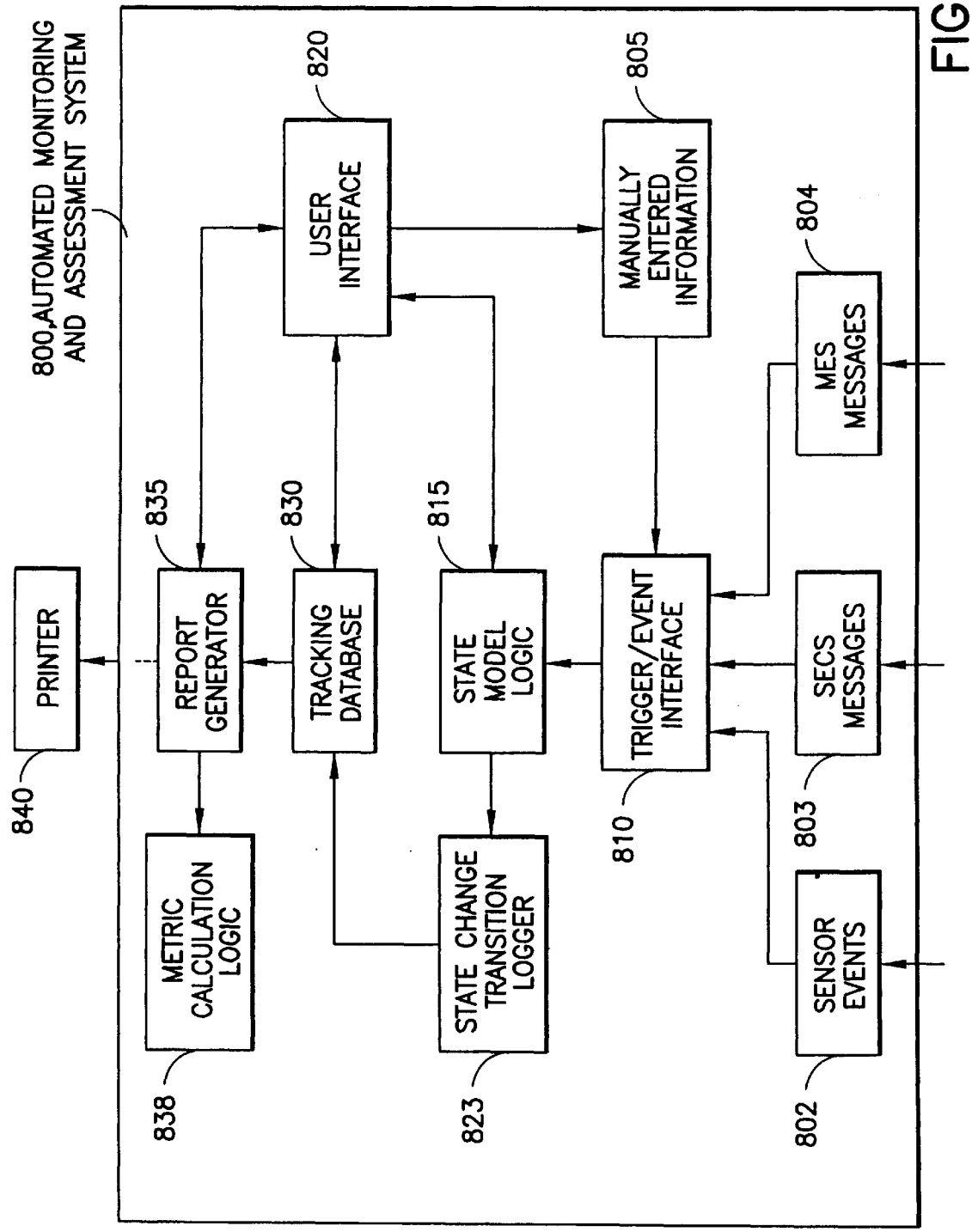
FIG. 8 is a block diagram showing details in accordance with one embodiment of a automated monitoring and assessment system incorporating features of the present invention.

FIG. 8 is a block diagram showing details of one embodiment of a preferred automated monitoring and assessment system 800, as may be employed, for example, in any of the systems 100, 200, 300 or 400 shown in FIGS. 1, 2, 3 and 4, respectively. As shown in FIG. 8, the automated monitoring and assessment system 800 preferably comprises a trigger/event interface processor 810 for receiving messages and various other event information which may cause state changes to occur. The trigger/event interface processor 810 may receive sensor events 802, SECS messages 803 (or messages in other formats besides SECS) and MES messages 804, as well as manually entered information 805 via a user interface 820. A state model processor 815 is defined for the semiconductor fabrication facility and maintained in the automated monitoring and assessment system 800. The state model processor 815 may be initially set up via the user interface 820. When messages or events occur, the trigger/event interface 810 processes them and forwards them to the state model logic processor 815 to transition states as necessary, upon which a state change transition logger 823 logs the state change, along with any pertinent information, in a tracking database 830. The user interface 820 may access the tracking database 830 to view stored messages or potentially modify their content (assuming appropriate privileges and authorization). A report generator 835 also may access the information in the tracking database 830 to generate graphs or performance metrics (for which a metric calculation logic processor 838 may be utilized). Reports may be made according to parameters specified by users via the user interface 820, may be requested manually or automatically generated, and may be e-mailed to users (via a web server or other web interface, not shown in FIG. 8) or optionally be printed out at a local or remote printer 840.

Further details will now be described about the functionality of the automated monitoring and assessment system 400, and a preferred system architecture and system flow for achieving such functionality. While these details are described, for convenience, with respect to the system 400 illustrated in FIG. 4 (or sometimes FIG. 8), it should be understood that the same functionality, system architecture and system flow may be applied to any of the systems 100, 200 or 300 illustrated in FIGS. 1, 2 or 3, respectively, or other automated semiconductor fabrication systems.

In a preferred embodiment, a state table including a set of potential states is defined for each semiconductor fabrication tool 415 in the system 400 for which tracking is desired. Through a user interface managed by the automated monitoring and assessment system 407, the operator of the facility specifies the state transition logic (i.e., triggering events and consequential state transitions) for each tool of interest. When a trigger message is received, the automated monitoring and assessment system 407 transitions the state model for the specific tool or chamber to an appropriate state. The user-specified state transition logic, in one aspect, adaptively modifies the behavior of the monitoring and assessment system, such that state changes are tracked and recorded according to the user-specified criteria. The user-specified state transition logic, in another aspect, acts as a filter for incoming trigger messages, such that preferably only those triggering messages relevant to the user-specified state transition logic cause information to be recorded in the tracking database 430. As a consequence of this filtering aspect, the tracking database 430 can be significantly more compact then if, for example, all triggering messages were recorded and later analyzed.

Figure 5:
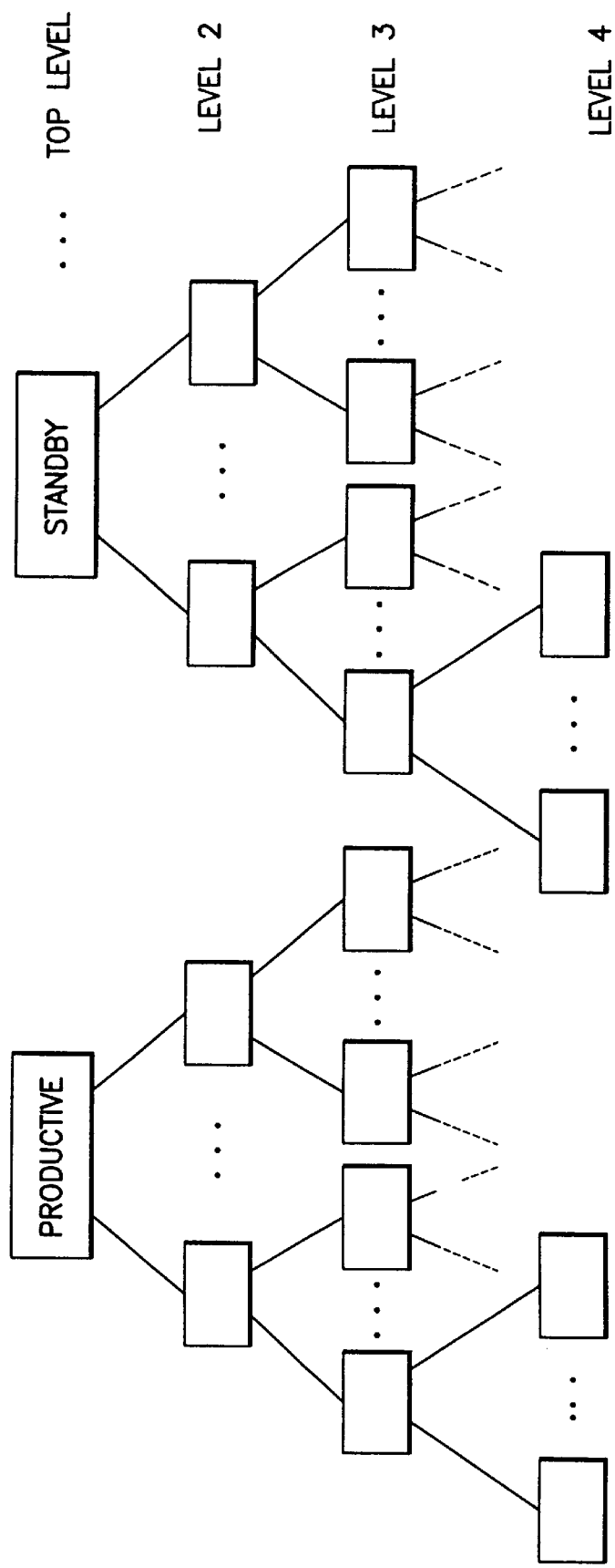
FIG. 5 is a diagram illustrating one embodiment of a possible state table hierarchy that may be used in the monitoring and assessment system of any of the systems illustrated in FIGS. 1, 2, 3 and 4.

In a preferred embodiment, the monitoring and assessment system defines a hierarchy of potential states for each semiconductor fabrication tool 415 connected in the system 400. The hierarchy of potential states is preferably based at least in part on the E10 and/or E58 Standards. For example, the hierarchy of potential states may include six top-level states (Unscheduled Downtime, Scheduled Downtime, Engineering Time, Standby Time, Productive Time, and Non-Scheduled Time), a set of intermediate states (e.g., 10 intermediate states) associated with each top-level states, and one or more optional levels of sub-states beneath each intermediate state. FIG. 5 is an illustration of one possible state table hierarchy. Through an editing tool, a system operator may create new sub-states and assign the sub-states within the state table hierarchy.

To distinguish the states within the system structure, each state preferably includes a state identifier ("state ID"). The state ID may comprise an alphanumeric string encoded to represent state information. As just one example, the state ID may be a four digit alphanumeric string, with the first digit identifying the top-level state (encoded as 1 through 6), the second digit identifying the intermediate sub-state according to the E58 Standard (section 9 thereof), the third digit identifying a user-defined third-level sub-state beneath the intermediate sub-state, and the fourth digit identifying a user-defined fourth-level sub-state beneath the third-level sub-state. For convenience to the user (in terms of displayability), the third and fourth digits may each be selected from among the groups of alphanumeric digits a . . . z, A . . . Z or 1 . . . 9, such that 61 possible sub-states at each of the third and fourth levels are possible (with "0" indicating no sub-state at that level) Thus, state ID's of 51a6 and 51A6 would represent distinct states. State 5112 would be a sub-state of each of the higher-level generic states—that is, states 5110 (the third-level state), 5100 (the intermediate or second-level state), and 5000 (the top-level state). User-defined states are generally not permitted for top-level states or in the absence of intervening sub-states at each level. Thus, for example, states 1011, 1008, 2034, 1208, 3409 and 9902 would all be "illegal" states, whereas states 1000, 1100, 1110, 1320, 3452 and 1919 would all be "legal" states. With more than four digits, additional sub-levels to the state hierarchy may be added. Similarly, more characters than simply the alphanumeric digits a . . . z, A . . . Z and 0 . . . 9 may be used to represent states, but having four hierarchical levels with up to 61 sub-states at each level is likely to cover the vast majority of implementations in practical settings.

Preferably, each state also has an associated state description and set of state properties. The state description may simply be a text field of, for example, 80 characters. The state properties may include the following:

Automatic Transition Triggers—collectively define the symptoms (i.e., trigger message) which cause a state transition to this state.

Cluster Tool Linkage—define the associated state changes to other tools when a state change occurs on the cluster tool. An example would be a state change to Unscheduled Maintenance of a main tool would automatically change the states of all associated chambers on the cluster tool.

Process Name—identifies the process for Productive states. It is used to associate productivity statistics with a given Productive state. A system operator may input the theoretical and value added information for any process, which can be compared with actual run-time data for metrics calculated according to the E79 Standard.

Enabled/Disabled Bit—when enabled, allows users to select this state when changing equipment states via the user interface (i.e., not by automatic response to a trigger message) to some new state. Disables states might be, for example, the default reserved states in the E10 or E58 Standards.

User/Group Access—specifies the group access levels that can transition from this state when changing equipment states via the user interface to some new state.

Valid User State Transitions—define the list of valid states the user may transition to from this state when changing equipment states via the user interface to some new state. An example might be the Down for Repair state, which might require a transition to a Process Qualification State prior to transition to an Up for Production state (which would hence be an illegal state transition directly from Down for Repair). If the list of Valid user State Transitions is left empty, then all defined states are selectable.

State transition rules among the various states in the state table hierarchy preferably include at least the automatic state transitions defined by the E58 Standard in section 8, table 1 thereof, plus any user-defined state transition rules. Also, a system operator (via the user interface) or the manufacturing execution system may force a transition to a new state at any time, assuming proper privileges and authorization.

The E58 Standard defines fifteen transition rules. The automated monitoring and assessment system allows a system operator to configure the trigger events for each automatic state transition, and to define new state transition rules. The trigger information may vary from tool to tool. When a state transition occurs, it preferably gets logged in the tracking database 430, as further described herein. When a trigger event occurs, the automated monitoring and assessment system preferably tests a variety of criteria to classify the associated transition into a default category, if applicable. The default transition types may be changed by the system operator, or new ones added. The following are possible default transition types, as defined by the E58 Standard:

Transition 1, Power-Up/Reset

When a power-up trigger event occurs, the automated monitoring and assessment system transitions to the state defined by this trigger event. The default destination state is Standby ("SBY").

Transition 2, to Manufacturing

Not supported if the automated monitoring and assessment system does not have access to the production criteria for the tools of interest.

Transition 3, to Productive

Defined as an automatic transition from any non-Productive state to a Productive state.

Transition 4, to Standby

Defined as an automatic transition from any non-Standby state to a Standby state.

Transition 5, Fault Detected in Productive

Defined as an automatic transition from a Productive state to an Unscheduled Down state.

Transition 6, Productive Fault Cleared

When a trigger message causes an automatic transition from an Unscheduled Down state to a Productive state.

Transition 7, Fault Detected in Standby

Defined as an automatic transition from a Standby state to an Unscheduled Down state.

Transition 8, Standby Fault Cleared

When a trigger message causes an automatic transition from an Unscheduled Down state to a Productive state.

Transition 9, Scheduled Downtime

When a monitored parameter has reached a pre-defined limit, as indicated by a received message, the automated monitoring and assessment system transitions the tool to the appropriate Scheduled Maintenance sub-state.

Transition 10, User Initiated Transition

A transition caused when a new state is selected via the user interface of the automated monitoring and assessment system, or by the manufacturing execution system via an object interface.

Transition 11, Power-Down

No default set, but users may classify a specific trigger type as a power-down event.

Transition 12, Standby to Standby State Change

Defined as any transition from one Standby sub-state to another Standby sub-state.

Transition 13, Productive to Productive State Change

Defined as any transition from one Productive sub-state to another Productive sub-state.

Transition 14, Fault Detected in Engineering State

Defined as an automatic transition from an Engineering state to an Unscheduled Down state.

Transition 15, Engineering Fault Cleared

Defined as when a trigger event causes an automatic transition from an Unscheduled Down state to an Engineering state.

As noted above, preferably all state transitions are logged in a tracking database 430 for later use. In a preferred embodiment, the tracking database 430 is comprised of records which are regularly added to it as a result of state transition events. Each record may include any of a variety of information, such as the following:

- Time stamp—local CPU time of received trigger event or message
- Transition number—based on the transition types specified above
- Unit IDs—a set of text fields (for, e.g., lot IDs or wafer IDs)
- Batch ID—text field (if Units are wafers, this is the lot ID, otherwise an optional batch ID)
- PPID—text field storing recipe name if sent with the trigger message
- PPID Class—text field storing the PPID class, sent either with the trigger message or derived from the automated monitoring and assessment system
- Source—origin of transition request (i.e., user, manufacturing execution system or tool server)
- Symptom—the symptom or trigger number corresponding to the symptom table (i.e., trigger table)
- OEE State Change—set of flags for each state level, set to true if the previous state was a different OEE state, otherwise false
- Cycles—the total number of cycles the equipment has processed since install (sent from the tool)
- Interrupt—classification of transition to Unscheduled Down Time as equipment Assist or Failure (preferably only recorded when a transition to Unscheduled Down Time occurs from a non-Unscheduled Down Time state)
- Interrupt Classification—classify of Interrupt as Chargeable, Non-Chargeable or Non-Relevant
- ARAMS State Number—4-digit ARAMS state code identifying the triggered destination state
- External State—set of Boolean states used to denote when external states change, such as no operator available, or SMC violation
- THT—Theoretical Production time per unit (only valid in Production states)
- ETHT—Engineering Theoretical Production time per unit (only valid in Production states)
- VTHT—Value Added Theoretical Production time per unit (only valid in Production states)
- Actual Units—actual unit processed (only valid in Production states)
- Scrap Units—scrapped units in this process (only valid in Production states)
- Rework Units—number of units requiring rework (only valid in Production states)
- ALID—recorded ALID (alarm event ID) sent from a SECS compatible driver
- ALID Text—recorded alarm text from a SECS compatible driver
- CEID—recorded CEID (event ID) sent from a SECS compatible driver
- CEID Text—recorded event text from a SECS compatible driver
- SVID—recorded SVID number, but only when a transition is logged (SVIDs preferably do not get logged except in transition records)
- SVID Number—recorded SVID (system variable ID) value, if numeric
- SVID ASCII—recorded SVID value, if in ASCII format
- ms1, ms2, ms3, ms4—time (in milliseconds, e.g.) since the last transition for each state level (assuming 4 state levels)
- Text—set of user-defined text fields
- Floats—set of user-defined signed float fields Since reporting the behavior of the tools in a fabrication facility may require intensive time calculations by the automated monitoring and assessment system, the design of the tracking database 430 is preferably optimized to reduce the report generation time. In one embodiment, to arrive at entries for the time entry fields ms1, ms2, ms3 and ms4, the previous record for the particular tool is read out of the tracking database 430 prior to storing a new record. If the previous record contained a state transition, then for the new record the time between the new record's timestamp and the previous record's time stamp is stored in each time entry field (i.e., each of ms1, ms2, ms3 and ms4) corresponding to a changed state. If the previous record did not contain a state transition, then the values from the time entry fields from the previous record are each added with the time between the new and previous records (i.e., between the new record's timestamp and the previous record's timestamp), and the sums stored in the time entry fields (ms1, ms2, ms3 and ms4) for the new record. In this manner, the time since the previous state change is carried forward until a state change occurs.

Referring to FIG. 4, triggers generated by the automated monitoring and assessment system 407 that do not result in a state change will nevertheless be logged in an audit trail. The tool name, time stamp, source of the trigger (user, manufacturing execution system, or tool server), event or symptom, and current state number may be recorded in an audit record. Preferably, records may be retrieved from the audit trail in a relatively prompt fashion based on selected groups of tools, states or transitions, or any combination of the above-mentioned stored fields. An editing interface may be provided allowing users to edit audit trail records, in case, for example, incorrect states were selected based upon incorrect input criteria or accidental user selection. Users may edit, delete or insert new records when inaccurate information has been supplied causing state transitions.

In a preferred embodiment, all states and sub-states keep a running total of accumulated time within the state. A convenient unit of measure, such as milliseconds, may be selected for keeping track of time in each state. Preferably, at least the following categories of information are maintained for each state:

1) a timestamp of the last time the state was transitioned into
2) the number of times any state transitioned to this state
3) the total amount of time spent in this state (e.g., in milliseconds) since the last user reset
4) The timestamp of the last user-initiated accumulator reset for this state A user may reset the total amount of time spent in a state at any time, causing the total count to be reset to 0 milliseconds. The current accumulator information is preferably stored in a table separate from the tracking database 430 for quick access when required, per user or operator request, at a live status screen by which activity of the semiconductor facility may be monitored.

In a preferred embodiment, each message received by the automated monitoring and assessment system 407 includes a transition initiation type code which specifies which element in the message will be used to generate the transition, if any. The encoding of the transition initiation type may be as follows:

0—"Default"

The automated monitoring and assessment system 407 is to use its internal priority to determined which element will cause a transition. The Internal priority is 1-Trigger, 2-ALID, 3-CEID, 4-SVID

1—"ALID"

The automated monitoring and assessment system 407 will only evaluate the ALID to generate a transition, all other elements will be logged in the database. The automated monitoring and assessment system 407 will ignore any value sent in the trigger field.

2—"CEID"

The automated monitoring and assessment system 407 will only evaluate the CEID to generate a transition, all other elements will be logged in the database. The automated monitoring and assessment system 407 will ignore any value sent in the Trigger field.

3—"SVID"

The automated monitoring and assessment system 407 will only evaluate the SVID to generate a transition, all other elements will be logged in the database. The automated monitoring and assessment system 407 will ignore any value sent in the Trigger field.

X—any other value is treated the same as a 0 (i.e, Default)

Figure 7B:
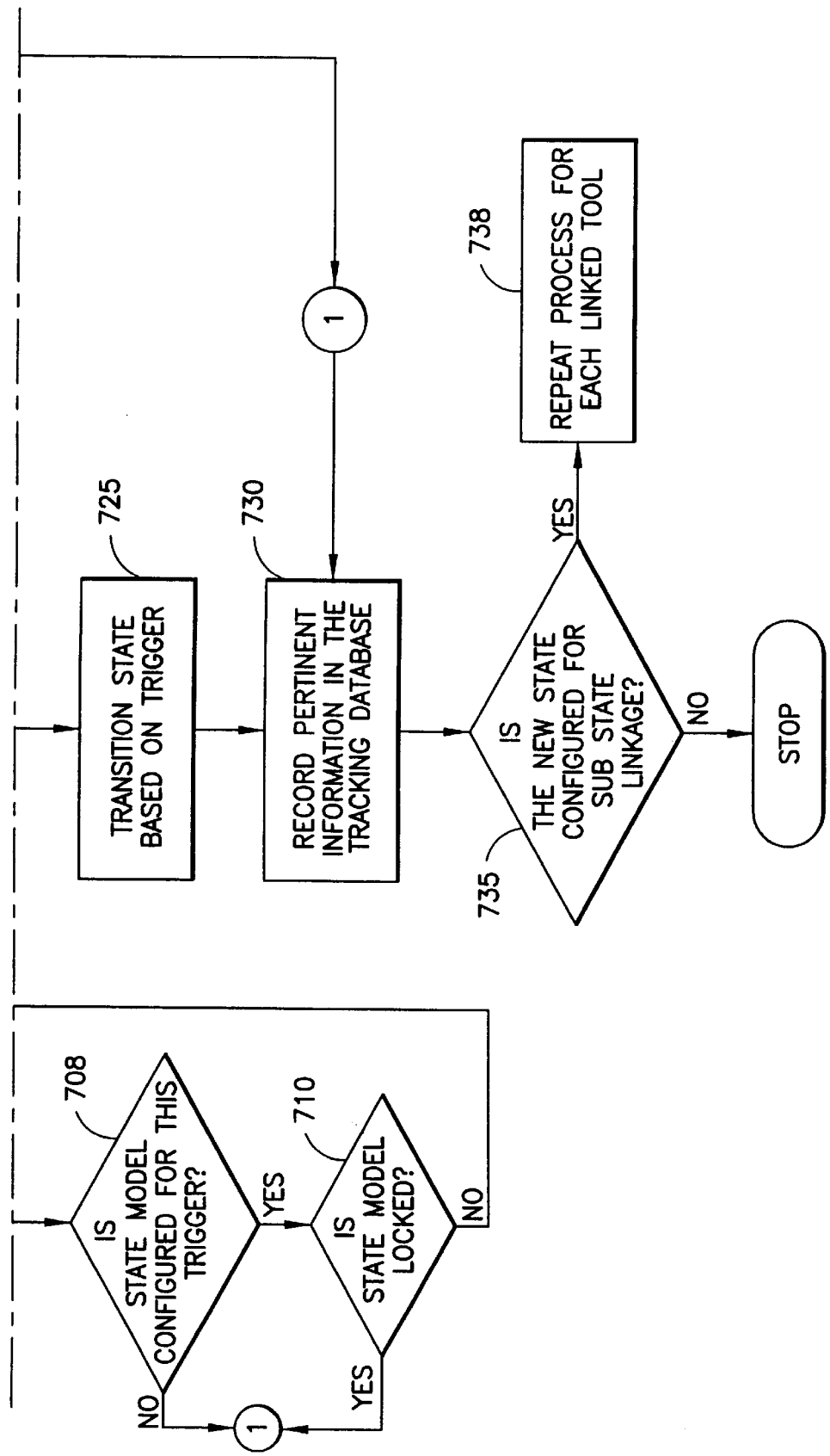

FIGS. 6A and 6B are diagrams illustrating a software logic flow for processing messages at the automated monitoring and assessment system 407 based upon the transition initiation type. As shown in FIGS. 6A and 6B, the automated monitoring and assessment system 407 first receives a message or other trigger event in step 601. In step 602, the software determines whether the transition initiation type is a "1", indicating an alarm ID. If so, then, in step 630, the alarm event ID (ALID) is processed. The alarm event ID is added to an alarm event ID table if new; otherwise, the state transition logic is looked up. If a trigger is mapped to the alarm event ID, then the process moves to step 660, wherein the trigger is processed using the state model logic (see FIGS. 7A and 7B and description hereinafter). After step 660 is complete, or if the trigger is not mapped to the alarm event ID, then the pertinent information is logged in the tracking database 430 and the processing of the message is complete.

If the transition initiation type is not a "1", then the software then determines whether the transition initiation type is a "2", as indicated by step 605. If the transition initiation type is a "2", indicating a collection event ID (CEID), then the process moves to step 650, whereupon the event is processed. The collection event ID is added to a collection event ID table if new; otherwise, the state transition logic is looked up. If a trigger is mapped to the collection event ID, then the process moves to step 660, wherein the trigger is processed using the state model logic. After step 660 is complete, or if the trigger is not mapped to the collection event ID, then the pertinent information is logged in the tracking database 430 and the processing of the message is complete.

If the transition initiation type is not a "2", then the software then determines whether the transition initiation type is a "3", as indicated by step 608. If so, a system variable ID (SVID) type is indicated, and the process moves to step 640, whereupon the system variable ID is processed. The system variable ID is added to a variable ID table if new; otherwise, the state transition logic is looked up. If a trigger is mapped to the system variable ID, then the process moves to step 660, wherein the trigger is processed using the state model logic. After step 660 is complete, or if the trigger is not mapped to the system variable ID, then the pertinent information is logged in the tracking database 430 and the processing of the message is complete.

If the transition initiation type is neither "1", "2" nor "3", then the software determines whether the message contains a trigger. If so, the trigger is processed using the state model logic. If not, the message is checked for an alarm ID, then an event ID, and then a variable ID, in steps 612, 615 and 617, respectively. If any of those IDs are found, processing is similar to described above based upon the transition initiation type. If there is no trigger, transition initiation ID, nor actual ALID, DEIC or SVID, then no information is logged into the tracking database 430, but a message is preferably posted to the audit trail.

Referring to FIG. 4, an example of operation of the system 400 in response to a transition initiation type code is as follows. Assume a trigger message having the following characteristics and information is received:

Tool=3
Recipe="Process abc"
LotID="Lot 123"
Text_1="IC_36_2003"
Float_1=22
Transition Initiation Type=2
Trigger=15
ALID=2312
Alarm Text="Pressure Alarm"
CEID=4530045
Event Text="Pressure Alarm Event"
SVID=3450220
SVID Number=345.2
SVID ASCII=" "

Initially, the automated monitoring and assessment system preferably evaluates the value of the transition initiation type of the above trigger message. Since, in this example, the value is "2", the transition initiation type is identified as a CEID initiation type. The automated monitoring and assessment system then preferably looks up the CEID in a CEID table. If it is not found, the automated monitoring and assessment system adds the CEID to the CEID table. If the CEID does exist in the table, the automated monitoring and assessment system looks up the mapped trigger from the CEID table. If no trigger is found, the automated monitoring and assessment system logs all of the message parameters in the tracking database 430 without a state change. (In such a case, the trigger number field may be left blank, since no trigger was mapped to the CIED and the trigger is ignored as a result of the initiation type being CEID). If a trigger is mapped to the CEID in the CEID table, the automated monitoring and assessment system may forward the trigger to the state transition logic, which then acts upon the trigger.

FIGS. 6A and 6B are diagrams illustrating a software logic flow for processing messages at the automated monitoring and assessment system 407 based upon the transition initiation type. As shown in FIGS. 6A and 6B, the automated monitoring and assessment system 407 first receives a message or other trigger event in step 601. In step 602, the software determines whether the transition initiation type is a "1", indicating an alarm ID. If so, then, in step 630, the alarm event ID (ALID) is processed. The alarm event ID is added to an alarm event ID table if new; otherwise, the state transition logic is looked up. If a trigger is mapped to the alarm event ID, then the process moves to step 660, wherein the trigger is processed using the state model logic (see FIGS. 7A and 7B and description hereinafter). After step 660 is complete, or if the trigger is not mapped to the alarm event ID, then the pertinent information is logged in the tracking database 430 and the processing of the message is complete.

Certain trigger messages from the manufacturing execution system 402 may be set up to cause a delayed transition between states in a tool's state table logic, by modifying a tool's external state(s). For example, a No Operator or No Product trigger message from the manufacturing execution system 402 may cause a delayed transition. As an illustration of this operation, assume a semiconductor fabrication tool 415 is processing wafers in the Productive state. The manufacturing execution system 402 (or manufacturing execution system) sends a No Product trigger message for the tool 415. The automated monitoring and assessment system does not transition to a Standby state until the tool 415 has completed processing. However, the tool's external state is modified to reflect the fact that there is no further product. When the tool 415 eventually finishes processing at a later time, the tool 415 will transition to a Standby/No Product state instead of a Standby/Idle state, due to the effect of the No Product trigger previously received. In step 703, the automated monitoring and assessment system sets external states that are keyed to the particular trigger that has been received.

In a next step 705, the automated monitoring and assessment system 407 performs trigger logic to lock or unlock a specified tool state, if appropriate. Any state in the state logic table may be locked, such that it is not affected by triggers. The only way to transition to a new state from a locked state is through the user interface of the automated monitoring and assessment system 407, until the current state becomes unlocked. Locking a state may be useful for Unscheduled Down states that may receive process start and stop triggers as maintenance personnel attempt to fix, reprogram or otherwise interact with equipment. Automatic unlocking of a tool state is possible through a trigger message, and is carried out, as shown in FIG. 7, in step 705 if such a message is received.

In a next step 708, the automated monitoring and assessment system determines whether the state logic table for the particular semiconductor fabrication tool 415 which is the subject of the received message is configured for the particular type of trigger. If not, then the process 700 branches to step 730, whereupon the pertinent information relating to the message is stored in the tracking database 430. Otherwise, the process 700 continues to step 710, whereupon the automated monitoring and assessment system determines whether the current state is locked. If so, then again the process 700 branches to step 730, whereupon the pertinent information relating to the message is stored in the tracking database 430.

If the current state is not locked, then the process 700 moves forward to step 715, in which the automated monitoring and assessment system determines whether or not the current state is configured for state branching based upon recipe (PPID) classification responses. If so, then in step 718 a state transition is carried out based upon the recipe (PPID) classification. Otherwise, in step 720 the automated monitoring and assessment system determines whether the current state is configured for state branching based upon the existence of external states. If so, then in step 723 a transition is carried out based upon the external state(s). Otherwise, in step 725 a state transition is carried out based upon the particular trigger.

In some cases, a trigger may initiate a transition from a sub-state causing the state model to return to the previous state. For example, an "Tool Alarm Cleared" trigger may transition the tool from an Unscheduled Down state back to a Production, Engineering or Standby state. The new state may depend upon what state the tool was in prior to the original trigger (e.g., "Tool Alarm") causing the state change to the Unscheduled Down state in the first place. If the state model calls for a transition to a previous state, then the previous state can be looked up from the tracking database 430 (based upon the tool ID), and the previous state will then be used as the new state.

In step 730, the pertinent information regarding the trigger and state transition are recorded in the tracking database 430 shown in FIG. 4, as previously described.

In step 735, the automated monitoring and assessment system determines whether the new state is configured for sub-state linkage, as in the case where a cluster tool has a main tool linked to individual modules, or has interlinked modules. Each processing module of a cluster tool is preferably processed with its own independent state model. Any part (i.e., module) of a cluster tool may interact with other tools based on its state model. As an illustration of the effect of this software structure, if a robot failure occurs on a cluster tool, each chamber (i.e., module) should transition to an appropriate Non-Productive state until the robot is repaired. This type of action is implemented through the logic in step 735, which checks for sub-state linkages when a trigger is received and acted upon. If the new state of the current tool is configured for sub-state linkage, then the process 700 (i.e., steps 703 et seq.) are repeated for each linked tool, as indicated by step 738. In some instances, this may lead to nested processing, where a first tool has a sub-state linkage to a second tool, which in turn has a sub-state linkage to a third tool. The automated monitoring and assessment system preferably prohibits a cross-referencing sub-state linkages between tools. That is, if a tool has already been processed according to the steps in process 700, then step 738 is blocked for that particular tool so that the processing will not be repeated for it.

If there are no sub-state linkages for the new state, or if all sub-state linkages have been processed, then the process 700 is complete.

Preferably, manual override of trigger properties is supported by the automated monitoring and assessment system 407, to allow, for example, maintenance personnel to adjust the "reason" for unscheduled down time when their investigation leads to discovery of the problem that caused the down time. Typically, a transition from any Unscheduled Down state to a Standby state is a manual action initiated by maintenance personnel or a system operator. The user is preferably allows to change the "reason" and "classification" recorded when the state model transitioned to an Unscheduled Down state. For example, a trigger message for "Flow Abort" may be classified as an "Interrupt" and may cause a transition to "Unscheduled Down Time (UDT)/Flow Problem." When the maintenance personnel transition back to "Productive (PRD)/Normal Production" they may change the classification of the original "Flow Abort" trigger from "Interrupt" to "Assist", if appropriate. Such a change may be made via the user interface of the automated monitoring and assessment system 407.

Preferably, the automated monitoring and assessment system also supports modifications to logged time in various states that are required due to scrap units and reworks that often occur during semiconductor fabrication. For the purposes of tracking performed by the automated monitoring and assessment system 407, any semiconductor fabrication tool 415 which is processing production material is assumed to be producing saleable product wafers when running Production states. However, some process steps may be reworked when a mistake occurs in the process. Rework information typically does not become available until after the actual processing, usually from an inspection step. The automated monitoring and assessment system 407 preferably allows a system operator, via the user interface, to subtract the production state credit when rework is required or product is scrapped. In some cases, the manufacturing execution system 402 may send trigger objects with log IDs, wafer IDs, wafer count, tool ID and recipe name associated with the scrap or rework material. The automated monitoring and assessment system 407 preferably records the rework or scrap material against the reported tool 415 and saves the data with the original run data. The tool 415 used to process the rework material may be given full production credit based on the assumption that the material will process correctly the second time.

Further details will now be described regarding various examples by which the state models for the various tools 415 can be developed and defined. In a preferred embodiment, a user interface is provided for the automated monitoring and assessment system 407 allowing a system operator or other personnel to view the current state model for each tool 415, and to modify it as desired. The user interface is preferably graphically oriented, and may include various graphical screen images displayed on a computer monitor connected directly or indirectly to the automated monitoring and assessment system 407. For example, users may access the state model information (with proper authorization and verification) via a web browser 441, 442, 443 or 445 or equivalent software interface program, over a computer network, which may be a local network or a wide-area network.

In certain embodiments, at least two different techniques for mapping state transitions are provided. First, the automated monitoring and assessment system 407 may be "hooked up" to the semiconductor fabrication system 400 and allowed to monitor messages transmitted among the tools 415, manufacturing execution system 402 and other system components for a certain period of time long enough to be representative of most or all of the states in which the tools 415 will be. Then, the user may review the trigger messages from the tracking database 430, via the user interface, and manually associate each type of trigger with a state transition for a particular tool 415. To facilitate this process, the automated monitoring and assessment system may pre-populate a trigger configuration screen (see, e.g., FIG. 12) listing the triggers received for the particular tool 415 during passive monitoring of the system, allowing the user to define associations between triggers and state changes based in part on the actual experience of the system 400. Alternatively, the user may directly, via the user interface, create associations between state transitions for the various tools 415 based on the various triggers, without the benefit of trigger data gathered by the automated monitoring and assessment system 407 during actual operation of the semiconductor fabrication system 400. Default state transitions may, in either case, be defined according to the E58 Standard, and in particular, section 8.2 thereof.

Figure 9:
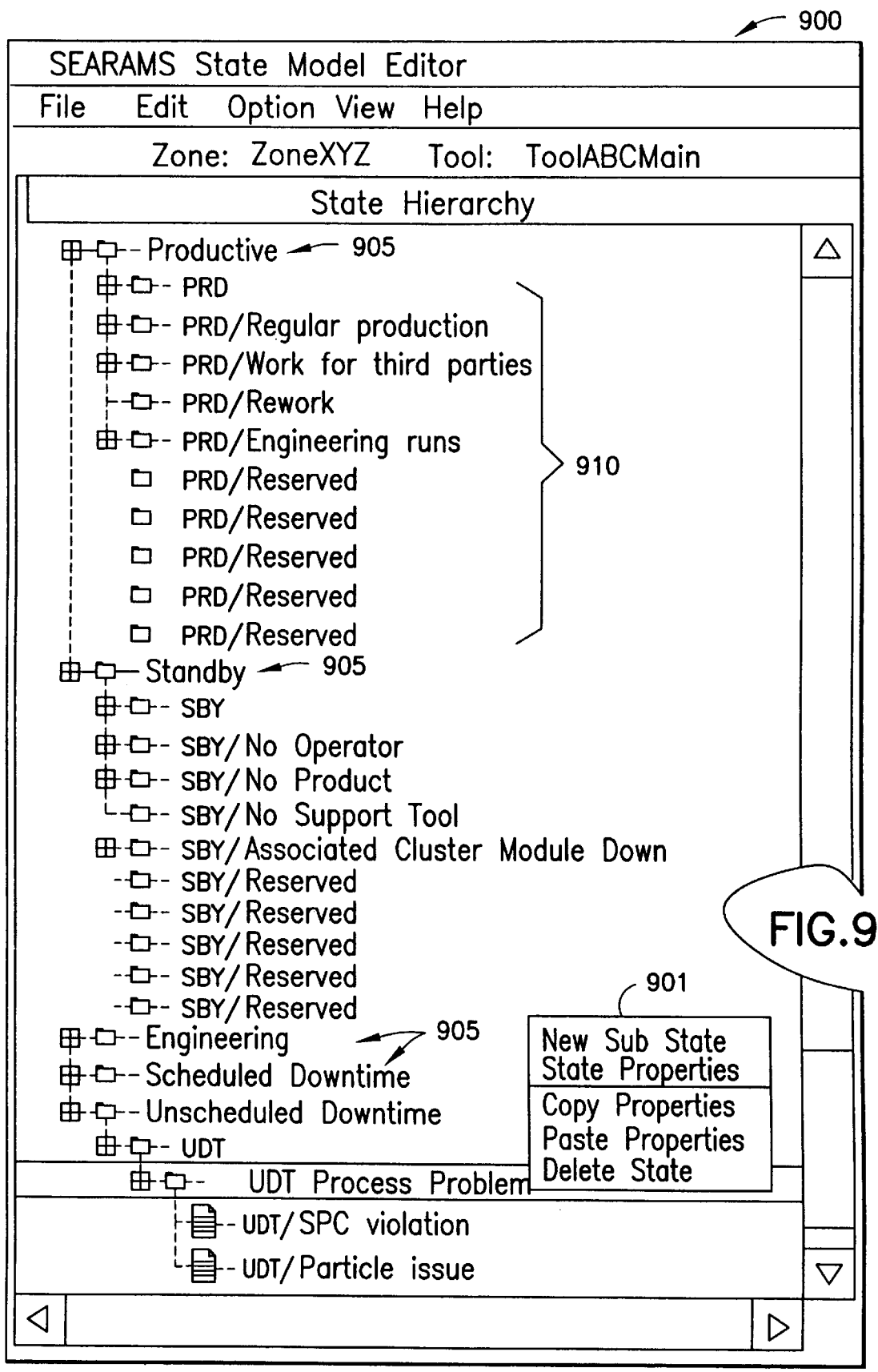
FIG. 9 is an example of one embodiment of a screen display illustrating a hierarchical state model structure for an automated monitoring and assessment system.

FIG. 9 illustrates an example of a screen image which may be displayed to a user for editing an existing state model for a particular tool 415. In the example shown in FIG. 9, the tool is identified as "ToolABCMain" in zone "ZoneXYZ". As suggested by the zone identifier in FIG. 9, tools 415 may be grouped into different zones for organizational and reporting purposes. User-defined zones may or may not be based on structural features of the actual semiconductor fabrication system 400. As further illustrated in the example of FIG. 9, the user may initially be presented with a list of the default states as specified by the E10 and/or E58 Standards, including the Productive state (and its sub-states), Standby state (and its sub-states), Engineering state, Scheduled Downtime state, Unscheduled Downtime state (and its sub-states), and NonScheduled state. The user may select any of the displayed states by any standard data entry means—for example, by highlighting and/or clicking on a state using a computer mouse. Sub-states for a given state, at each level of the hierarchy, may be expanded out for viewing by selecting (e.g., clicking on) the "+" symbol next to the state. Conversely, sub-states for a given state may be retracted (i.e., hidden) by selecting the "−" symbol next to the state, which is only possible when the sub-states have been expanded out. If no sub-states exist for a given state, then no "+" or "−" symbol will appear next to the state.

At the top of the state model editor screen shown in FIG. 9, the user is presented with several drop-down menus, including a File menu, Edit menu, Options menu, View menu and Help menu. The File menu includes open, save, reload and print options to the user. Each opened "file" pertains to a particular tool state model definition. Preferably, the top-level state names and second-level state names are pre-defined according to the E58 Standard, and are not subject to editing by the user (and thus may be referred to as "protected states"). However, currently "reserved" states under the E58 Standard may be subject to change and therefore, in certain applications, it may be desirable to allow editing by the user of the top-level and/or second-level state names, or at least the currently reserved top-level and/or second-level state names.

The user is preferably provided with the capability of adding a new state by selecting a state and invoking a pop-up (or drop-down) menu 910 for the selected state (e.g., by right-clicking a highlighted state with the computer mouse). The pop-up menu 901 may provide options to the user of, for example, adding a new sub-state to the currently selected state, editing the name or an existing state or updating any state property information, copying state properties from the currently selected state (i.e., to a clip board), pasting state properties to the currently selected state (i.e., from the clip board), and deleting a state. When selecting a name for a state, a pre-fix comprising the higher-level state names (e.g., "SBY/" or "SBY/No Product") is automatically added to the newly selected name. When pasting state properties, the state name of the selected state is not overwritten, but all the other state properties are. The state properties for the top-level states 905 preferably may not be set, since they act as grouping mechanisms but cannot be entered without actually entering one of their defined sub-states.

Figures 2, 10A:
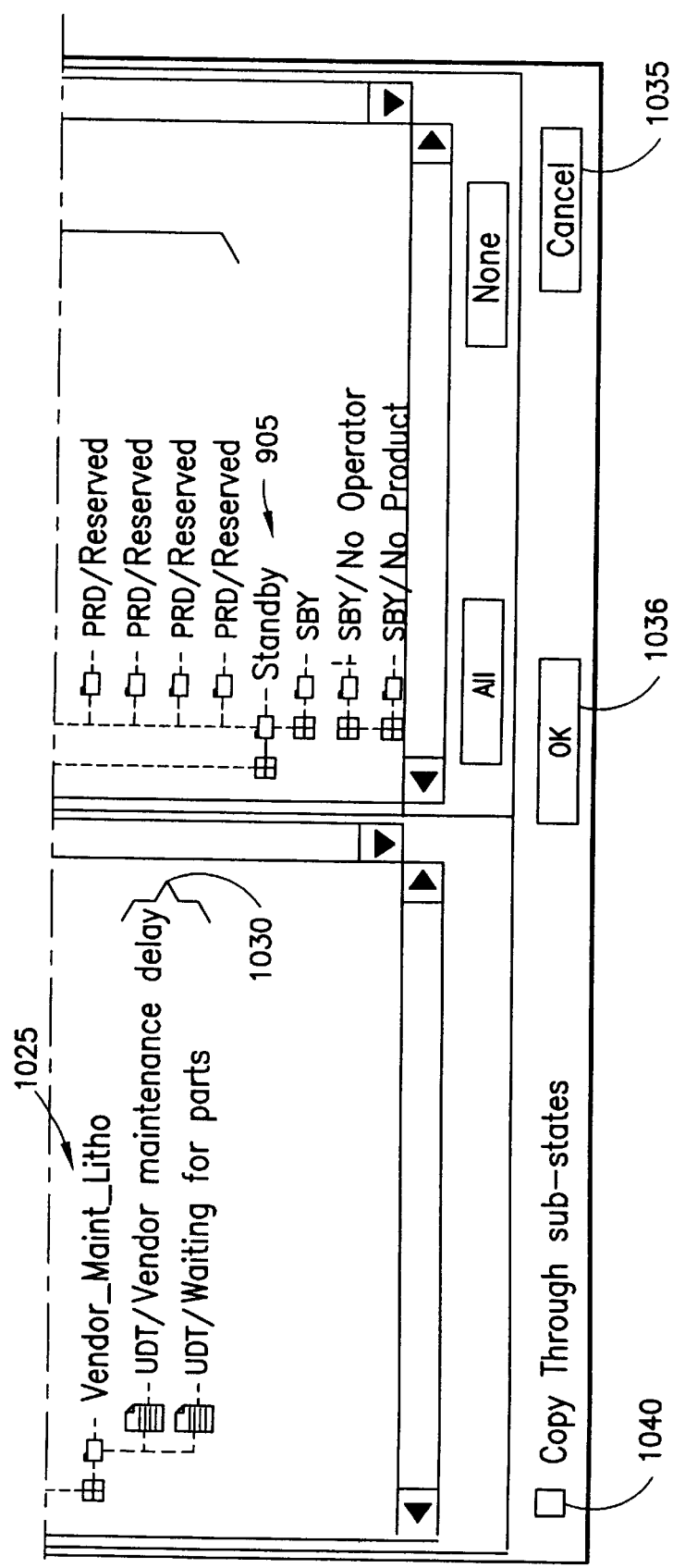

FIGS. 10A-1 and 10A-2 are diagrams of a state properties screen display 1002 as may be presented to a user who has selected a particular state to view its properties. In the example of the screen display 1002 shown in, FIGS. 10A-1 and 10A-2, the tool's zone, tool name and parent state may be displayed at the top of the screen, for convenience to the user. The state name may also be presented in a field box 1005, and be subject to editing by the user via the user interface. The state code 1013 (i.e., unique state ID) may also be displayed. A valid transition state indicator 1008 may be enabled or disabled. Setting the valid transition state indicator 1008 to "disabled" effectively removes the state from the state model without deleting it. The reserved states in the E58 Standard are examples of states that might be disabled. A state type property indicator 1009 allows users to define the state as a user (customer) defined state or a vendor defined state. The E58 Standard defines all states to be customer defined states where the third digit of the state ID (i.e. ##x#) is a number between 1 and 9. All states where the third digit is a letter (i.e., a . . . z or A . . . Z) are defined as vendor sub-states. The automated monitoring and assessment system preferably creates the numbering for the state ID of each state according to the E58 Standard and the user's choice of "vendor" or "customer" for the state type indicator 1009 on the state properties screen display 1002. Under the E58 Standard, the user is limited to nine third level customer-defined sub-states, since the third digit is limited to 1 to 9 for customer-defined sub-states. The possible selection of state type indicator 1009 as "customer" is preferably dimmed if there are no more customer-defined sub-states left (i.e., there are already nine sub-states defined)

The state properties screen display 1002 may have a number of tabs for convenience to the user, which collectively allow presentation of a manual transitions sub-screen (shown as item 1015 in FIG. 10A-1), an automatic transitions sub-screen (FIG. 10B), a cluster tool state linkage sub-screen (FIG. 10C), and a productivity sub-screen (FIG. 10D). The manual transitions sub-screen 1015 allows the user to enable some security and control features useful when manual alteration of tool states becomes necessary. The User Group sub-screen 1016 displays the Group Access levels 1025 whose users will be allowed to manually transition from the state (that is, the state being edited—in this example, state 50a1). The Valid Manual Transition States sub-screen 1017 displays a list of states 905, 910 not currently selected for an access group. The current transition states 1030 allowed for an access group 1025 are listed below the group 1025. The user may select (e.g. double click) a state 1030 to move the state from the list on the User Group sub-screen 1016 (back to the list on the Valid Manual Transition States sub-screen 1017. A group 1025 from the User Group sub-screen 1016) is preferably selected at all times (the top group may be selected by default), and only groups 1025 defined with access for the specific tool 415 are preferably displayed.

As with the state model editor screen display (FIG. 9), states displayed on the Valid Manual Transition States sub-screen 1017 may be expanded out by clicking on a "+" symbol next to the state, or the sub-states may be retracted by clicking on a "-" symbol next to the state. Multiple states may be selected by highlighting groups of states, and may be cut and pasted according to standard graphical interface techniques well known in the art. Thus, for example, multiple states 910 may be "clicked and dragged" from the Valid Manual Transition States sub-screen 1017 to one or more groups 1025 appearing on the User Group sub-screen 1016.

Figures 1, 2, 10B:
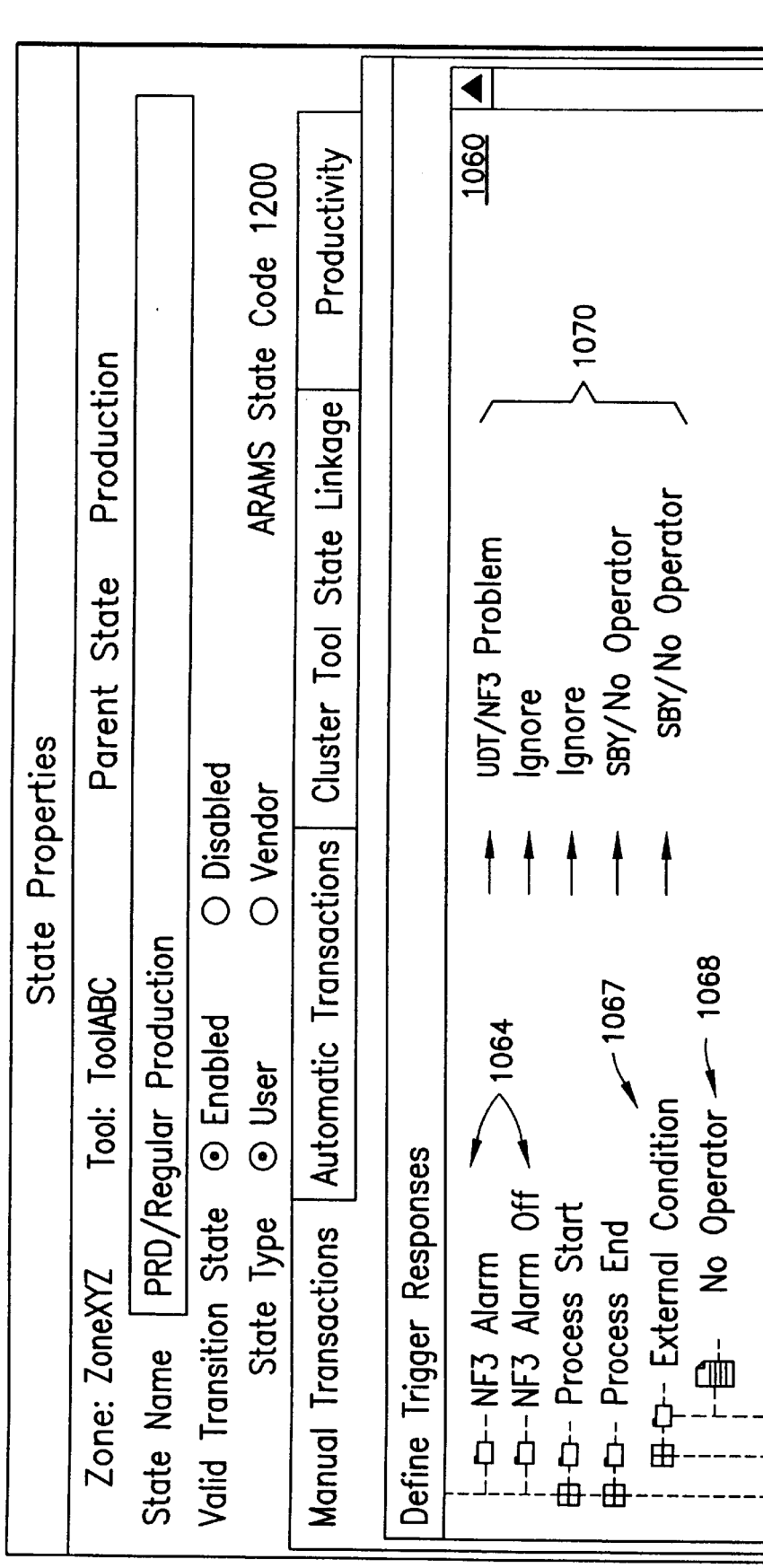
Figures 2, 10B:
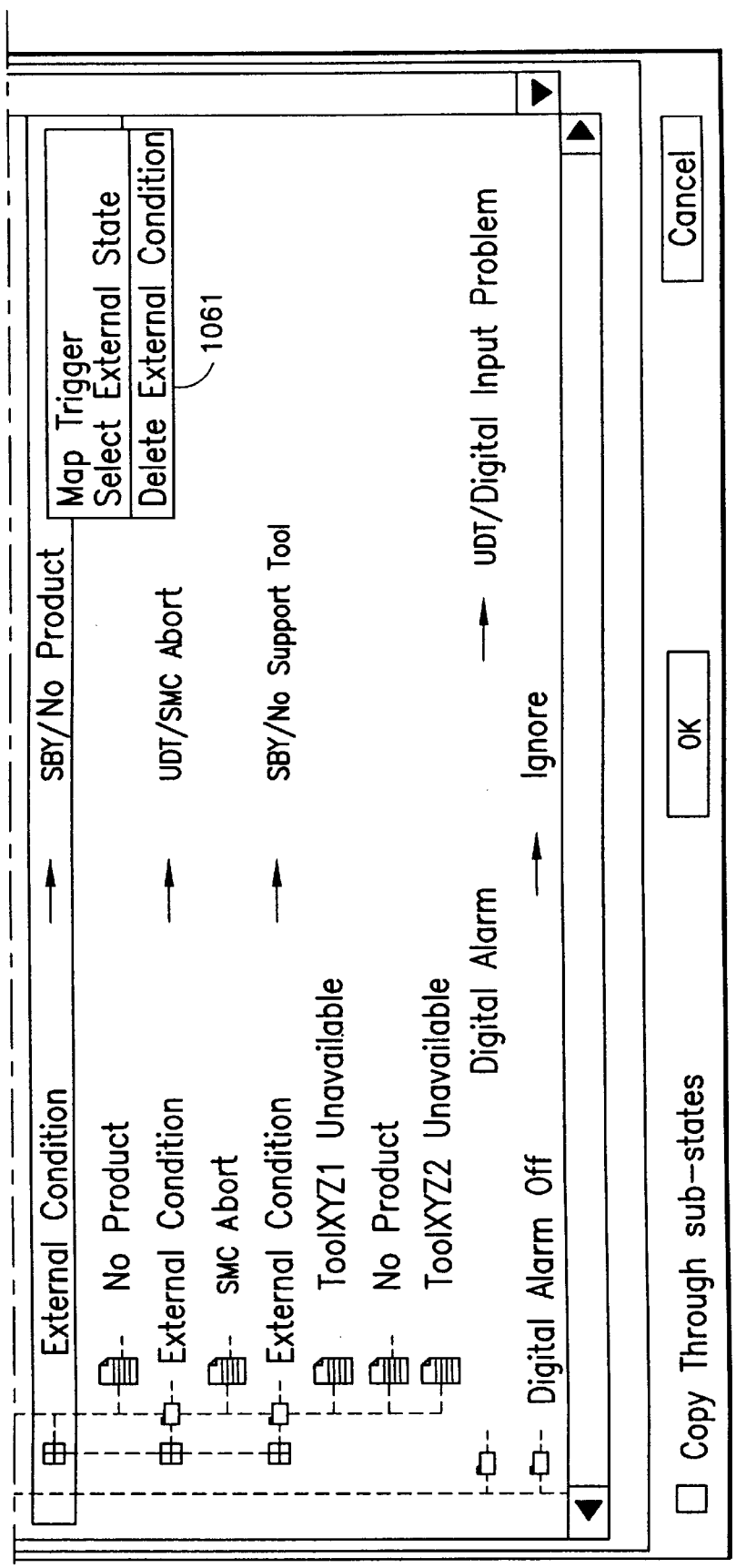

FIGS. 10B-1 and 10B-2 depict an example of the state properties screen display with the Automatic Transitions tab 1041 selected. The automatic transitions sub-screen 1060 allows a user to add or delete relationships between triggers (or symptoms) 1064 and state transitions (which may be selected as some or all of the trigger responses 1070) in the state model for the particular tool 415. Default automatic transitions may be overridden, if desired, via the Automatic Transitions sub-screen 1060. One or more external conditions 1067 may be associated with various triggers 1064, allowing different state branches depending upon the nature of the external condition. Each external condition 1067 preferably has an associated descriptor 1068 which may be displayed beneath it. External conditions (states) may be added or deleted via a pop-up menu. 1061, for example. Note that deleting an external state does not affect the state model. A map trigger selection in the pop-up menu 1061 allows the user to define a trigger response 1070 (which may or may not be in the form of a state transition) for the particular selected trigger 1064 and/or external condition 1067. Group selection capabilities may be provided in a triggers list to allow the users to quickly select many triggers and copy them over to or delete them from the Automatic Transitions sub-screen 1060. The user can also override the action for all triggers at once by selecting a group of triggers.

A pop-up menu (not shown) for any selected trigger 1064 may be brought up by, e.g., right-clicking with a computer mouse on the selected trigger 1064. The pop-up menu may include the following selection options: Enable PPID Class Responses; Enable Operator/Product Available; Add External State Responses; and Override Default Transition. The Enable PPID Class Responses and Enable Operator/Product Available options may be made mutually exclusive. Likewise, the Enabling PPID Class Responses option may be made mutually exclusive of the Adding External State Responses option, such that the user may set up one or the other or none, but not both. The Enable PPID Class Responses option expands the trigger responses to include one additional destination state selection for each defined PPID Classification. The Add External State Responses option allows the addition of external states, and the user may select this option multiple times to add more conditional transitions. The Override Default Transition option allows a user to select a new destination state when the selected trigger occurs in the current state.

Figure 11:
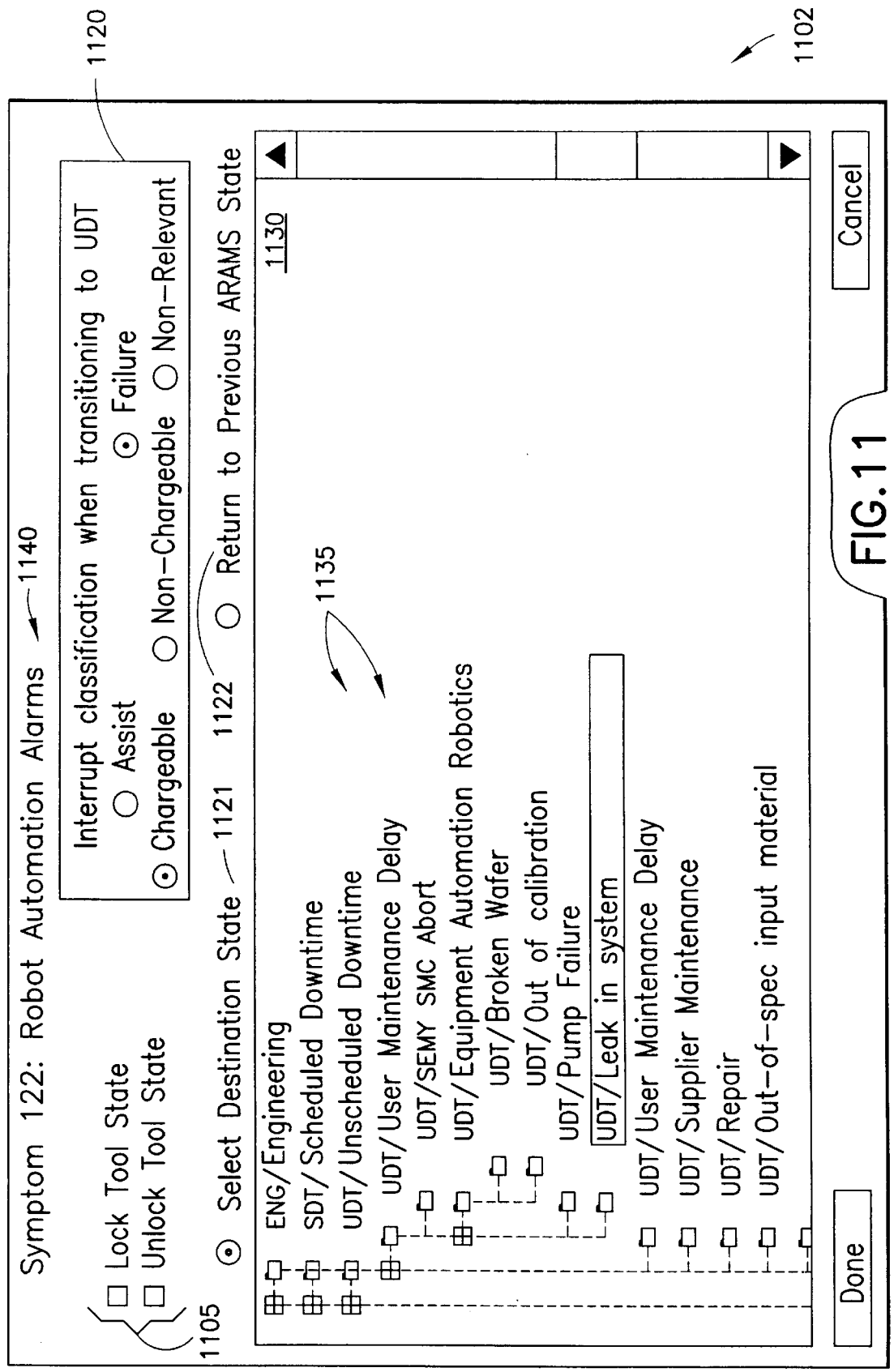
FIG. 11 depicts a pop-up menu as may be used for selecting various options in connection with the automatic transition sub-screen depicted in FIG. 10B.

A pop-up menu for a PPID Class may also be invoked (e.g., by right-clicking on a selected PPID Class). FIG. 11 depicts a pop-up menu 1102 as may be displayed for a selected PPID Class. The pop-up menu 1102 may display the particular trigger (i.e., symptom) type 1140, and provide selections 1105 for locking or unlocking the state. The pop-up menu 1102 may also provide various Interrupt classification options in an Interrupt Classification section 1120. The pop-up menu 1102 may also allow a choice between a Select Destination State option, by which a transition to one of the available states 1135 may be defined, or else a Return to Previous State option 1122. A "return to previous state" selection will cause the automated monitoring and assessment system to transition to the previous state the tool 415 was in (generally either Standby, Production or Engineering) when the specified trigger 1040 is received, so as to be compliant with the E58 Standard (particularly transitions 6, 8 and 15 thereof).

Figures 1, 10C:
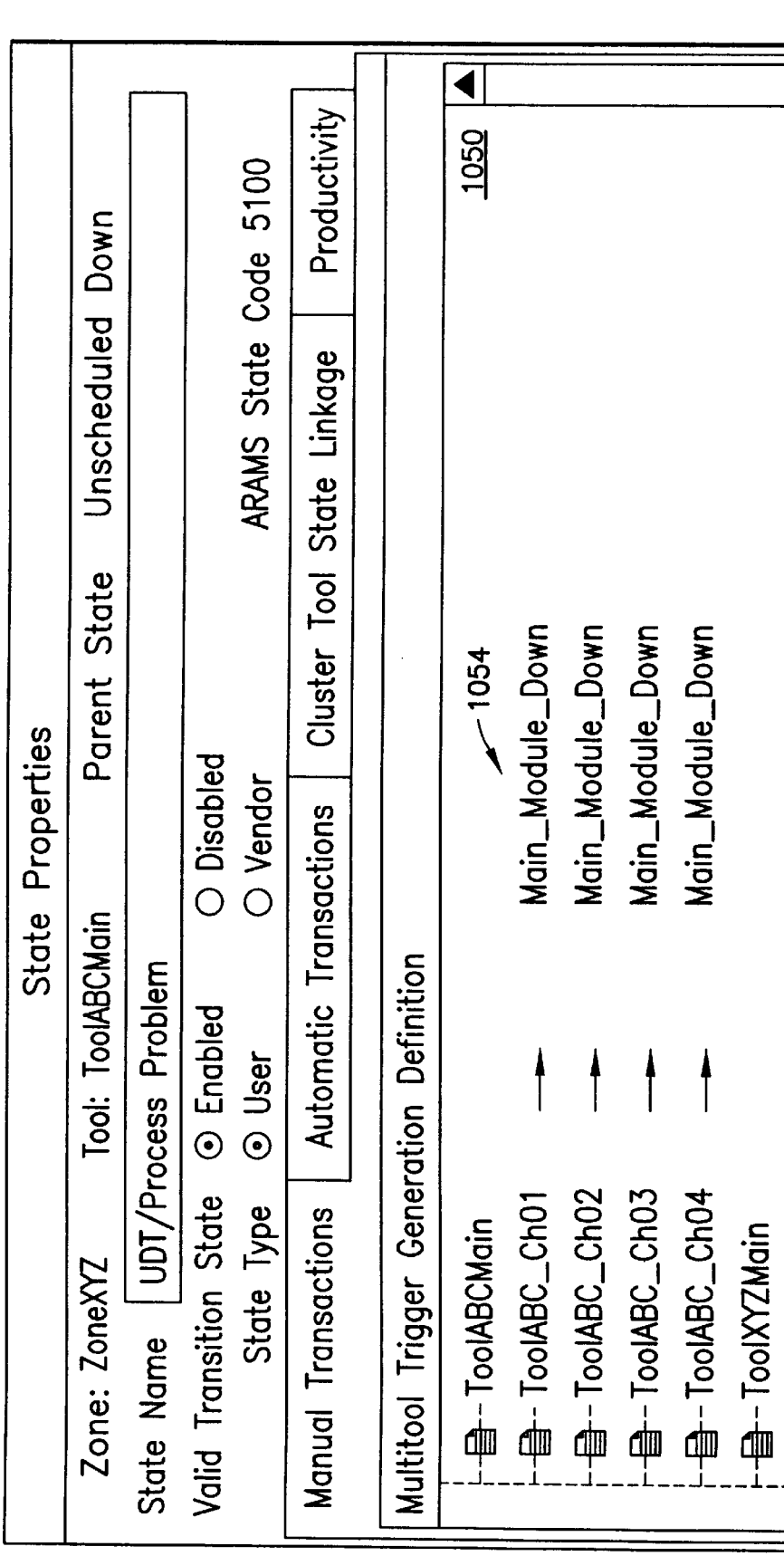
Figures 2, 10C:
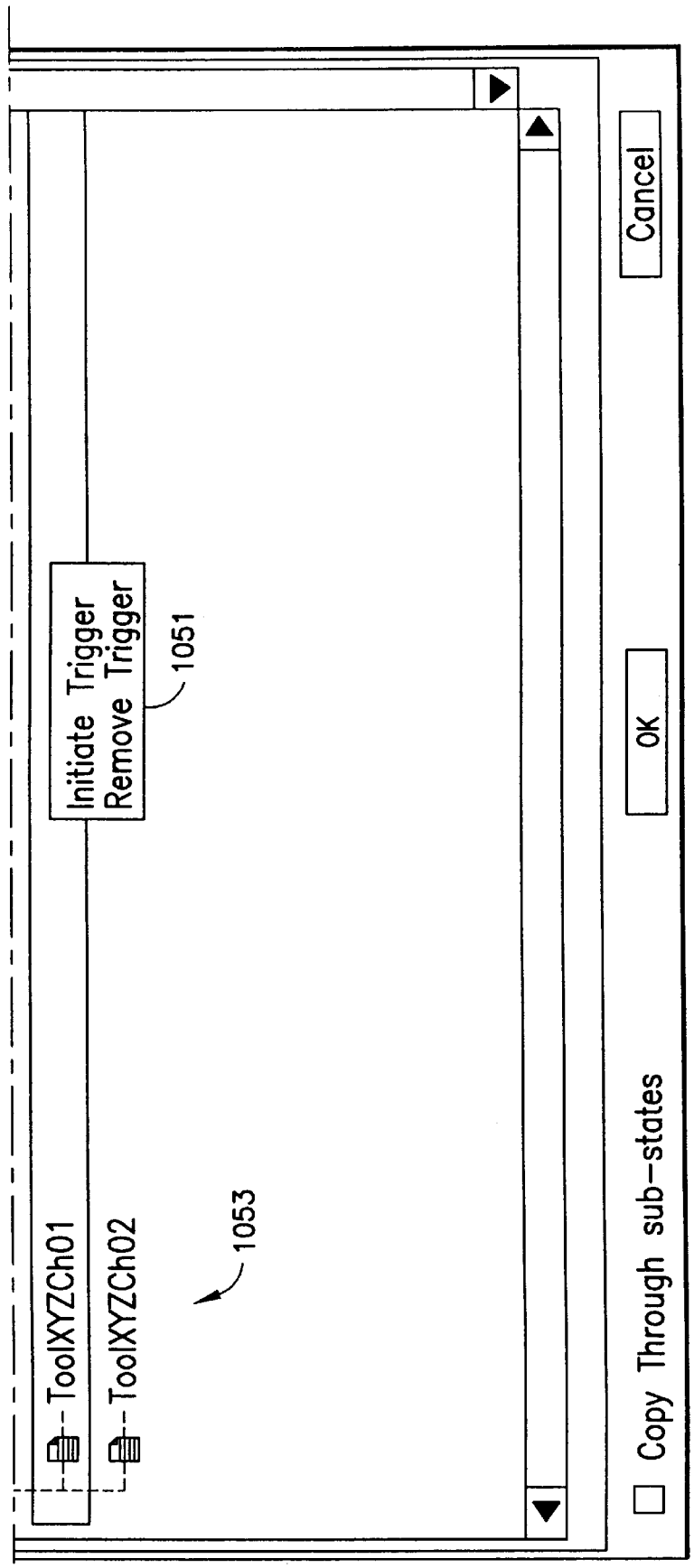

FIGS. 10C-1 and 10C-2 depict an example of the state properties screen display with the Cluster Tool State Linkage tab 1042 selected. The cluster tool state linkage sub-screen 1050 allows the change of a state for one tool to initiate a trigger for a different tool. When the tab 1042 is selected, the user is presented with a display of all tools 1053 in the system. The user can select the trigger 1054 that will be initiated for any of the tools 1053 in the system. In the present example, the trigger "Main_Module_Down" has been selected for the four chambers of cluster tool "Tool-ABCMain". The automated monitoring and assessment system automatically generates the selected trigger for each tool 1054 according to the relationships defined in the cluster tool state linkage sub-screen 1050 when the state (i.e., state 50a1 in this example) is entered during operation of the system. The state model for each tool 1053 will then control what transitions, if any, will occur in response to the selected triggers 1054.

An example of the usage of this functionality would be if a main tool (e.g., "ToolABCMain") has a fault that causes process interruptions to the robotics module. In such a case, using the linkage information appearing in the cluster tool state linkage sub-screen 1050, the sub tools ("ToolABC_Ch01", etc.) attached to the main tool will also transition to a fault state of some kind.

A pop-up menu 1051 may be invoked when a tool 1053 is selected to set a trigger for that tool 1053 when the current state is entered. A selection of possible triggers similar to that shown in FIG. 11 may be provided to the user, from which only a single one may be selected.

FIG. 10D depicts an example of the state properties screen display with the Productivity tab 1043 selected. If the current state whose state properties are being edited is a Productive state, then access is provided to the Productivity sub-screen 1080; otherwise, the Productivity tab 1043 is dimmed or otherwise unavailable. The Productivity sub-screen 1080 allows the user to enable productivity metrics for the current state. Certain default productivity metrics may be provided, but can be overwritten by the user. Examples of productivity metrics are illustrated in FIG. 10D.

The Copy Through Sub States option 1040 shown in each of FIGS. 10A, 10B, 10G and 10D effectively copies through all state properties except the state name to the various sub-states of the current state. Once the option 1040 is enabled (e.g., checked), any action the user takes thereafter will update the sub-states belonging to the current state. The actual update of the sub-states preferably takes place in real time. The user may, for example, turn on the Copy Through Sub States option 1040, make a change or two, and turn then it off to complete additional changes to the current state without affecting the sub states. This type of capability may be very useful when a new group (Palette) is added and the state models already exist. The user may add changes to all sub states of this state at one time for some properties but not others.

Selecting the Cancel button 1035 cancels all changes, including any changes made to the sub states with the Copy Through Sub States option 1040 being functional. The OK button 1036 saves the changes made.

Figure 12:
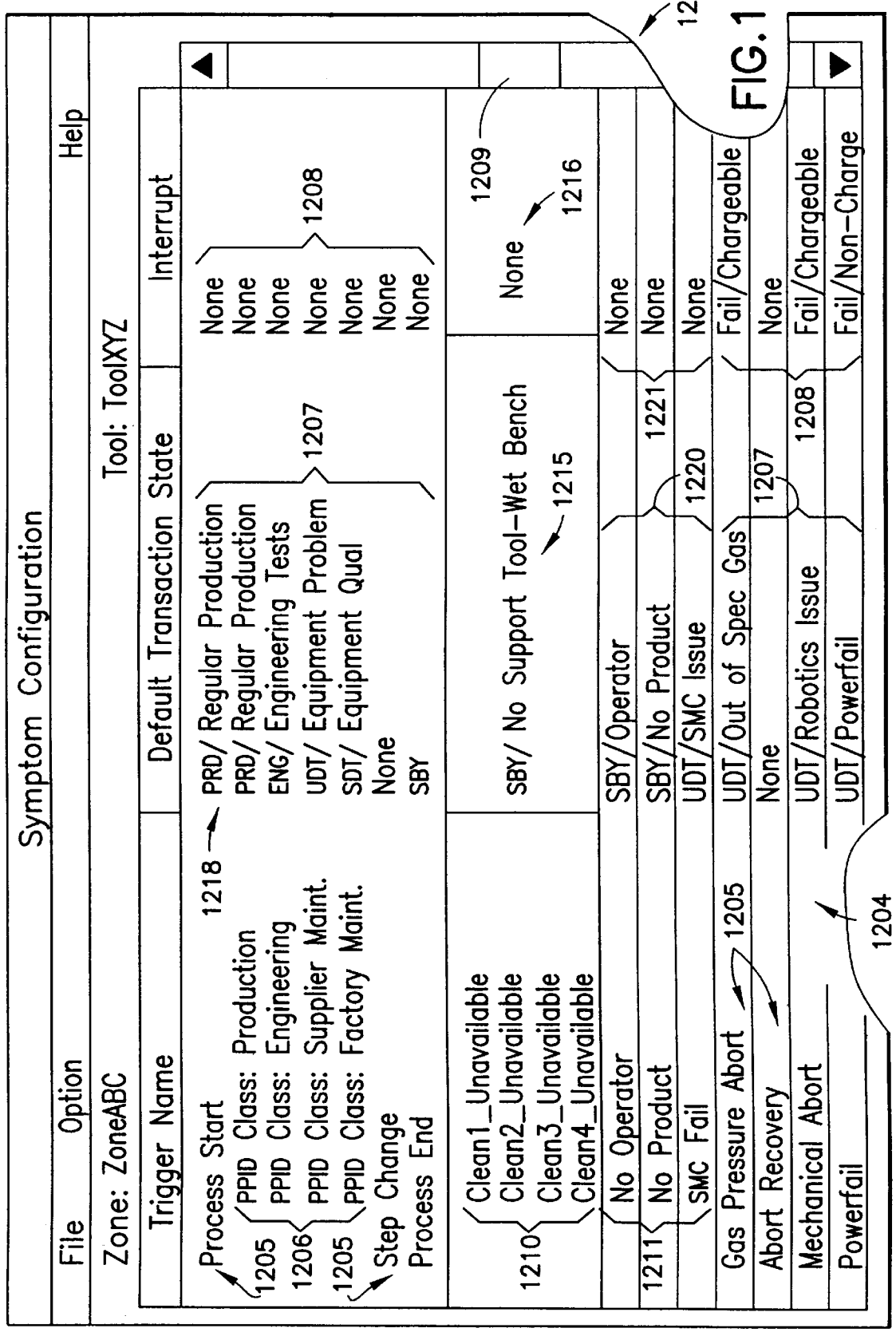
FIG. 12 is an example of one embodiment of a trigger (i.e., symptom) configuration screen display as may be presented to a user via a user interface for associating triggers with default transition states and interrupts for a particular tool.

FIG. 12 shows an example of a trigger (i.e., symptom) configuration screen display 1201 as may be presented to a user via the user interface for associating triggers with default transition states and interrupts for a particular tool 415. Preferably, the zone 1202 and tool name 1203 are displayed in a visible location on the trigger configuration screen display 1201. In a trigger configuration sub-screen 1204, a list of triggers 1205 for a particular tool 415 and the triggers' associated transition states 1207 and interrupts 1208 are, initially, defined by the user or, if already defined, presented to the user for editing or modification. Examples of triggers 1205 are shown in FIG. 12 as, e.g., Process Start, Step Change, Process End, Gas Pressure Abort, Abort Recovery, Mechanical Abort, and Powerfail. A scroll bar 1209 may be used to navigate through further triggers 1205 which will not fit on the viewable part of the trigger configuration sub-screen 1204.

In some cases, various types of external conditions may be associated with the triggers 1205, leading to different possible branches to various transition states 1207. Examples of such associations are also shown in FIG. 12. Associated with the Process Start trigger are a number of PPID (i.e., recipe) classifications 1206. Thus, when the Process Start trigger is received for ToolXYZ, the next transition state depends upon the recipe classification 1206. If the recipe classification is Production, then the next transition state 1207 is "PRD/Regular Production." If, on the other hand, the recipe classification is Engineering, the next transition state 1207 is "ENG/Engineering Tests." The user may edit and change the transition states 1207 as desired, and may associate (or de-associate) recipe classifications 1206 with any triggers 1205 as desired. Preferably, the recipe classifications 1206 have a defined order of priority, such that the recipe classification 1206 with the highest priority is tested first and, if true, its designated branch to the next transition state 1207 occurs, but if false then the recipe classification 1206 with the second highest priority is tested, and so on. In one aspect, therefore, the recipe classifications 1206 comprise a prioritized list of branch conditions for the trigger 1205 (however, they need not be listed on the trigger configuration sub-screen 1204 in their defined order of priority). If none of the recipe classifications 1206 are satisfied, then the default transition state (in this example, "PRD/Regular Production" state 1218 associated with the Process Start trigger) is used as the next state.

In addition to adding recipe classifications 1206, the user may also associate various external states with a particular trigger 1205. An example is shown in FIG. 12 is shown with respect to the Process End trigger, which has external states 1210 and 1211 associated with it. Thus, for example, if the Process End trigger is received for ToolXYZ and the external state is set to No Operator, then the next transition state 1220 is "SBY/No Operator." However, if the external state is set to No Product, then the next transition state 1220 will be "SBY/No Product." The trigger configuration sub-screen 1204 provides a convenient means for requiring multiple external conditions to be satisfied. If several external states 1210 are grouped together in the same entry, as shown in FIG. 12, then each of the external states 1210 needs to be satisfied in order for the transition to occur. Thus, in the example illustrated in FIG. 12, each of the external states Clean1_Unavailable, Clean2_Unavailable, Clean3_Unavailable and Clean4_Unavailable would need to be satisfied (i.e., TRUE) in order for the transition to "SBY/No Support Tool—Wet Bench" state 1215 to occur. Effectively, grouping the external states 1210 together results in an ultimate conditional transition branch based upon a logical (i.e., Boolean) "AND" of the listed external states 1210.

Preferably, the external states 1210, 1211 have a defined order of priority, such that the external state (or group of external states) 1210 or 1211 with the highest priority is tested first and, if true, its designated branch to the next transition state 1215 or 1220 occurs, but if false then the external state (or group of external states) 1210 or 1211 with the second highest priority is tested, and so on. In one aspect, therefore, the external states 1210 and 1211 comprise a prioritized list of branch conditions for the trigger 1205, similar to the recipe classifications 1206 (however, as with the recipe classifications 1206, they need not be listed on the trigger configuration sub-screen 1204 in their defined order of priority). If multiple external states are associated as a group (such as external states 1210), then the group is evaluated according to the highest priority external state 1210 in the group. Since groupings of external states can be formed, the same external state may appear in more than one group. In such a case, the priority of the group depends still upon the highest priority external state therein, but if the same state is the highest priority in more than one group (therefore causing more than one group to have the same priority), the next highest priority external state is compared to determine which group has the highest priority, and so on until it is determined which group has the highest priority. If none of the external states 1210 or 1211 are satisfied, then the default transition state (in this example, "SBY" associated with the Process End trigger) is used as the next state.

Preferably, the same trigger 1205 cannot be associated with both recipe classifications (such as 1206) and external states (such as 1210 and 1211), because the number of permutations make the transition logic difficult. However, it is possible, with the addition of appropriate transition state logic, to support both recipe classifications and external states for the same trigger.

Figures 17, 17A:
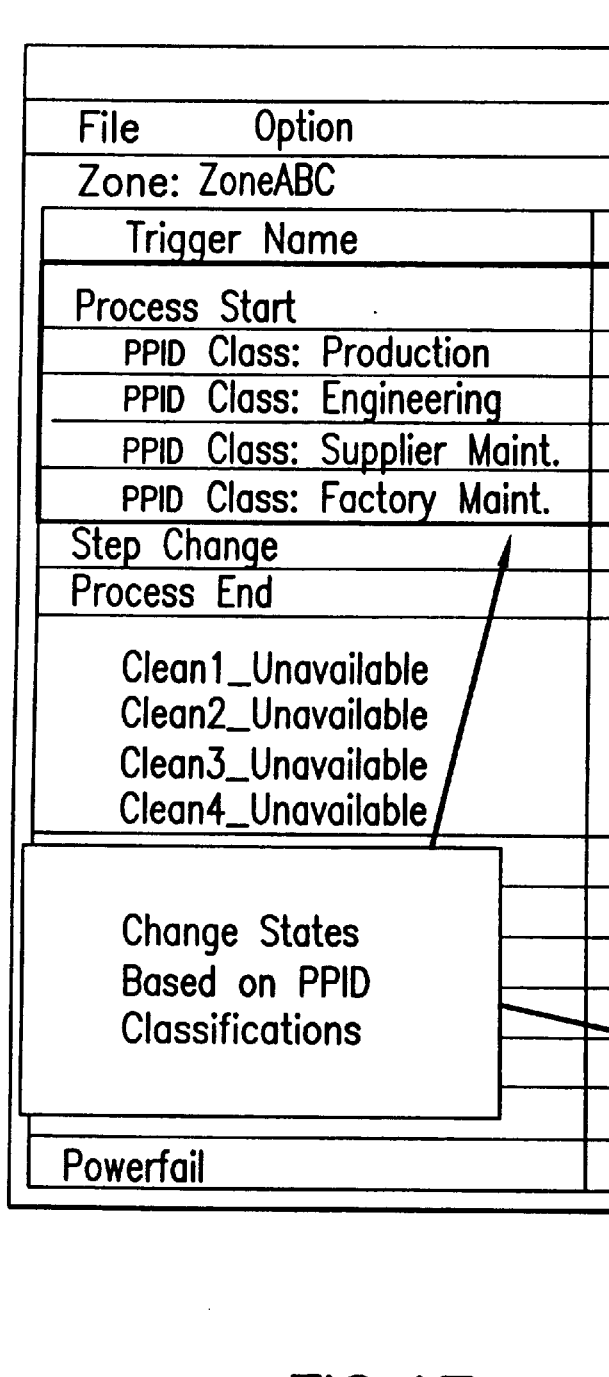
FIGS. 17a, 17b, 17c illustrate a relationship between data appearing on a trigger configuration screen (e.g., FIG. 12) and data appearing on a PPID Classification sub-screen.
Figure 17B:
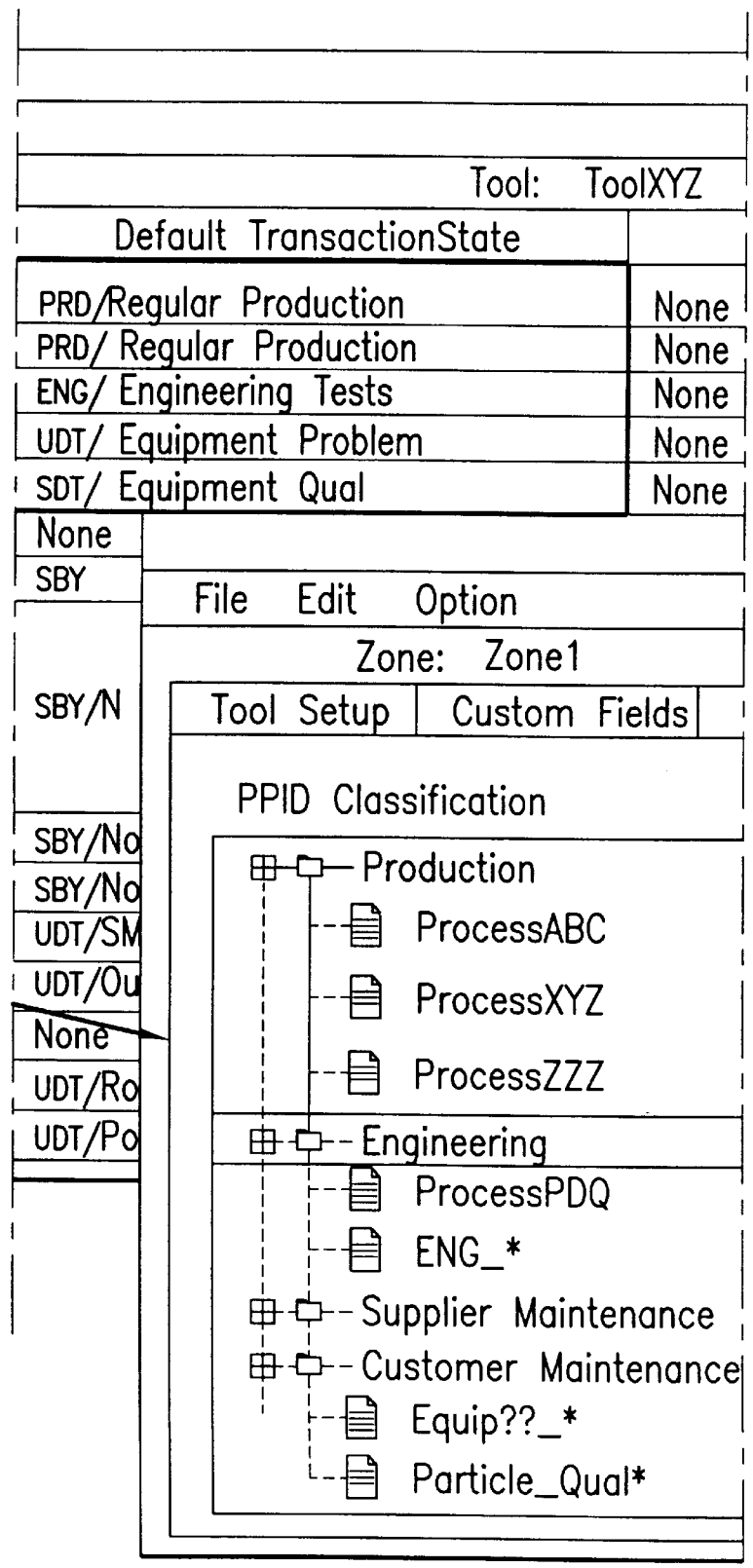
Figure 17C:
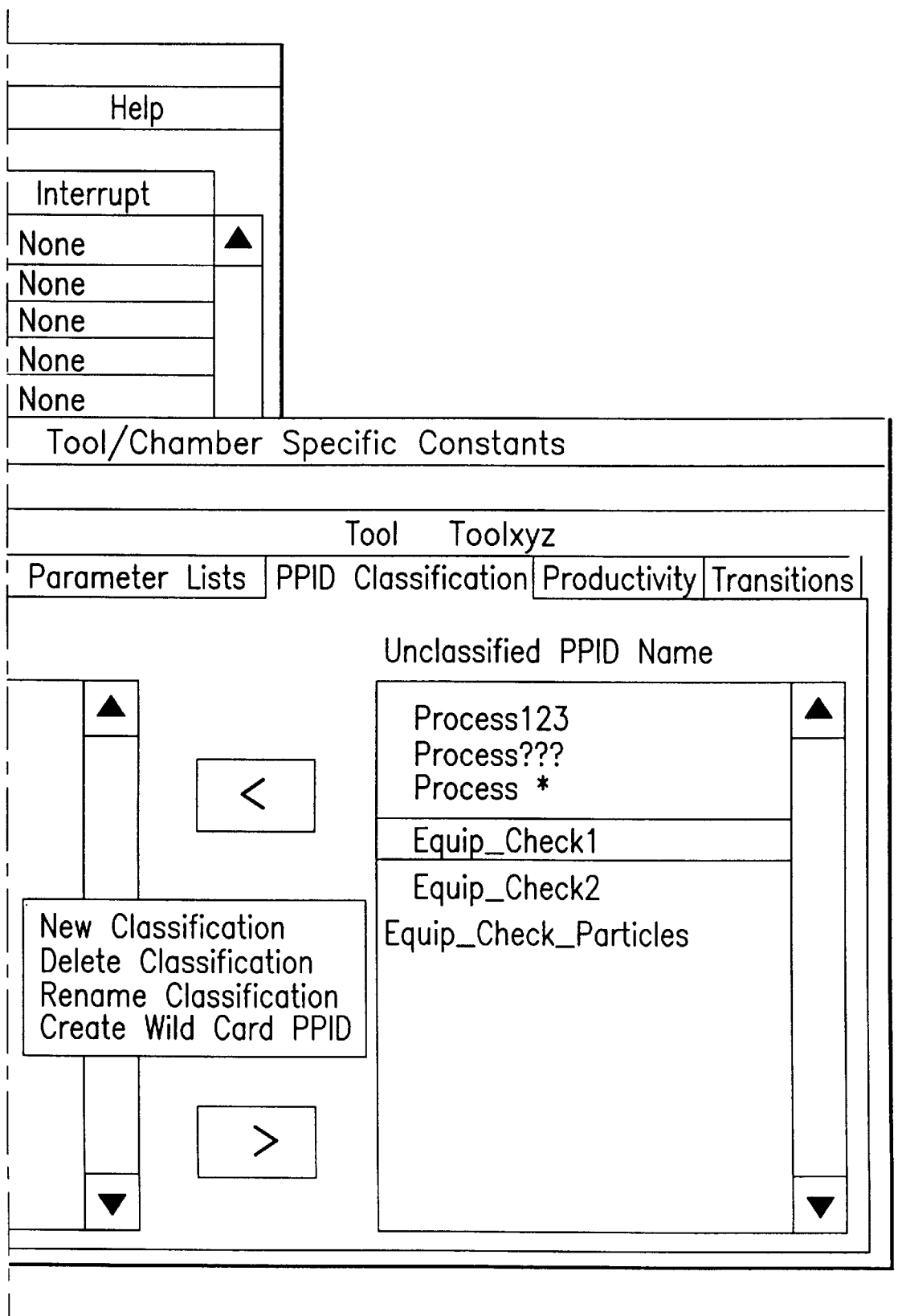

FIGS. 17*a*, 17*b* and 17*c* illustrate a relationship between data appearing on the trigger configuration screen 1201 and data appearing on a PPID Classification sub-screen, described hereinafter, while FIGS. 18*a* and 18*b* illustrate a relationship between data appearing on the trigger configuration screen 1201 and data appearing on an external state control sub-screen, also described hereinafter.

Figure 13A:
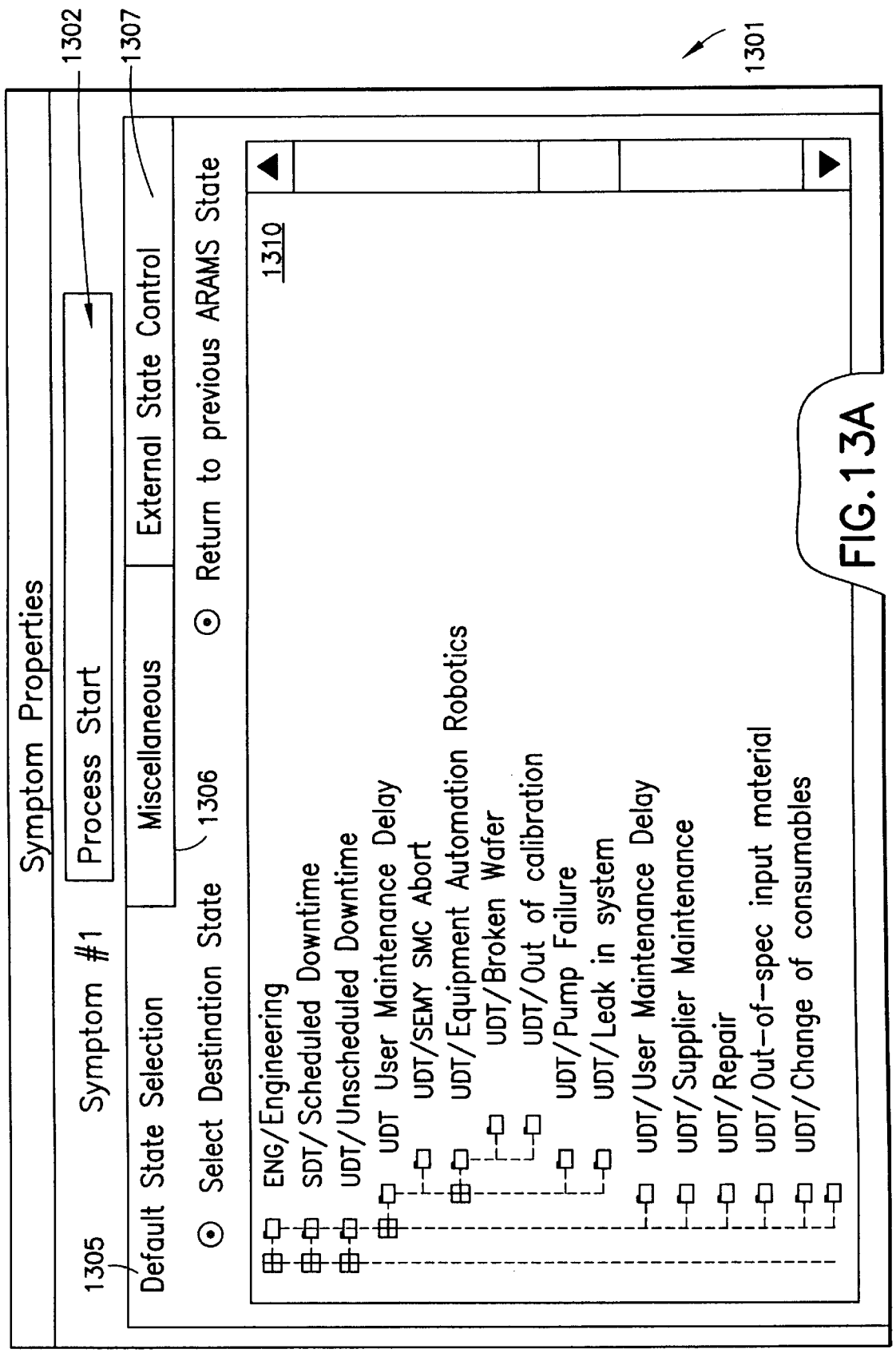
FIGS. 13A–13C are examples of one embodiment of a trigger (i.e., symptom) properties screen display with various tabs selected, as may be presented to a user for selecting properties for a particular trigger.

Using the File and Option menu selections appearing on the trigger configuration screen display 1201, the user is preferably permitted to select a new tool (by, e.g., searching through zones) or to save the current tool's trigger list to another tool. To facilitate configuration of triggers for a particular tool, the user interface preferably provides a trigger definition pop-up menu (not shown) which may be invoked by selecting or adding a trigger 1205 to the trigger configuration screen display 1201. The trigger definition pop-up menu may provide options for creating a new trigger, defining trigger properties, expanding the trigger responses to include an additional destination state selection for each defined PPID (recipe) classification, to add or group together external state responses, and to delete a trigger. The user interface preferably provides a Trigger Properties screen display (in the form of, e.g., a pop-up dialog window) when the option of defining trigger properties is selected by the user. FIG. 13A depicts an example of a trigger (i.e., symptom) properties screen display 1301 as may be presented to a user to adjust various trigger properties. The screen display 1301 includes a trigger (i.e., symptom) field 1302 which contains the textual name of the trigger. The screen display further includes several tabs which may be selected by the user, including a Default State Selection tab 1305, a Miscellaneous tab 1306, and an External State Control tab 1307. In FIG. 13A, the Default State Selection tab 1305 is selected, revealing the default state selection sub-screen 1310. The default state selection sub-screen 1310 may also be invoked by, e.g., clicking on a selected PPID Class 1206 on the trigger configuration screen display 1201. Likewise, an external state response pop-up screen (see FIG. 14) may be invoked by, e.g., clicking on a selected external state 1210 or 1211 on the trigger configuration screen display 1201.

From the Default State Selection tab 1305, the user may define the transition to occur when the trigger is received at run time for the particular tool. The user may choose either a single destination state, from the listing of states appearing on the default state selection sub-screen 1310, or else choose a return to the previous state. If a return to the previous state is selected, then at run-time when the trigger is received for this tool, its previous state in the state model will be the new state to which it will transition. The choice between one of the destination states from the default state selection sub-screen 1310 and returning to the previous state is mutually exclusive. The selection of "None" for the default state transition is allowed, in which case when the trigger is received at run time, no state transition will occur.

Figure 13B:
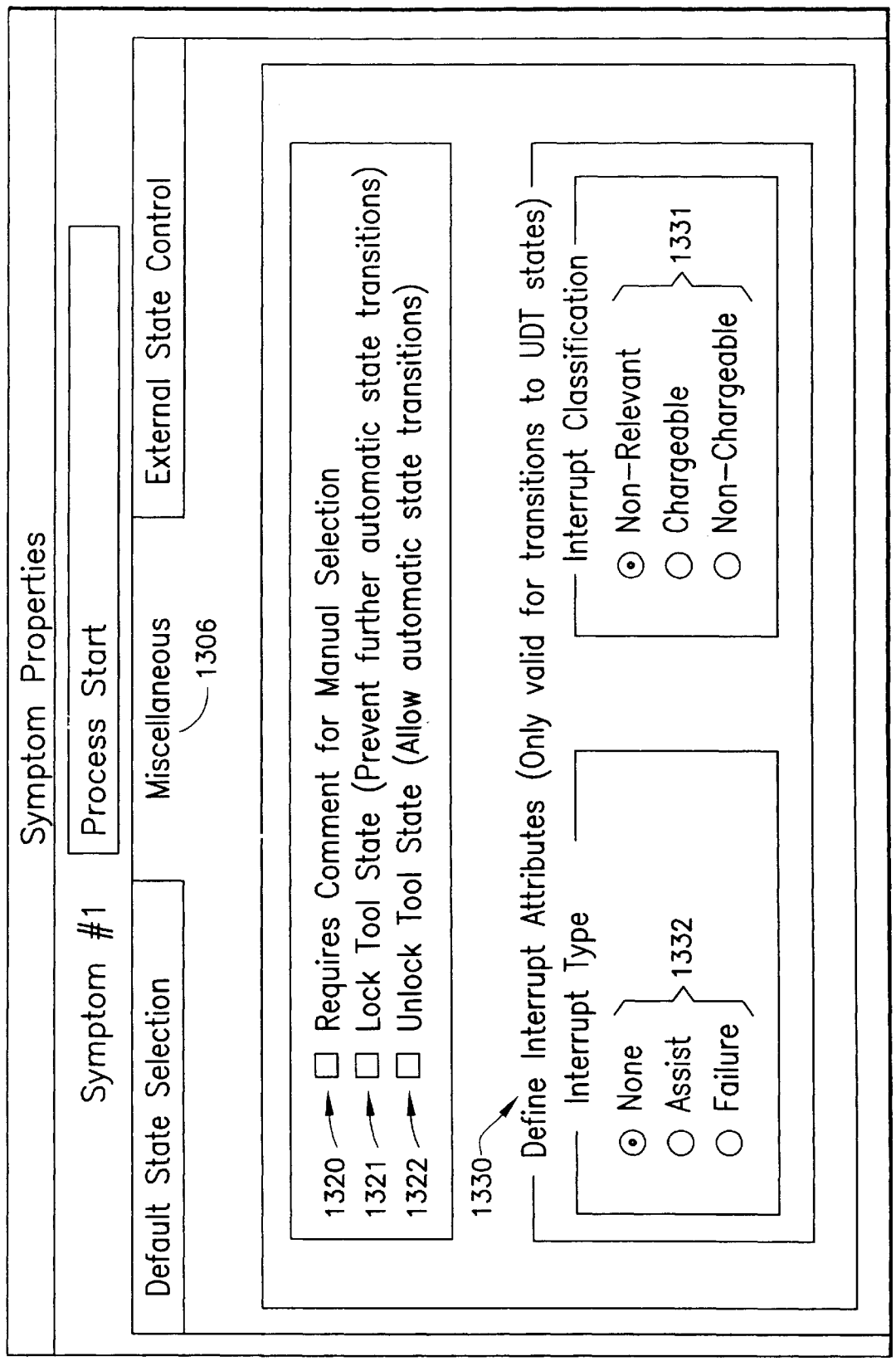

FIG. 13B depicts an example of the trigger (i.e., symptom) properties screen display with the Miscellaneous tab 1306 selected. The miscellaneous sub-screen allows definition of various properties associated with the trigger. Among these properties are those appearing on an Interrupt Attributes section 1330, including Interrupt Type 1332 and Interrupt Classification 1334. The Requires Comment option 1320 forces the user to input a comment when manually selecting this trigger during run-time. The Lock Tool State option 1321 transitions to the selected state and disables automatic transitions. This functionality may be useful when the manufacturing execution system 402 or tool 415 sends a trigger that is known to force some maintenance activity that will generate false triggers. The Unlock Tool State option 1322 overrides the user lock on a state. This functionality may be useful when the manufacturing execution system 402 or tool 415 sends a trigger to begin automatic state transitions after some maintenance activity. The state will unlock and the trigger transition will occur.

Each trigger may be associated with an optional interrupt type 1332 and classification 1334. By definition, when the tool state transitions to any Unscheduled Downtime (UDT) state from ENG, PRD or SBY, the equipment has failed. A specific symptom or trigger causing the transition to the UDT state defines the interrupt type 1332 and classification 1334. The user may choose between Assist and Failure for the type 1332 of interrupt. For the classification 1334, the user may choose between Chargeable, Non-chargeable and Non-relevant.

Figure 13C:
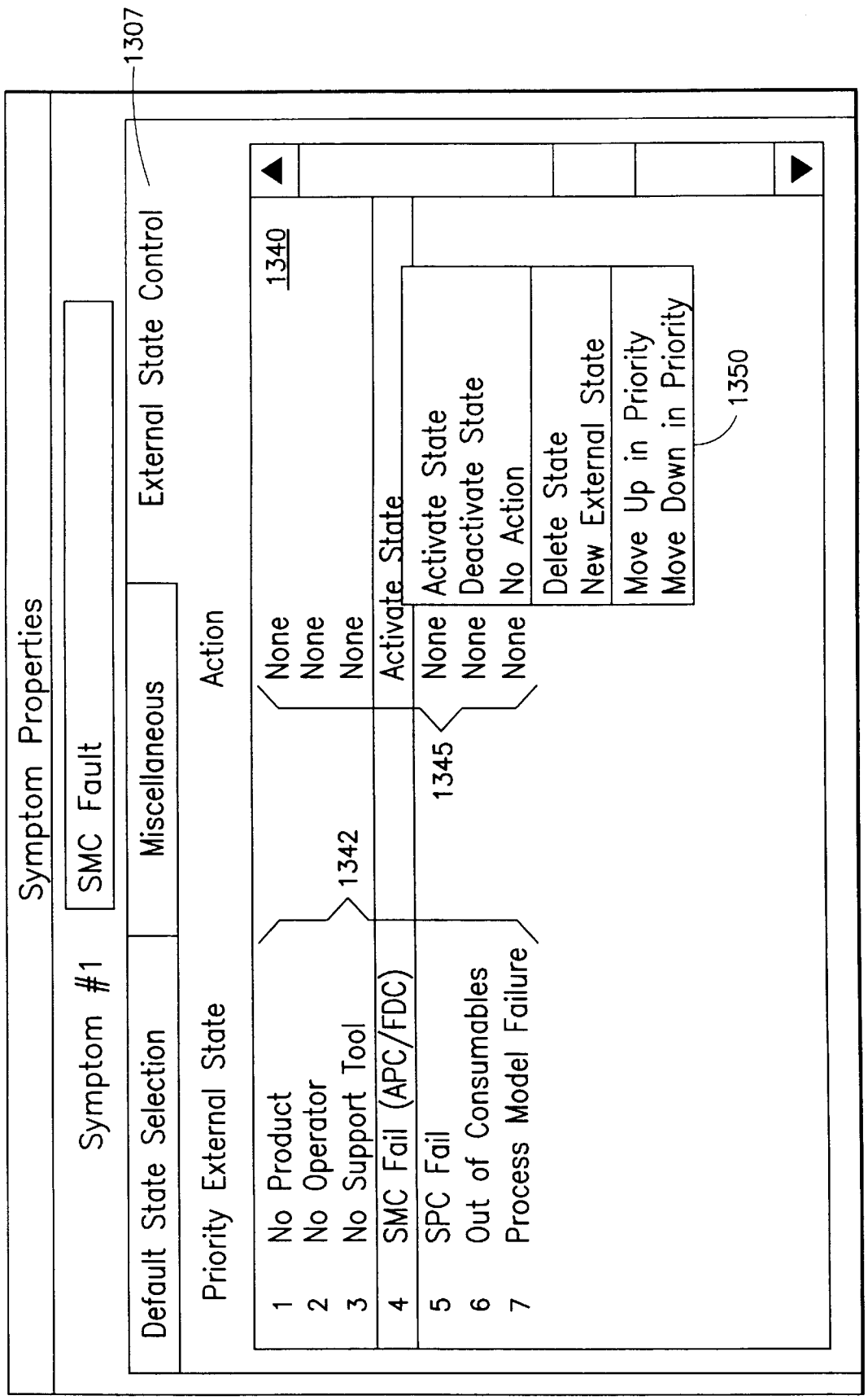

FIG. 13C depicts an example of the trigger (i.e., symptom) properties screen display with the External State Control tab 1307 selected. The external state control sub-screen 1340 allows the user to define additional action for the automated monitoring and assessment system to take when the trigger is received. Normally, the trigger may cause a state change for the tool 415; however, the trigger may also set an external state (such as No Operator, or No Product) with or without causing a state transition. Thus, external states may be viewed as events generated external to the process equipment that have an effect on the tool state model. The states are preferably defined for each tool 415 or chamber independently.

External states may be used to conditionally transition the tool state model from one state to another. For example, if a tool 415 is processing wafers and the automated monitoring and assessment system 407 receives a trigger that No Operator is available, the external state indicating No Operator may be set, but it will not have an effect on the tool state until the tool 415 completes processing. Once the tool's process is complete, an End Event trigger from the tool 415 can cause a state transition to "SBY" or to "SBY/No Operator" conditionally, depending on the external state of "No Operator". The existence of user-definable external states therefore provides a convenient mechanism for accurately tracking external impacts on tool performance and activity.

Examples of external states defined in the E58 Standard are No Operator, No Product and No Support tool. Each of these external states can have a negative impact on tool performance by stopping the flow of product to the tool 415, thus increasing the tool standby time.

The External State Control tab 1307 is used for several purposes. It allows the user to define a number of external states for each tool 415. It also allows a trigger or symptom to set an external state to Active or De-active. During run time, the tool state model preferably examines the status (Active or De-active) of each external state when the appropriate trigger is received, and conditionally transitions to new tool states based at least in part on the external states.

To facilitate tracking of the active/de-active status and priority of various external states, a fixed list of external state records (e.g., 20) per tool 415 may be maintained by the automated monitoring and assessment system. The user may set the priority and name of each external state. Once an external state has been defined, its place in the fixed list is preferably not changed regardless of what priority gets assigned to it, or how many other external states get defined, changed or deleted. The status (represented as an active flag) of each of the external states may be stored by index number, as opposed to priority number, to keep the data consistent over time if and when users modify the external states.

It is possible for a trigger both to set the value of one or more external states and also cause tool state transitions. If the user defines both actions, the automated monitoring and assessment system preferably sets the external states prior to performing the tool state change logic.

Figure 14:
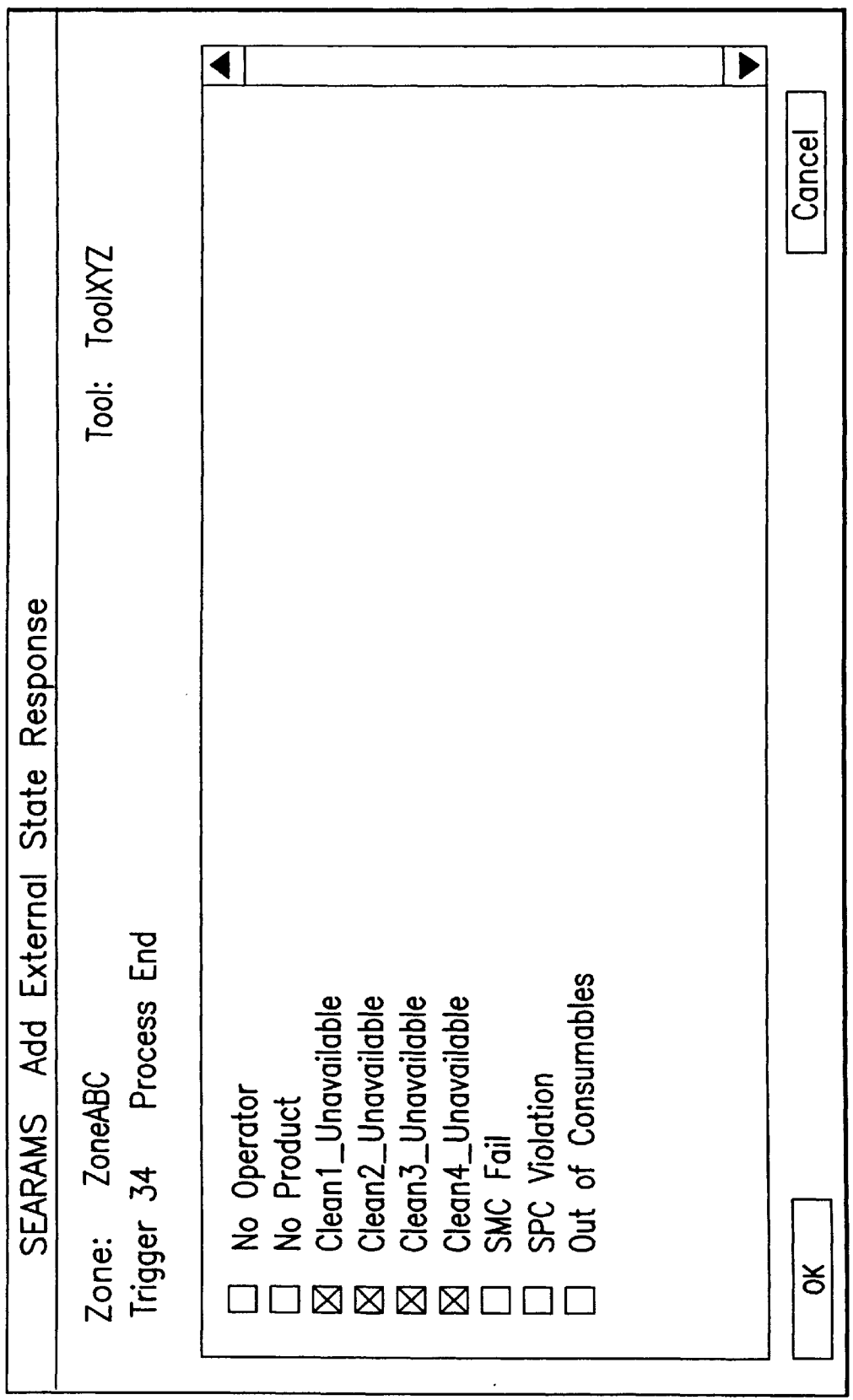
FIG. 14 is an example of one embodiment of a screen display (or pop-up window) as may be presented to a user via a user interface for associating an external state response with a trigger for a particular tool.

A pop-up menu 1350 may be provided via the user interface to allow an external state to be activated or de-activated by the particular trigger, or to prevent the trigger from activating or de-activating the external state ("No Action"), to delete an external state, add a new external state, or change the priority up or down of the external state relative to the other external states. When adding new external states, a pop-up dialog box (as depicted in FIG. 14) showing the available external states may be displayed to the user, from which the desired external state(s) may be selected. If multiple external states are selected at once, then they will be grouped together (like external states 1210 illustrated in FIG. 12) such that all need to be satisfied in order to the overall transition condition to be met.

The user interface of the automated monitoring and assessment system 407 also preferably provides a mechanism for defining system variable ID (SVID), alarm event ID (ALID) and collection event ID (CEID) mappings to various triggers. FIGS. 15A–15F and FIGS. 16A and 16B collectively illustrate screen displays that may be presented to the user in order to perform such mappings.

Figure 15B:
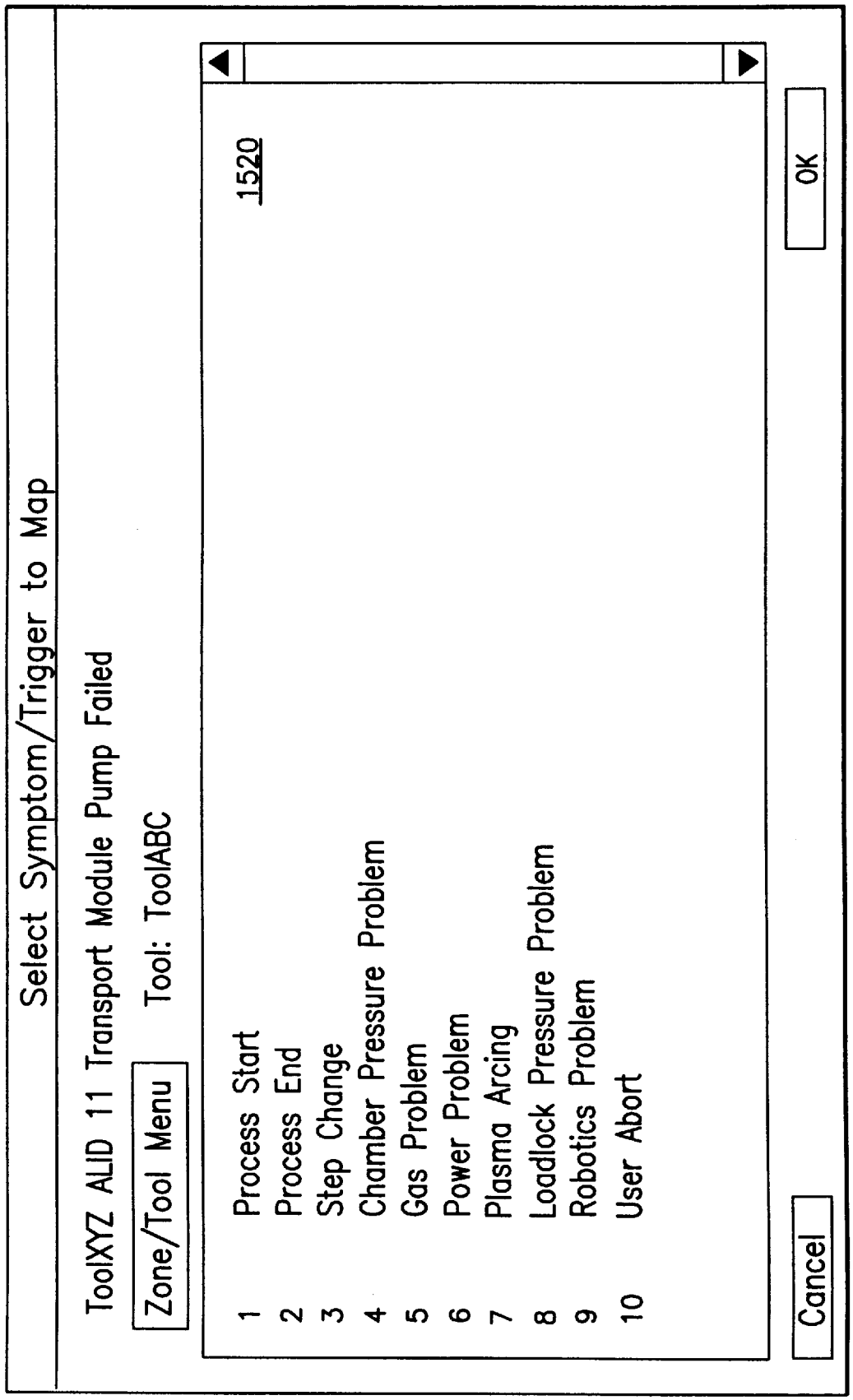
Figure 15C:
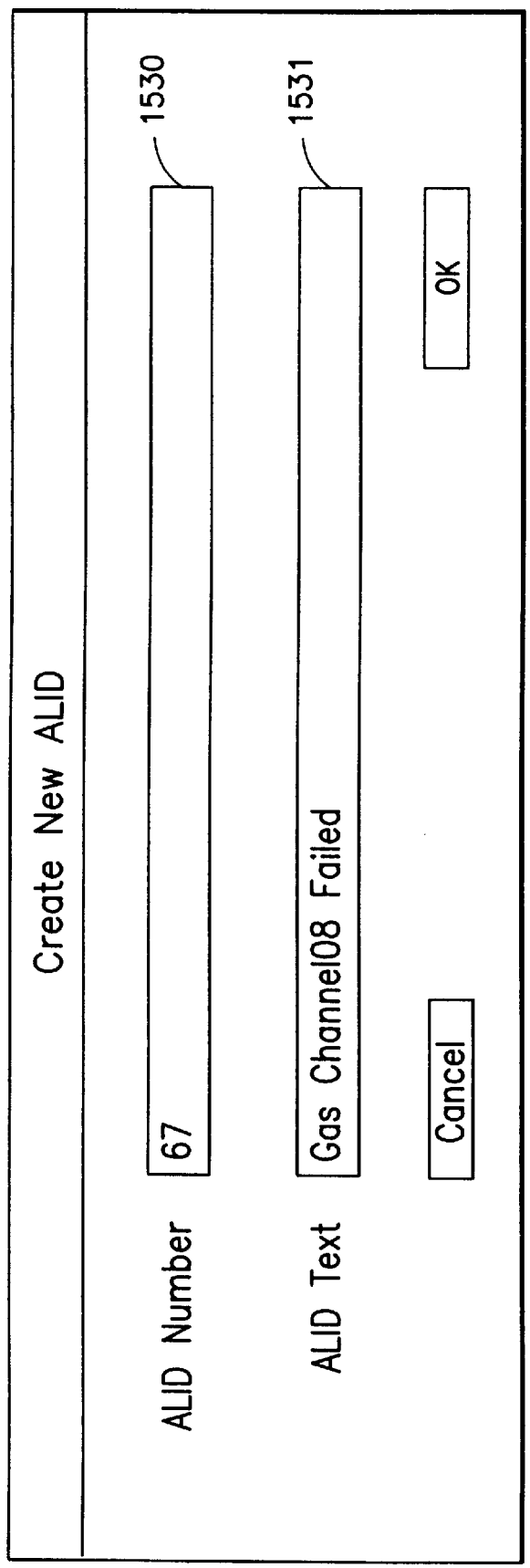
Figure 16B:
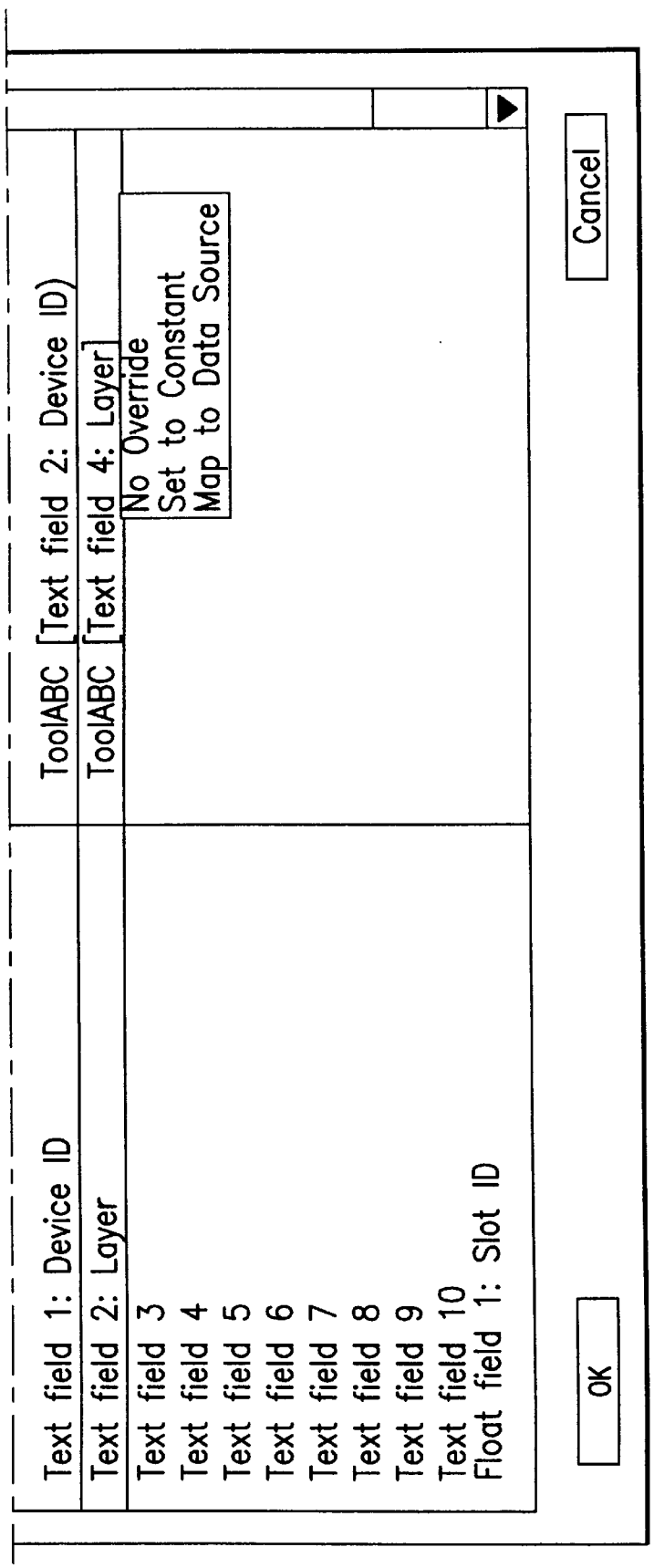

As shown now in FIG. 15A, a SECS Message to Trigger Mapping screen display 1501 identifies the particular tool 1504 being edited and its associated zone 1503, and includes a SECS Alarm Mapping tab 1507, a SECS Event Mapping tab 1508, and an SVID Mapping tab 1509. In FIG. 15A, the SECS Alarm Mapping tab 1507 is selected, revealing an alarm mapping sub-screen 1510 listing alarm IDs, their corresponding alarm text, and symptom mapping. Through a pop-up menu 1512, the user may add, edit or delete alarms. Preferably, both an alarm ID and its text are defined before being added. A pop-up window such as shown in FIG. 15C may be used to add or edit alarms. The user may also change the selected tool (and hence the zone), but the default tool is the current tool 415 being configured via the interface using the configuration editor. The Un-Map ALID selection of the pop-up menu 1512 changes the selected alarm's mapped symptom to "None". The Map to Symptom selection opens a symptom selection sub-screen or pop-up window, such as shown in FIG. 15B, from which various alarms may be selected. The Auto Map ALID selection maps the ALID to a symptom having identical text. If a symptom with identical text does not exist, then a new symptom is automatically generated. The Data Mapping selection is available if an ALID is mapped to a trigger; selecting it opens a trigger mapping data utility sub-screen or pop-up window, such as shown in FIGS. 16A and 16B and described hereinafter.

A SECS message from one tool 415 may generate a trigger on another tool 415, using the definitions set out in the alarm mapping sub-screen 1507. For example, a main tool (of a cluster tool) may generate a different start event trigger for of each its chambers. The automated monitoring and assessment system will thus turn the event (i.e., SECS message) received from the main tool into a trigger for each chamber.

The SECS Event Mapping tab 1508 reveals a sub-screen analogous to alarm mapping sub-screen 1510, but for collection events rather than alarm events.

Figure 15D:
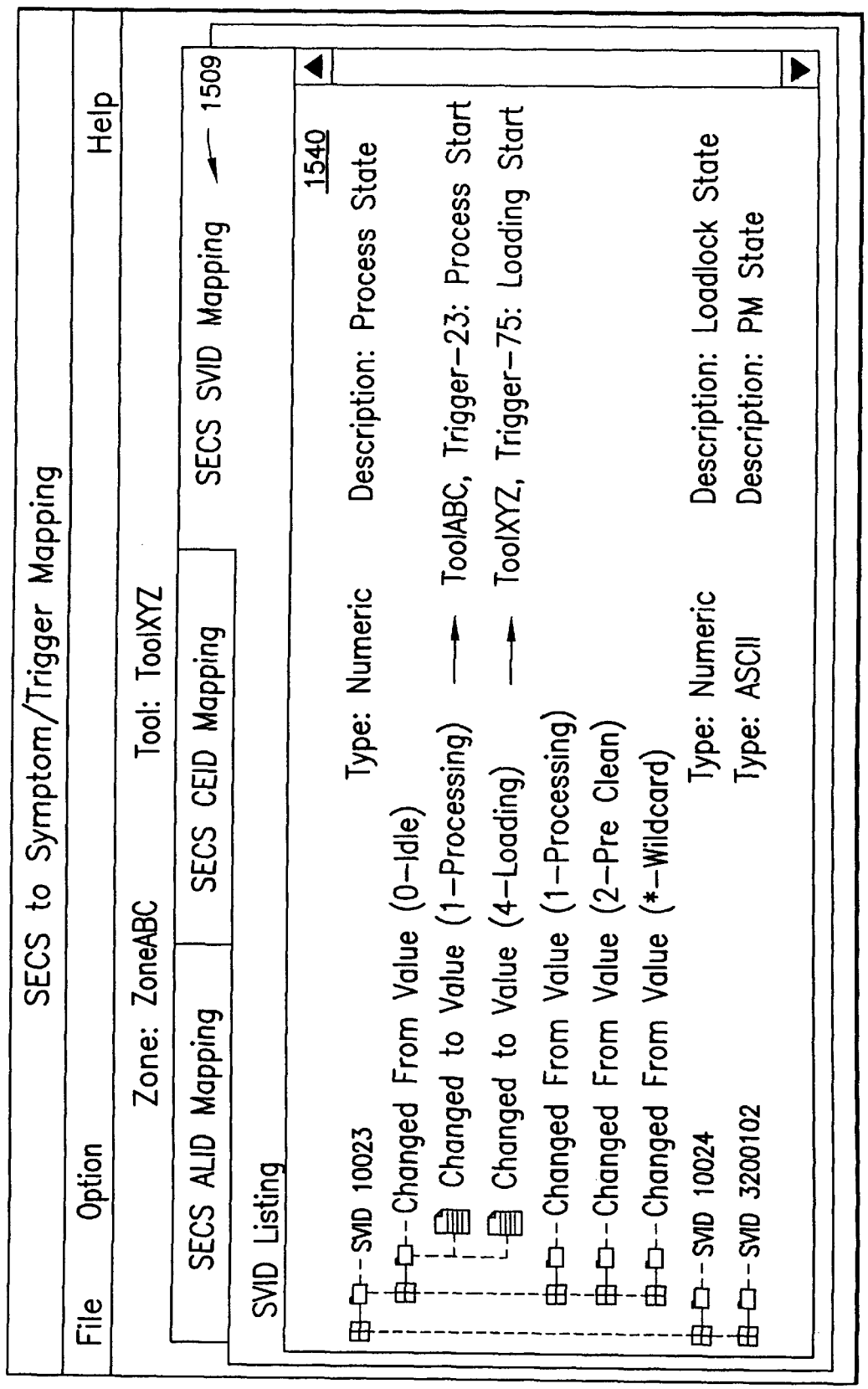

The SVID Mapping tab 1509 reveals an SVID Mapping sub-screen 1540 as illustrated in FIG. 15D. The SVID mapping is slightly different than the ALID and CEID mapping. The automated monitoring and assessment system 407 can be configured to generate a trigger when an SVID changes from one value to another. This functionality may be particularly useful when an SVID is used to monitor an equipment process state. For example, a process state SVID may be defined that is used to denote when the tool 415 is processing, idle, cleaning, loading, etc.

The user may select any number of items in the list of SVIDs on the SVID Mapping table 1509. A right click on any selected item will reveal a pop-up menu generally similar to pop-up menu 1512 shown in FIG. 15A. Selections that may be presented by the SVID pop-up menu include: Add Changed From Value (which opens a selection list such as shown in FIG. 15F of all remaining defined VID values that are not already listed under the currently selected SVID as "Changed From" values), Un-map SVID (which changes all the SVID's transitions mapped symptom to "None"), Edit SVID (which opens the SVID Editor dialog box shown in FIG. 15E), New SVID (which also opens the SVID Editor dialog box shown in FIG. 15E), and Delete SVID (which deletes the selected SVID and all its transitions from the list).

Selecting an SVID "Changed From Value" item from the sub-screen 1540 (by, e.g., right-clicking with a computer mouse) may also result in a pop-up menu, with the following options: Add Changed To Value (which opens a selection list such as shown in FIG. 15F of all remaining defined VID values that are not already listed under the currently selected "Changed From Value"), Remove All Changed To Values (which removes all "Changed To" items from the selected "Changed From Value"), and Un-map All Changed To Values (which un-maps all "Changed To" triggers for the currently selected Changed From value).

Selecting an SVID "Changed To Value" item from the sub-screen 1540 (by, e.g., right-clicking with a computer mouse) may likewise result in a pop-up menu, with the following options: Map-To-Symptom (which opens the symptom selection dialog shown in FIG. 15B, and maps the item to the selected trigger/symptom), Data Mapping (which is only available if the SVID "Changed To Value" is mapped to a trigger, and opens a dialog box such as shown in FIG. 15G), Remove "Changed To Value" (which removes the line from the list), and Un-map Symptom (available if the currently selected "Changed To Value" item is mapped, in which case this selection un-maps the selected item).

The possible values of an SVID should be defined prior to using the SVID transition editor (i.e., the SVID mapping sub-screen 1509). The user preferably lists all the valid SVID values that may be used to initiate a trigger. The SVID transition editor allows the user to define the SVID number, SVID name, SVID type (e.g., ASCII or Float) and up to a predefined number (e.g., 50) valid values for the SVID. A description field for each value is optional.

Figure 15E:
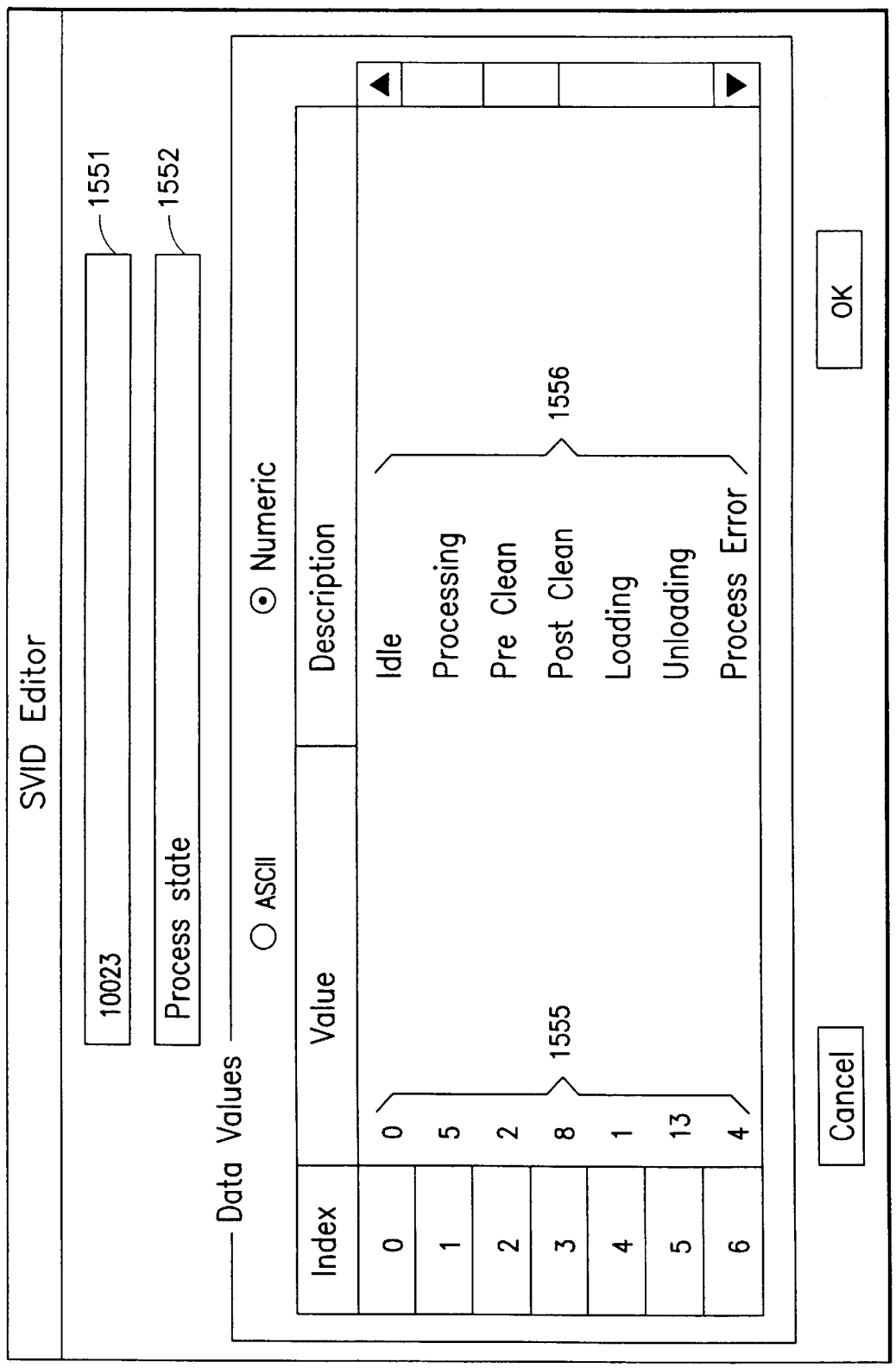
Figure 15F:
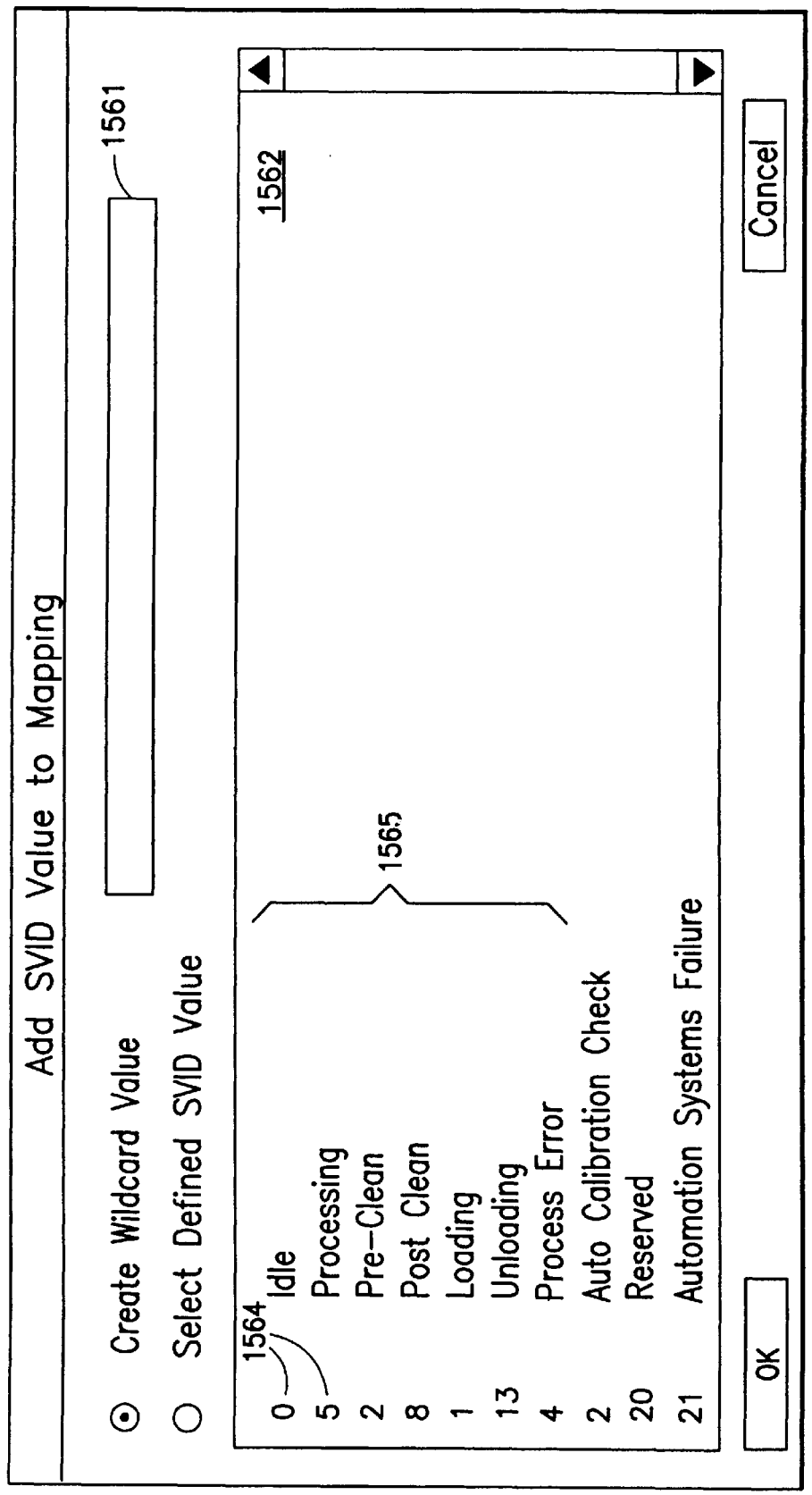

The valid new and old values (i.e., Changed From and Changed To values) may be presented in lists of data values 1555 as illustrated in FIG. 15E. On the SVID mapping sub-screen 1540, the user may select a wildcard (e.g., "*") for either a Changed From Value or Changed To Value. The wild card will be interpreted as any value, which may be useful if the user is only interested in whether if the SVID changed to or from a particular value. For example, if the SVID changes to a "0" the user in the current example (see FIG. 15E) then the system would know that the tool 415 just went to Idle, and it may be irrelevant what the previous value of the SVID was. Wildcards can also be useful if the SVID includes "continuous" data instead of only discrete values. For example, the user may want to generate a trigger when the SVID value is "603.23", in which case a wildcard in the old value field and 603.23 in the new value field would be used.

The user may select the set up the same VID value for both the Changed From (old) and Changed To (new) fields if desired, which may be useful if a tool, for example, sends the same value periodically when a certain event occurs.

The user may also select wildcards for both the new and the old values, which is valid and could be mapped to a trigger. It would then initiate the trigger anytime the SVID changed. Also, if the user sets up a wildcard it might conflict with other SVID transitions. Thus, any fixed SVID transition preferably will override the wild card transition. For example, if the user has set up two triggers as shown below, and the SVID changes from 3 to 4, trigger 76 will be generated, not trigger 102:

| SVID | Old Value | New Value | Trigger mapping |
|------|-----------|-----------|-----------------|
| 100  | *         | 4         | 102             |
| 100  | 3         | 4         | 76              |

The trigger data mapping sub-screen or pop-up dialog window shown in FIGS. 16a and 16b may be used for a variety of purposes. When a message is received by the automated monitoring and assessment system, some of the interesting data variables may not be available in the message object. A typical example of this situation is with multi-chamber tools. The object received from an equipment driver may contain the recipe ID, device id and layer when the lot is placed. In subsequent messages for wafer start event on multiple chambers, the lot information may no longer be available. The equipment driver may be able to provide the port used for the lot within each wafer start event for each process chamber. In such a situation, the automated monitoring and assessment software may look up the lot information from within its database to set the lot id, device id and layer for the incoming messages based on the information that was received when the lot was placed on a specific port.

Trigger data mapping allows users to specify certain fields in the trigger to be sent at runtime based on existing database fields from any tool 415, using the screen illustrated in FIGS. 16a and 16b. If the Override Data Source field is blank for the particular trigger field name, then the automated monitoring and assessment system will use the data contained in the incoming object; otherwise, it will overwrite the field with the mapped data. Each field may be overwritten with a constant or any field from the database from any tool 415. A pop-up menu may be provided when an item in FIGS. 16a and 16b are selected to remove any override criteria, allow the user to input a constant for the item, or to map the item to a data source (by allowing the user to select any defined tool and a database field of the same type as the object field).

Figure 19C:
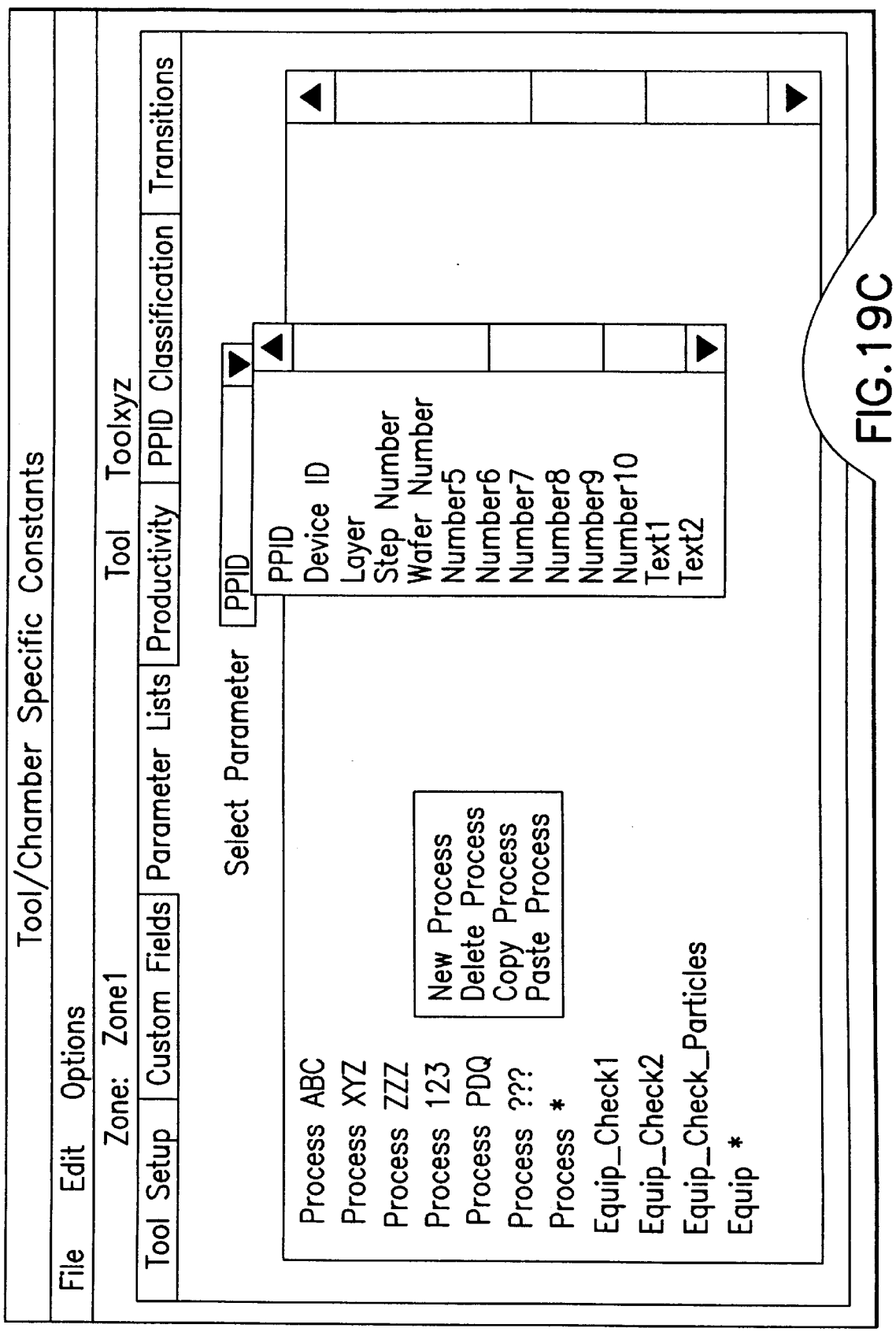

FIGS. 19A–19F are examples of screen displays as may be presented to a user in order to define tool or chamber specific constants, including recipe name definitions (PPIDs) and recipe name classifications. The various sub-screens shown in FIGS. 19A–19F may be accessed by selecting the appropriate tab. Through the File menu, the user may access the parameters for the specific tool of interest. A Tool Setup sub-screen as shown in FIG. 19A allows the user to select units for the cycle counter (which may be displayed real-time on a live status screen to indicate the number of cycles the tool has processed since installation), as well as to select that batch label, unit label and default state for the tool. A Custom Fields sub-screen as shown in FIG. 19B provides a number of additional fields (e.g., 20 additional fields) per record that are configurable by the user. These fields may be used to store additional database partitioning information. For example, various tools in the system may send SECS or other messages containing information pertaining to the user-defined fields—e.g., "Device ID," or "Layer"—which would then be stored in the tracking database 430 along with the rest of the message information, in the appropriate field (e.g., the "Device ID" of the message would be stored in Text Field 01). Later, the user can search through the stored information or otherwise access it using criteria keyed to the user-defined fields, e.g., "Device ID=Pentium III."

A Parameter Lists sub-screen as shown in FIG. 19C may be provided to allow users to specify productivity-related parameters, such as those shown in FIG. 10D. Each production tool state may have its own default productivity data. If a PPID is passed with a trigger during run-time, any defined productivity data will override the default productivity data for the particular state.

A Productivity sub-screen as shown in FIG. 19D may be provided to allow the user a mechanism for generating the theoretical production time per wafer based on the desired combination of inputs such as device ID, wafer ID, PPID and layer. The productivity constants THT, ETHT, VTHT and RTHT (defined by the E79 Standard) may be handled as a hierarchical set of defaults. In general, each tool or chamber has one set of productivity constants. The user may configure the productivity constants for a state that would override the tool's default productivity constants using the state model editor. If a specific recipe or device requires a different set of productivity constants, the recipe- or device-specific productivity constants preferably override the state-specific constants. The Productivity set-up sub-screen allows the user to configure the productivity constants for the tool, and at parameter specific levels.

The user may input the tool/chamber default productivity constants and select Hours, Seconds or Minutes as the time scale. The user may also input parameter-specific productivity constants in the "spreadsheet" portion of the screen display illustrated in FIG. 19D. Up to a predefined limit (e.g., four) parameters may be selected by the user from the available independent parameters (in this example, the PPID, ten user-defined numbers and ten user-defined labels, for twenty-one total). Four "combo boxes" display the names of the parameters as set up in the Custom Fields sub-screen, shown in FIG. 19B.

Once a column name has been chosen by the user, each cell in the column becomes a selection of names as defined in the Parameter Lists sub-screen (see FIG. 19C). The columns may be resizable, and each cell may allow only one entry from the selection list. The selection choice termed "default" is used if the value for that field is not to be used in the run-time selection of the productivity constants. In the example shown in FIG. 19D, any time Process XYZ is run, the productivity constants will be (0.25, 0.2, 0.08 and 0.23) independent of the wafer id. Process ABC, on the other hand, does require different productivity constants for "wafer 1" than it does for the rest of the wafers. Preferably, each column may be sorted, in either forward or reverse order, when the user so selects.

Figure 19E:
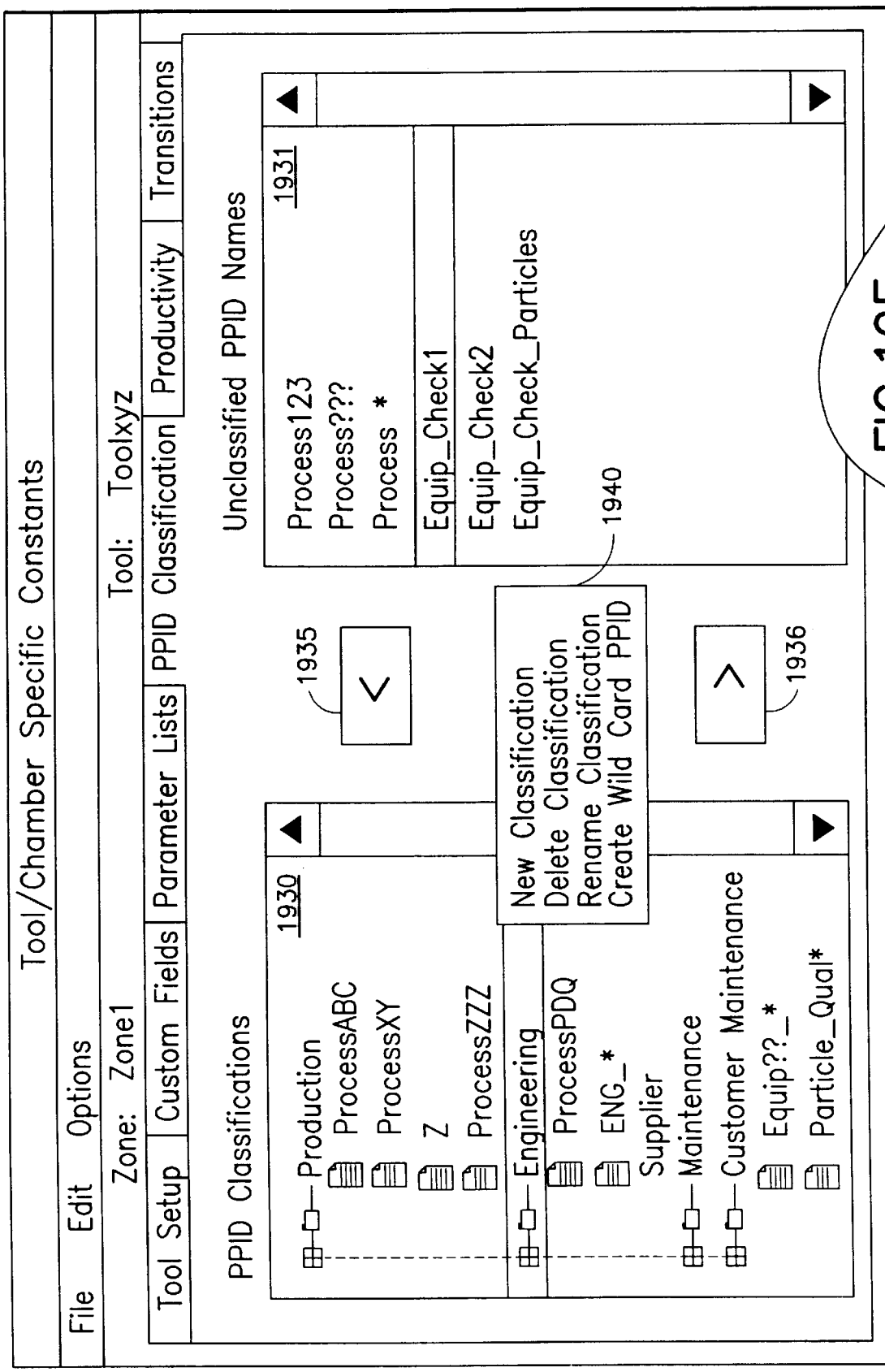

A PPID Classification sub-screen as shown in FIG. 19E may be provided to allow the user a mechanism for classifying recipes into categories. For example, some recipes, such as may be used for engineering tests, maintenance activity or equipment qualifications, may be designed for non-productive runs. The user interface shown in FIG. 19E includes two scroll lists 1930, 1931 and two buttons 1935, 1936. The left scroll list 1930 shows how recipes (PPIDs) are classified into PPID Classification categories. The right scroll list 1931 displays all recipes (PPIDs) that were defined under the Parameter Lists tab (see FIG. 19C) and are not explicitly classified in the PPID Classifications list. The two buttons 1935 and 1936 may be clicked or otherwise selected by the user to move a highlighted recipe from one list 1930, 1931 to the other.

A PPID Classification pop-up menu 1940 may be provided for adding a new PPID Classification (which would appear on the left scroll list 1930), deleting a PPID Classification (i.e., removing the PPID Classification from the left side scroll list back to the right side scroll list 1931, in which case all state transitions in the state model dependant on this PPID classification are removed), to rename a PPID Classification, and to Create a Wild Card PPID; or present the user with a simple dialog to input text that will be used to map PPIDs to this currently selected classification. A PPID pop-up menu may be provided to the user when a PPID within the scroll list 1930 is selected, for removing a PPID from classification (and adding it back to the right side of the list). However, a wild card PPID is not moved back to the right side of the scroll list.

An example of wild card characters that may be used are as follows:

"*" May contain no characters or any number of characters.

"?" Must contain one character, may be any single character.

An example process name of "?roc?ss*" would match processABC, PROCESSXYZ and PrOcEsS. It would not match PPROCESS since there are two characters before the "roc" text. A match for PPROCESS could be defined as "??rocess" or "*rocess" or "?*rocess" etc.

A Transitions Configuration sub-screen as shown in FIG. 19F may be provided to allow the user a mechanism for defining classification criteria for transitions. Each tool 415 preferably has its own classification criteria. Certain classifications (such as those defined by the E58 Standard) may be pre-defined in the software. A user may define new classifications or modify the default classifications. These classifications are used each time a state change occurs, and are written to the tracking database 430 to categorize each specific state transition. The criteria are previous state, new state and symptom source.

Up to a predefined number of transitions (e.g., 30 transitions) may be defined by the user. Preferably, the first transition is reserved as a "catch-all" when no other transition classification matches the specific state change, and the last transition is reserved for when a state change from Standby to Productive has occurred and acts as a flag for start of a production run (symptom source is "Don't Care"). The Transition Name is a text field that may be entered by the user. For the Previous State and Next State fields, users may enter numbers, '*' wildcards, '!' (inverse), spaces and commas. They may input multiple 4 character fields of numbers and '*' wildcards separated by commas. The Symptom (Trigger) Source field defines whether the symptom source is part of the classification criteria.

At runtime, the automated monitoring and assessment system searches the list of transition classifications each time a state change occurs. If it finds a match for the three criteria (Previous State, Next State and Symptom/Trigger Source) and then stores the transition number in the tracking database 430. Since the previous and next states contain wild card characters, the automated monitoring and assessment system may find more than one classification that meets the criteria. The list of transition classifications is therefore preferably sorted or organized by order or "conciseness", and the most concise classification that meets the specific transition will be recorded. In other words, when more than one classification can be applied to a transition, the classification with the fewest wild card settings will be logged in the tracking database 430.

FIGS. 20 and 21 are examples of screen displays as may be presented to a user in connection with forcing a manual transition or to modify data in the tracking database, respectively. The ability to manually transition to a new state follows the state models directed by the symptom and state definitions defined for the particular tool 415. The user may change the state either by selecting a symptom or directly selecting a valid state. Several application specific bits may be provided for controlling what actions the users have access to:

Application Bit A: The user may transition to any enabled state independent to the manual state transition definitions.

Application Bit B: By default, the users may always select symptoms. This bit allows the choice of symptoms or a list of states.

Application Bit C: Forces a comment when the user manually selects a new state.

Application Bit D: Enables or disables the interrupt classification information pane.

Application Bit E: Enables the user to lock the state and prohibit any automated transitions.

Application Bit F: Enables access to enter Scrap and Rework tab (using, e.g., the screen display shown in FIG. 21).

Application Bit G: Enables access to the External State Control tab (see FIG. 13C).

Through a screen display interface (not shown), the user may be provided with the ability either to force a state change or force a trigger. If the user selects a Symptom (i.e., trigger) List, the scroll list changes to the symptoms for the currently selected tool. A "go" button changes from "Log State Change" to "Log Symptom". If the user selects State List or All States, the scroll list changes from the list of symptoms to the list of states and the "go" button text changes to "Log State Change". When the user selects the State List choice, the user is presented with a list of valid states for the tool. The valid states are only the states that are listed in the manual transition attribute for the current state, given the particular user's access level, and that are currently enabled. If the user selects the All States choice, the user is presented with a list of all enabled states independent of the manual transition attribute and the user access level.

The state selection list may be a hierarchical listing with specialized user operations. The user may expand out sub-states and retract sub-states through a conventional "+" or "−" icon next to the current state (but only if the current state has sub-states). When the user selects the "go" button to log the change, the user may be prompted for a comment based on the symptom property for comments and Application Bit C for state changes.

An interrupt classification pane may be accessed, depending upon the setting of Application Bit D and the specific type of state transition. If the interrupt classification pane is displayed, the user may be prompted to classify the interrupt when transitioning from any state to Unscheduled Downtime (UDT), if Application Bit D is set. If the user selected a symptom, then the interrupt classifications will default to the bits defined by the symptom, but can still be overridden by the user. If the user selected the state directly without selecting the symptom, the default settings may be set to Failure and Chargeable, whether the user has access or not.

An optional field may be available for allowing the users to lock the new state. If the new state is locked, automatic triggers will not transition to a new state. The state will require manual intervention to become unlocked or transition to a new state.

When the user transitions from Unscheduled Downtime (UDT) to another state, the field "Interrupt Classification" may display the classification used when the tool originally transitioned to the UDT state. This may require a database search for the instance when the state transitioned to UDT, and a pull of the interrupt classification data. If the user wants to override the interrupt classifications and Application Bit D is set, then the user may set the interrupt classification selection buttons. The new values are stored in place of the value extracted from the tracking database 430. In certain embodiments, the only records in the tracking database 430 that may contain interrupt information are records that store a transition to an Unscheduled Downtime (UDT) state from a PRD, SBY, SDT or ENG state. If the user over rides the Interrupt classifications, it is preferably recorded in the Audit Trail.

Via the screen interface illustrated in FIG. 21, the user may modify data in the tracking database 430. The user may search according to various available criteria. The user may input scrap and rework data, overwriting the current data base entries. When the user saves the changes, the software may automatically verify that the sum of the rework and scrap counts is less than or equal to the actual count for each record in the tracking database 430.

Figure 22:
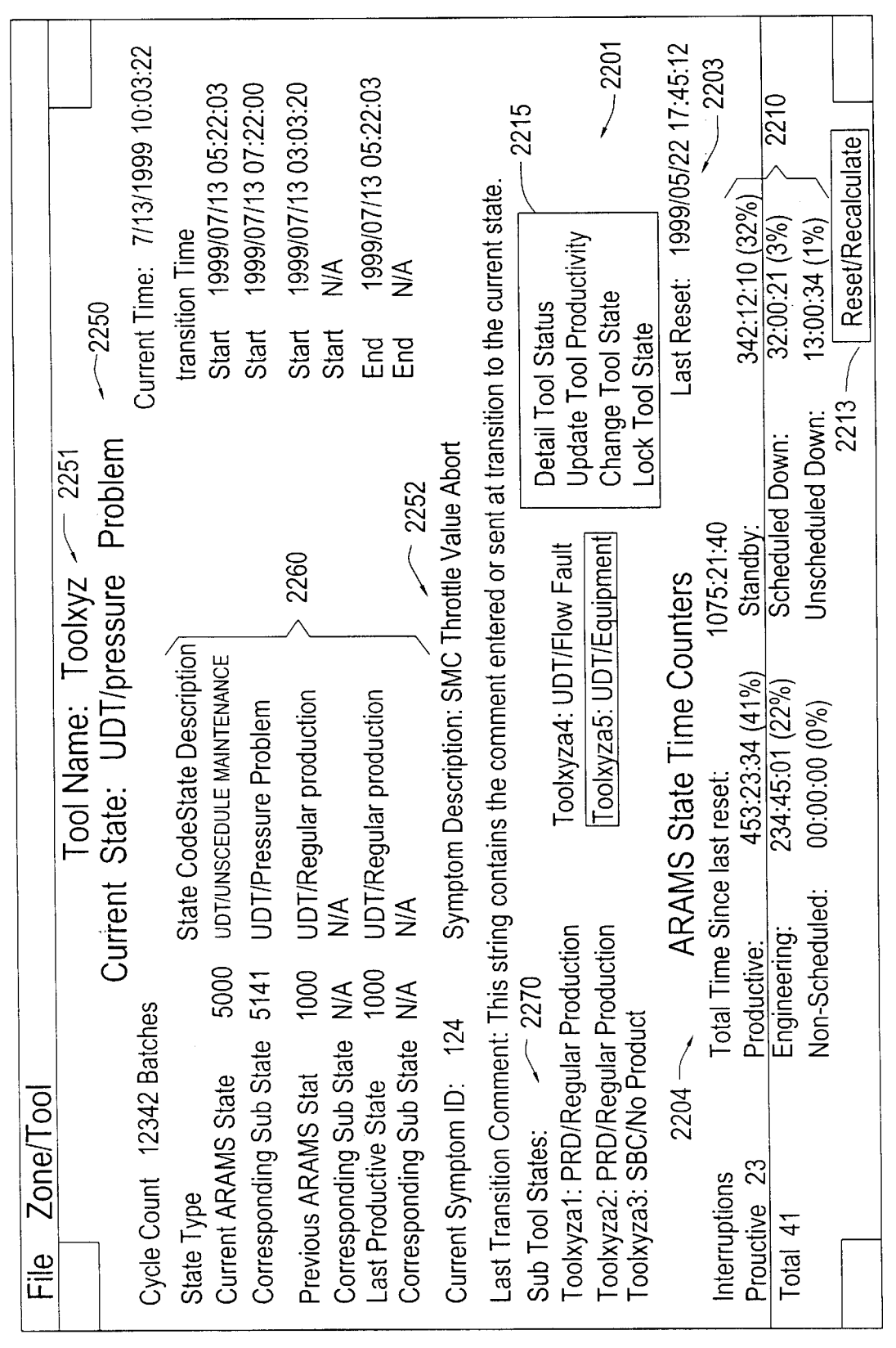

FIG. 22 is an example of a screen display as may be presented to a user during live monitoring of tools in the semiconductor fabrication system. The information appearing on the screen display 2201 of FIG. 22 may be maintained in tables apart from the records in the tracking database 430, which are updated periodically as triggers are received by the automated monitoring and assessment system. As shown in FIG. 22, the tool name 2251 and its current state 2250 may be displayed to the user, along with the last trigger 2252.

Also displayed may be state and sub-state information 2260, such as the current and previous states and sub-states, the last productive state and sub-state, along with their corresponding state IDs and descriptions. The transition time into each specific state and sub-state may also be displayed. If the tool 415 is a master tool, then the sub-tool states 2270 may also be displayed for viewing. By clicking on a sub-tool, the sub-tool's live status screen may be accessed. Various time counters 2210 may log the time spent in each state for the tool 415, and a reset button 2213 may be provided to re-start the monitoring period.

The File menu option of the live status screen preferably allows a user to select any defined tool for real-time viewing.

Figure 25:
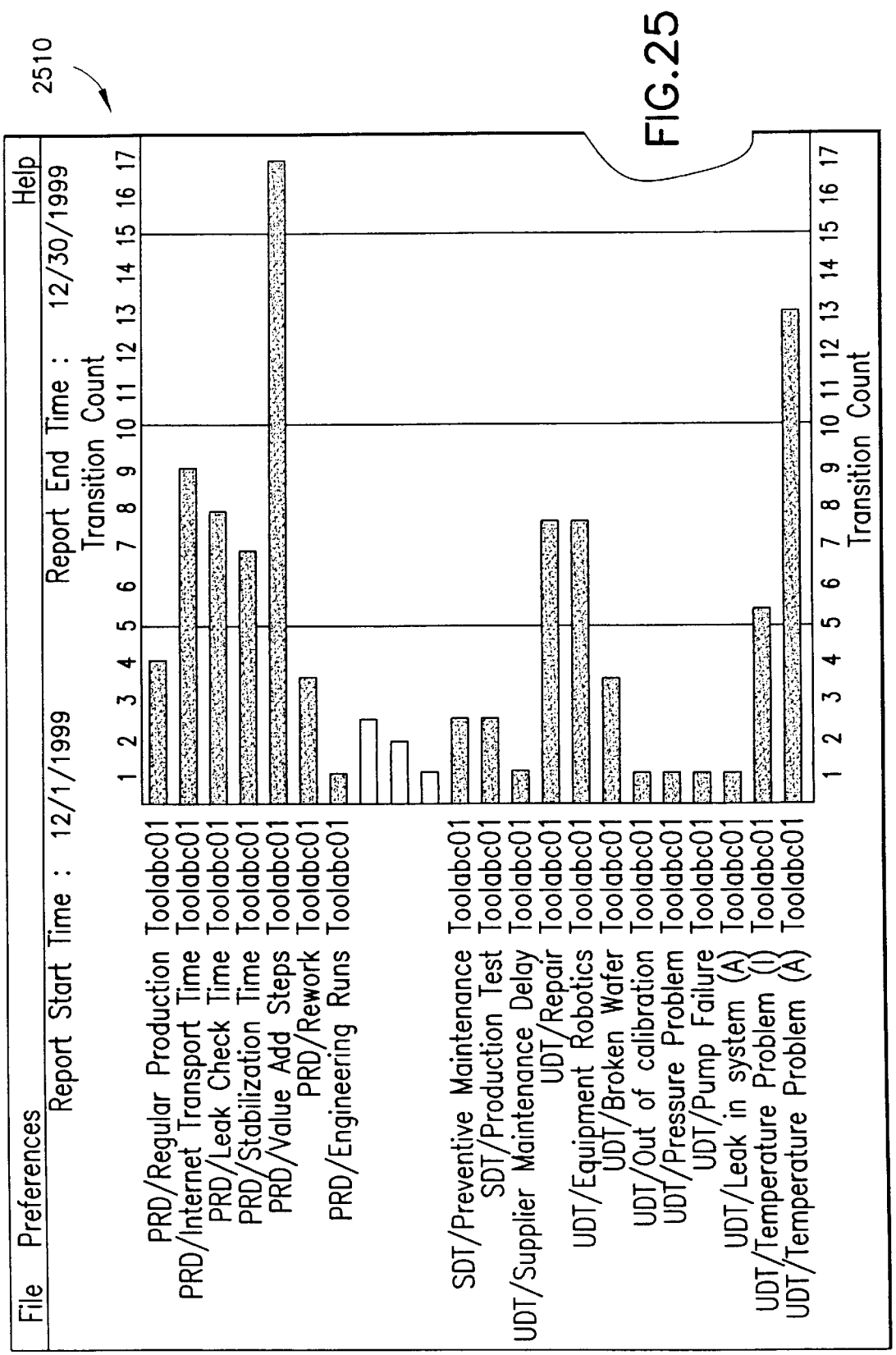
FIG. 25 is an example of one embodiment of a pareto chart displaying the amount of time equipment is in a particular state and sub-state.

Various historical reports may be generated for viewing by a user, based upon information stored in the tracking database 430 or otherwise. The reports may include all defined E10, E58 and E79 metrics. A report may be viewed on-screen via the user interface, may be sent to a printer, or may be e-mailed to a user. Preferably, the user interface allows the user to specify periodicity of report generation of pre-defined report types. The user may need to specify report parameters such as, for example, time range, tools of interest, metrics of interest, and partitions (i.e., what type of processes or chips/wafers being processed). A wide variety of plots and other graphical presentations of the state information and metrics are preferably provided. For example, FIG. 23 illustrates a report properties dialog window 2310 where criteria for generating a particular report is entered as well as other factors through the various tabs. The date range may be selected by defining explicit time stamps in section 2312 or selecting the report duration in the duration section 2314. A calculation interval is defined in section 2316. When the interval is selected, the calculation will be performed at the specified interval. FIG. 24 illustrates a pareto chart properties dialog window 2410, for example, but other types of charts are available such as time line plots, spread sheets, trend charts, stacked bar charts, histogram charts, CUBES plots and bar charts. The pareto properties dialog window 2410 allows the user to plot the number of transitions to a state, the amount of time accumulated in a state, the number of occurrences of each parameter or the amount of time accumulated in a destination state for each specific parameter. FIG. 25 is an illustration of a particular pareto plot 2510 that displays the number of times the equipment transitioned into a state.

It is thus apparent that a highly flexible, convenient, comprehensive and user-friendly system has been provided allowing monitoring and assessment of semiconductor fabrication facilities with a minimum of effort. In various embodiments as described herein, little or no changes are required to the existing tools or the manufacturing execution system of the semiconductor fabrication facility. The automated monitoring and assessment system may exist in a passive manner, monitoring the normal flow of message traffic among the tools and the various system control elements, and recording and acting upon information of relevance to the state transition models.

In one or more embodiments as described herein, an automated monitoring and assessment system performs state tracking and logic-based determination of transition states, on a tool-by-tool basis. External states are provided for events that do not necessarily impact the tool at the moment, but can be used to help determine the next transition state when an appropriate trigger occurs. The external states are not necessarily known to the particular tool, but are maintained by the automated monitoring and tracking software. A message from one tool may be used to set a trigger to change the external state or internal state of a second tool, or any number of other tools. External conditions may be aggregated to form a single super-condition requiring all its constituent parts (i.e., conditions) to be satisfied in order to be true. In addition to external conditions, recipe classifications may also be used to select new states based upon trigger events. Thus, state branching may be based upon the current state, trigger, and any external states or recipe classification.

Time values are preferably recorded in a tracking database at each state transition. The number of time values recorded depends upon how deep (i.e., how many levels) the user has specified in the particular category. If lower layers are undefined, 0's are recorded for the time spent therein.

The present invention may also include software and computer programs incorporating the process steps and instructions described above that are executed in different computers. In one embodiment as shown in FIG. 4, the computers are connected to the Internet. FIG. 8 is a block diagram of one embodiment of a system incorporating features of the present invention that may be used to practice the present invention. As shown, a monitoring and assessment system 107, for example, uses a computer that may be linked to the manufacturing execution system 102, for example, also using a computer such that the computers of these systems 102 and 107 are capable of sending information to each other and receiving information from each other. In one embodiment, the monitoring and assessment system 107 could include a server computer adapted to communicate with a network, such as for example, the Internet. The systems 102 and 107 can be linked together in any conventional manner including a modem, hard wire connection such as a dedicated bus, or fiber optic link. Generally, information can be made available to both systems 102 and 107 using a communication protocol typically sent over a communication bus 105 or one such as used by the Internet, or through a dial-up connection on an ISDN line. The computers in system 102 and system 107 are generally adapted to utilize program storage devices embodying machine readable program source code which is adapted to cause the computers therein to perform the method steps of the present invention. The program storage devices incorporating features of the present invention may be devised, made and used as a component of a machine utilizing optics, magnetic properties and/or electronics to perform the procedures and methods of the present invention. In alternate embodiments, the program storage devices may include magnetic media such as a diskette or computer hard drive, which is readable and executable by a computer. In other alternate embodiments, the program storage devices could include optical disks, read-only-memory ("ROM") floppy disks and semiconductor materials and chips.

The computers used in the systems 102 and 107 may also include a microprocessor for executing stored programs. The computer in system 107 may include a data storage device such as the database 430, FIG. 4, on its program storage device for the storage of information and data. The computer program or software incorporating the processes and method steps incorporating features of the present invention may be stored in one or more computers on an otherwise conventional program storage device. In one embodiment, the computers in the systems 107 and 102 may include a user interface 820, FIG. 8, and a display from which features of the present invention can be accessed. The user interface 820 and the display can be adapted to allow the input of queries and commands to the system 107 or the system 102, as well as present the results of the commands and queries.

While preferred embodiments of the invention have been described herein, many variations are possible which remain within the concept and scope of the invention. Such variations would become clear to one of ordinary skill in the art after inspection of the specification and the drawings. The invention therefore is not to be restricted except within the spirit and scope of any appended claims.

What is claimed is:

1. A method for assessing and improving production performance of equipment in a semiconductor fabrication facility, the method comprising the steps of:
   connecting a data collection system to a system bus, the system bus connected directly or indirectly to a manufacturing execution system and a plurality of semiconductor fabrication tools;
   configuring, via a user interface, productivity state models for the semiconductor fabrication tools, the state models based upon a customizable set of user defined triggers for each tool and representing a performance state for each of the semiconductor fabrication tools;
   collecting data from messages transmitted on the system bus between the semiconductor fabrication tools and the manufacturing execution system data collection system;
   generating triggers based upon the messages, the triggers mapped from the set of defined triggers and causing a transition from one state model to a next defined state model;
   updating the state model of each tool affected by one of the triggers; and
   recording state transitions within the state models in a tracking database.

2. A method in accordance with claim 1, wherein the semiconductor fabrication tools comprise processing tools and metrology tools.

3. A method in accordance with claim 1, wherein the step of configuring state models for the semiconductor fabrication tools comprises the step of defining, for each state of each tool, a trigger event that will cause a transition to a new state.

4. A method in accordance with claim 3, wherein the step of configuring state models for the semiconductor fabrication tools further comprises the step of defining, for at least one state of one tool, a state transition based upon one or more external states and one or more trigger events.

5. A method in accordance with claim 3, wherein the step of configuring state models for the semiconductor fabrication tools further comprises the step of defining, for at least one state of one tool, a state transition based upon one or more recipe classifications and one or more trigger events.

6. A method in accordance with claim 1 wherein the step of connecting further comprises providing a standard communications bus for transmitting messages in a standard message protocol thereover.

7. A method in accordance with claim 6 wherein the standard communications bus is a Common Object Request Broker Architecture (CORBA) bus.

8. A method in accordance with claim 6 wherein the standard message protocol is a Semiconductor Equipment Communication Standard (SECS).

9. A method in accordance with claim 1 wherein the monitoring and assessment system provides metrics related to reliability, availability and maintainability of the fabrication tools.

10. A method in accordance with claim 9 wherein the metrics include an overall equipment effectiveness and an overall fabrication effectiveness of the semiconductor fabrication facility.

11. A method in accordance with claim 1 wherein the monitoring of the messages received by the monitoring and assessment system includes a transition initiation type code therein for processing various events and triggers related to the fabrication tools.

12. A method in accordance with claim 1 further including a step of connecting the monitoring and assessment system to a distributed electronic network.

13. A system for improving production performance of equipment in a semiconductor fabrication facility the system comprising:
   a data collection system for receiving messages and collecting data having equipment information therein for tracking operation states of a plurality of semiconductor fabrication tools;
   a manufacturing execution system for controlling the manufacture of semiconductor wafers or other products according to a programmed recipe, by sending commands to the semiconductor fabrication tools, monitoring their activity and sending the messages to the data collection system;
   a system bus connected directly or indirectly to the manufacturing execution system and the data collection system;
   a user interface for monitoring messages transmitted on the system bus between the semiconductor fabrication tools and the manufacturing execution system and the data collection system, a user being able to configure productivity state models for the semiconductor fabrication tools, the state models based upon a customizable set of user defined triggers for each tool and representing a performance state for each of the semiconductor fabrication tools; and
   a tracking database for recording state transitions within the state models.

14. A system in accordance with claim 13, wherein the semiconductor fabrication tools comprise processing tools and metrology tools.

15. A system in accordance with claim 13 further including a computer server for connecting the monitoring and assessment system to a distributed electronic network.

16. A system in accordance with claim 13 further including a bus controller.

17. A system in accordance with claim 13 further including a bus controller for controlling the flow of information on the system bus to the semiconductor fabrication tools, the manufacturing execution system and the monitoring and assessment system.

18. A system in accordance with claim 13 further including a software bridge between the system bus and the monitoring and assessment system for converting messages to a CORBA format.

19. A system in accordance with claim 13 which further comprises at least two buses, one being a CORBA bus connected to the monitoring and assessment system.

20. A system in accordance with claim 19 wherein one bus is a CORBA bus and the other bus is a DCOM bus.

21. A system for assessing operation and improving production performance of equipment of a semiconductor fabrication facility, the system comprising:
   a trigger/event interface processor for receiving messages having fabrication tool information therein for tracking operation states of a plurality of semiconductor fabrication tools;
   a state model logic processor receiving the tracking operation information for each fabrication tool, each fabrication tool having defined productivity states and a state transition logic defining triggering events and at least one state transition related to the trigger event, the trigger event causing a transition from one state to a next state;
   a state change transition logger for receiving state transition information from the state model logic and processing the transition information;
   a tracking database for recording transition information from the state change transition logger;
   a report generator having metric calculation logic therein for generating performance metrics for the fabrication tools, the report generator outputting information for assessing overall equipment effectiveness and overall fabrication effectiveness of the fabrication tools; and
   a user interface for monitoring and configuring productivity state models for the semiconductor fabrication tools in the state model logic, configuring trigger/event information in the trigger/event interface, for monitoring state transitions in the tracking database, and for improving equipment effectiveness and overall fabrication effectiveness of the fabrication tools.

22. A system in accordance with claim 21, wherein the semiconductor fabrication tools comprise processing tools and metrology tools.

23. A system in accordance with claim 21 further including a computer server for connecting the monitoring and assessment system to a distributed electronic network.

24. A computer program product comprising:
   a computer usable medium having computer readable code means embodied therein for causing a computer to assess operations and improve production performance of equipment in a semiconductor fabrication facility, the computer readable code means in the computer program product comprising:
      computer readable program code means for causing a computer to read and store at least one set of productivity state models defined by a user that includes at least one set of customizable user defined triggers for each tool;
      computer readable program code means for causing a computer to receive messages and collect data related to the operation of the semiconductor fabrication facility;
      computer readable program code means for causing a computer to configure and transmit the messages to a state model logic for indicating transition states and initiate a transition from one state model to another state model responsive to trigger events in order to improve productivity of the equipment;
      computer readable program code means for causing a computer to track changes in transition states from one state model to the next state model in a state change transition logger;
      computer readable program code means for causing a computer to transmit from the state change transition logger and to store the transition state changes; and
      computer readable program code means for causing a computer to generate equipment information based on data and transmit the equipment information to a user in a specified format.

25. A computer program product as defined in claim 24 wherein the devices further comprises semiconductor fabrication tools, a manufacturing execution system (MES) and a monitoring and assessment system.

26. A computer program product as defined in claim 25 wherein the messages comprise sensor, SECS, MES, or user interface messages.

27. The method of claim 1 further comprising:
logging triggers that do not result in a state change in an audit trail.

28. The method of claim 1 wherein the state model is updated to optimize performance of the tool by transitioning to a new state model responsive to the trigger.

29. The method of claim 1 further comprising, prior to the step of updating the state model, determining if any external states are keyed to the trigger and delaying a transition between state models until the external state is modified.

30. The method of claim 1 further comprising the user adding or deleting relationships between triggers and state transitions during configuring of the productivity state models in order to increase the productivity of the tool.

31. The method of claim 1 wherein the user defined triggers allowing only those, triggering messages related to the user defined triggers to be recorded as state transition in the tracking database.

32. The method of claim 1 wherein the data collection system defines a hierarchy of potential states in a state table for each tool, the hierarchy including top-level states and intermediate state associated with the top-level states, wherein the method further comprises the user defining sub-states associated with the intermediate state and the productivity state models being configured for the sub-states.

33. The method of claim 1 further comprising associating at least one time entry field for each record in the database associated with a tool, wherein the time entry value for a new record is calculated by determining if a state transition occurred in a previous record, and if not, adding a time between a time stamp of the previous record and a time stamp of the new record to the time stamp associated with the new record; or if there is a state transition in the previous record, the time entry is a time between the time stamp of the new record and the time stamp of the previous record.

34. The method of claim 1 wherein the collecting of data further comprises automatically and in real-time analyzing the collected data and making productivity improvements to each state of the process in real-time during the process.

\* \* \* \* \*